(12) United States Patent
Derderian et al.

(10) Patent No.: US 7,560,793 B2
(45) Date of Patent: Jul. 14, 2009

(54) ATOMIC LAYER DEPOSITION AND CONVERSION

(75) Inventors: Garo J. Derderian, Boise, ID (US); Gurtej Singh Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/929,272

(22) Filed: Aug. 30, 2004

(65) Prior Publication Data

US 2005/0023584 A1 Feb. 3, 2005

Related U.S. Application Data

(62) Division of application No. 10/137,058, filed on May 2, 2002.

(51) Int. Cl.
  *H01L 29/00* (2006.01)
(52) U.S. Cl. ............... 257/506; 257/508; 438/761
(58) Field of Classification Search .......... 257/296, 257/310, 510, 506, 508; 438/683, 685, 761, 438/765
See application file for complete search history.

(56) References Cited

U.S. PATENT DOCUMENTS

| | | | |
|---|---|---|---|
| 2,501,563 A | 3/1950 | Colbert et al. | |
| 3,357,961 A | 12/1967 | Makowski et al. | |
| 3,381,114 A | 4/1968 | Nakanuma | 219/385 |
| 3,407,479 A | 10/1968 | Fordemwalt et al. | |
| 3,457,123 A | 7/1969 | Van Pul | |
| 3,471,754 A | 10/1969 | Hoshi et al. | |
| 3,689,357 A | 9/1972 | Jordan | |
| 3,738,817 A | 6/1973 | Benjamin | |
| 3,833,386 A | 9/1974 | Wood et al. | |
| 3,903,232 A | 9/1975 | Wood et al. | |

(Continued)

FOREIGN PATENT DOCUMENTS

CN       1169029 A       12/1997

(Continued)

OTHER PUBLICATIONS

"Improved Metallurgy for Wiring Very Large Scale Integrated Circuits", *International Technology Disclosures*, 4, Abstract (1986),1 page.

(Continued)

*Primary Examiner*—Douglas M Menz
(74) *Attorney, Agent, or Firm*—Schwegman, Lundberg & Woessner, P.A.

(57) ABSTRACT

A method for growing films for use in integrated circuits using atomic layer deposition and a subsequent converting step is described. In an embodiment, the subsequent converting step includes oxidizing a metal atomic layer to form a metal oxide layer. The atomic layer deposition and oxidation step are then repeated to produce a metal oxide layer having sufficient thickness for use as a metal oxide layer in an integrated circuit. The subsequent converting step, in an embodiment, includes converting the atomic deposition layer by exposing it to one of nitrogen to form a nitride layer, carbon to form a carbide layer, boron to form a boride layer, and fluorine to form a fluoride layer. Systems and devices for performing the method, semiconductor devices so produced, and machine readable media containing the method are also described.

9 Claims, 8 Drawing Sheets

U.S. PATENT DOCUMENTS

| | | |
|---|---|---|
| 3,926,568 A | 12/1975 | Benjamin et al. |
| 3,959,191 A | 5/1976 | Kehr et al. |
| 4,017,322 A | 4/1977 | Kawai et al. |
| 4,051,354 A | 9/1977 | Choate |
| 4,058,430 A | 11/1977 | Suntola et al. ......... 427/255.13 |
| 4,137,200 A | 1/1979 | Wood et al. |
| 4,215,156 A | 7/1980 | Dalal et al. ................... 427/84 |
| 4,292,093 A | 9/1981 | Ownby et al. |
| 4,293,679 A | 10/1981 | Cogliano |
| 4,302,620 A | 11/1981 | Chu |
| 4,305,640 A | 12/1981 | Cullis et al. |
| 4,333,808 A | 6/1982 | Bhattacharyya et al. . 204/192 D |
| 4,358,397 A | 11/1982 | Chu |
| 4,394,673 A | 7/1983 | Thompson et al. |
| 4,399,424 A | 8/1983 | Rigby ......................... 338/34 |
| 4,403,083 A | 9/1983 | Marans et al. |
| 4,413,022 A | 11/1983 | Suntola et al. ............ 427/255.2 |
| 4,590,042 A | 5/1986 | Drage ................... 422/186.06 |
| 4,604,162 A | 8/1986 | Sobczak |
| 4,608,215 A | 8/1986 | Gonczy et al. |
| 4,645,622 A | 2/1987 | Kock |
| 4,647,947 A | 3/1987 | Takeoka et al. .......... 346/135.1 |
| 4,663,831 A | 5/1987 | Birrittella et al. |
| 4,673,962 A | 6/1987 | Chatterjee et al. |
| 4,725,877 A | 2/1988 | Brasen et al. |
| 4,725,887 A | 2/1988 | Field |
| 4,757,360 A | 7/1988 | Faraone et al. ............. 357/23.5 |
| 4,761,768 A | 8/1988 | Turner et al. |
| 4,766,569 A | 8/1988 | Turner et al. |
| 4,767,641 A | 8/1988 | Kieser et al. ................... 427/38 |
| 4,864,375 A | 9/1989 | Teng et al. |
| 4,894,801 A | 1/1990 | Saito et al. |
| 4,902,533 A | 2/1990 | White et al. |
| 4,920,071 A | 4/1990 | Thomas ...................... 437/188 |
| 4,920,396 A | 4/1990 | Shinohara et al. |
| 4,933,743 A | 6/1990 | Thomas et al. |
| 4,940,636 A | 7/1990 | Brock et al. |
| 4,947,221 A | 8/1990 | Stewart et al. ............. 357/23.5 |
| 4,948,937 A | 8/1990 | Blank et al. |
| 4,961,004 A | 10/1990 | Bryan et al. |
| 4,962,879 A | 10/1990 | Goesele et al. |
| 4,963,753 A | 10/1990 | Bryan et al. |
| 4,963,754 A | 10/1990 | Bryan et al. |
| 4,967,085 A | 10/1990 | Bryan et al. |
| 4,967,087 A | 10/1990 | Bryan et al. |
| 4,972,086 A | 11/1990 | Bryan et al. |
| 4,972,516 A | 11/1990 | Bryan et al. |
| 4,975,014 A | 12/1990 | Rufin et al. |
| 4,975,588 A | 12/1990 | Bryan et al. |
| 4,980,559 A | 12/1990 | Bryan et al. |
| 4,980,560 A | 12/1990 | Bryan et al. |
| 4,983,847 A | 1/1991 | Bryan et al. |
| 4,987,089 A | 1/1991 | Roberts |
| 4,988,880 A | 1/1991 | Bryan et al. |
| 4,990,282 A | 2/1991 | Bryan et al. |
| 4,992,205 A | 2/1991 | Bryan et al. |
| 4,993,358 A | 2/1991 | Mahawili .................... 118/715 |
| 4,994,205 A | 2/1991 | Bryan et al. |
| 4,996,003 A | 2/1991 | Bryan et al. |
| 5,001,526 A | 3/1991 | Gotou |
| 5,006,192 A | 4/1991 | Deguchi ...................... 156/345 |
| 5,008,034 A | 4/1991 | Bryan et al. |
| 5,017,504 A | 5/1991 | Nishimura et al. |
| 5,017,791 A | 5/1991 | Bryan et al. |
| 5,021,355 A | 6/1991 | Dhong et al. |
| 5,028,977 A | 7/1991 | Kenneth et al. |
| 5,032,545 A | 7/1991 | Doan et al. .................. 437/242 |
| 5,049,516 A | 9/1991 | Arima |
| 5,055,319 A | 10/1991 | Bunshah et al. |
| 5,075,536 A | 12/1991 | Towe et al. |
| 5,080,928 A | 1/1992 | Klinedinst et al. ............ 427/70 |
| 5,084,606 A | 1/1992 | Bailey et al. |
| 5,089,084 A | 2/1992 | Chhabra et al. ............. 438/706 |
| 5,095,218 A | 3/1992 | Bryan et al. |
| 5,097,291 A | 3/1992 | Suzuki |
| 5,102,817 A | 4/1992 | Chatterjee et al. |
| 5,110,752 A | 5/1992 | Lu |
| 5,119,329 A | 6/1992 | Evans, et al. |
| 5,122,848 A | 6/1992 | Lee et al. |
| 5,122,856 A | 6/1992 | Komiya |
| 5,135,879 A | 8/1992 | Richardson |
| 5,135,889 A | 8/1992 | Allen |
| 5,149,596 A | 9/1992 | Smith et al. |
| 5,156,987 A | 10/1992 | Sandhu et al. |
| 5,177,028 A | 1/1993 | Manning |
| 5,198,029 A | 3/1993 | Dutta et al. .................. 118/303 |
| 5,202,278 A | 4/1993 | Mathews et al. |
| 5,208,657 A | 5/1993 | Chatterjee et al. |
| 5,223,001 A | 6/1993 | Saeki |
| 5,223,081 A | 6/1993 | Doan |
| 5,234,535 A | 8/1993 | Beyer et al. |
| 5,266,514 A | 11/1993 | Tuan et al. |
| 5,274,249 A | 12/1993 | Xi et al. |
| 5,302,461 A | 4/1994 | Anthony ..................... 428/472 |
| 5,320,880 A | 6/1994 | Sandhu et al. |
| 5,324,980 A | 6/1994 | Kusunoki |
| 5,327,380 A | 7/1994 | Kersh, III et al. |
| 5,363,550 A | 11/1994 | Aitken et al. |
| 5,376,575 A | 12/1994 | Kim et al. |
| 5,391,911 A | 2/1995 | Beyer et al. |
| 5,392,245 A | 2/1995 | Manning |
| 5,393,704 A | 2/1995 | Huang et al. |
| 5,396,093 A | 3/1995 | Lu |
| 5,410,169 A | 4/1995 | Yamamoto et al. |
| 5,414,287 A | 5/1995 | Hong |
| 5,414,288 A | 5/1995 | Fitch et al. |
| 5,416,041 A | 5/1995 | Schwalke |
| 5,421,953 A | 6/1995 | Nagakubo et al. |
| 5,422,499 A | 6/1995 | Manning |
| 5,426,603 A | 6/1995 | Nakamura et al. |
| 5,429,966 A | 7/1995 | Wu et al. ....................... 437/43 |
| 5,434,878 A | 7/1995 | Lawandy |
| 5,438,009 A | 8/1995 | Yang et al. |
| 5,439,524 A | 8/1995 | Cain et al. |
| 5,440,158 A | 8/1995 | Sung-Mu |
| 5,441,591 A | 8/1995 | Imthurn et al. |
| 5,445,986 A | 8/1995 | Hirota |
| 5,455,445 A | 10/1995 | Kurtz et al. |
| 5,455,489 A | 10/1995 | Bhargava |
| 5,460,316 A | 10/1995 | Hefele |
| 5,460,988 A | 10/1995 | Hong |
| 5,466,625 A | 11/1995 | Hsieh et al. |
| 5,483,094 A | 1/1996 | Sharma et al. |
| 5,483,487 A | 1/1996 | Sung-Mu |
| 5,492,853 A | 2/1996 | Jeng et al. |
| 5,495,441 A | 2/1996 | Hong |
| 5,497,017 A | 3/1996 | Gonzales |
| 5,504,357 A | 4/1996 | Kim et al. |
| 5,504,376 A | 4/1996 | Sugahara et al. |
| 5,508,219 A | 4/1996 | Bronner et al. |
| 5,508,542 A | 4/1996 | Geiss et al. |
| 5,516,588 A | 5/1996 | van den Berg et al. |
| 5,522,932 A | 6/1996 | Wong et al. |
| 5,528,062 A | 6/1996 | Hsieh et al. |
| 5,562,952 A | 10/1996 | Nakahigashi et al. |
| 5,572,052 A | 11/1996 | Kashihara et al. |
| 5,585,020 A | 12/1996 | Becker et al. |
| 5,593,912 A | 1/1997 | Rajeevakumar |
| 5,595,606 A | 1/1997 | Fujikawa et al. ............ 118/725 |
| 5,614,026 A | 3/1997 | Williams |
| 5,616,934 A | 4/1997 | Dennison et al. |
| 5,619,159 A | 4/1997 | Sasaki et al. |
| 5,621,681 A | 4/1997 | Moon |
| 5,625,233 A | 4/1997 | Cabral, Jr. et al. ........... 257/771 |

| | | | | | |
|---|---|---|---|---|---|
| 5,640,342 A | 6/1997 | Gonzalez | 6,059,885 A | 5/2000 | Ohashi et al. ............... 118/730 |
| 5,644,540 A | 7/1997 | Manning | 6,060,743 A | 5/2000 | Sugiyama et al. |
| 5,646,583 A | 7/1997 | Seabury et al. | 6,060,755 A | 5/2000 | Ma et al. |
| 5,646,900 A | 7/1997 | Tsukude et al. | 6,063,705 A | 5/2000 | Vaartstra |
| 5,652,061 A | 7/1997 | Jeng et al. | 6,066,869 A | 5/2000 | Noble et al. |
| 5,656,548 A | 8/1997 | Zavracky et al. | 6,066,922 A | 5/2000 | Iwasaki et al. |
| 5,662,834 A | 9/1997 | Schulz et al. | 6,077,745 A | 6/2000 | Burns, Jr. et al. |
| 5,674,563 A | 10/1997 | Tarui et al. | RE36,760 E | 7/2000 | Bloomquist et al. |
| 5,674,574 A | 10/1997 | Atwell et al. ............... 427/561 | 6,083,793 A | 7/2000 | Wu |
| 5,691,230 A | 11/1997 | Forbes | 6,090,636 A | 7/2000 | Geusic et al. |
| 5,698,022 A | 12/1997 | Glassman et al. | 6,093,623 A | 7/2000 | Forbes |
| 5,710,057 A | 1/1998 | Kenney | 6,093,944 A | 7/2000 | VanDover |
| 5,714,336 A | 2/1998 | Simons et al. | 6,103,419 A | 8/2000 | Saidi et al. |
| 5,714,766 A | 2/1998 | Chen et al. | 6,110,529 A | 8/2000 | Gardiner et al. ............. 427/250 |
| 5,735,960 A | 4/1998 | Sandhu et al. ......... 118/723 IR | 6,111,285 A | 8/2000 | Al-Shareef et al. |
| 5,739,524 A | 4/1998 | Fally | 6,114,252 A | 9/2000 | Donohoe et al. ............. 438/710 |
| 5,744,374 A | 4/1998 | Moon | 6,115,401 A | 9/2000 | Scobey et al. |
| 5,745,334 A | 4/1998 | Hoffarth et al. | 6,120,531 A | 9/2000 | Zhou et al. .................. 607/111 |
| 5,751,021 A | 5/1998 | Teraguchi | 6,124,729 A | 9/2000 | Noble et al. |
| 5,756,404 A | 5/1998 | Friedenreich et al. ....... 438/791 | 6,125,062 A | 9/2000 | Ahn et al. |
| 5,765,214 A | 6/1998 | Sywyk | 6,127,287 A | 10/2000 | Hurley et al. ............... 438/791 |
| 5,770,022 A | 6/1998 | Chang et al. | 6,129,928 A | 10/2000 | Sarangapani et al. |
| 5,772,760 A | 6/1998 | Gruen et al. | 6,130,503 A | 10/2000 | Negishi et al. |
| 5,789,030 A | 8/1998 | Rolfson ...................... 429/309 | 6,134,175 A | 10/2000 | Forbes et al. |
| 5,795,808 A | 8/1998 | Park ............................ 438/301 | 6,137,025 A | 10/2000 | Ebbinghaus et al. |
| 5,801,105 A | 9/1998 | Yano et al. .................. 438/785 | 6,140,181 A | 10/2000 | Forbes et al. |
| 5,810,923 A | 9/1998 | Yano et al. .................... 117/84 | 6,141,238 A | 10/2000 | Forbes et al. |
| 5,822,256 A | 10/1998 | Bauer et al. ................. 365/200 | 6,141,260 A | 10/2000 | Ahn et al. |
| 5,827,571 A | 10/1998 | Lee et al. | 6,143,582 A | 11/2000 | Vu et al. |
| 5,828,080 A | 10/1998 | Yano et al. .................... 257/43 | 6,143,616 A | 11/2000 | Geusic et al. |
| 5,840,897 A | 11/1998 | Kirlin et al. .................... 546/2 | 6,144,155 A | 11/2000 | Yoshikawa et al. |
| 5,851,880 A | 12/1998 | Ikegami | 6,146,959 A | 11/2000 | DeBoer et al. |
| 5,874,134 A | 2/1999 | Rao et al. | 6,147,443 A | 11/2000 | Yoshikawa et al. |
| 5,874,760 A | 2/1999 | Burns, Jr. et al. | 6,150,188 A | 11/2000 | Geusic et al. |
| 5,879,459 A | 3/1999 | Gadgil et al. | 6,150,687 A | 11/2000 | Noble et al. |
| 5,882,779 A | 3/1999 | Lawandy | 6,153,468 A | 11/2000 | Forbes et al. |
| 5,892,249 A | 4/1999 | Courtright et al. | 6,154,280 A | 11/2000 | Borden |
| 5,907,170 A | 5/1999 | Forbes et al. | H1924 H | 12/2000 | Zabinski et al. |
| 5,910,880 A | 6/1999 | DeBoer et al. | 6,161,500 A | 12/2000 | Kopacz et al. ........... 118/723 E |
| 5,912,797 A | 6/1999 | Schneemeyer et al. | 6,162,712 A | 12/2000 | Baum et al. |
| 5,916,365 A | 6/1999 | Sherman ...................... 117/92 | 6,165,837 A | 12/2000 | Kawakubo et al. |
| 5,923,056 A | 7/1999 | Lee et al. | 6,166,487 A | 12/2000 | Negishi et al. |
| 5,936,274 A | 8/1999 | Forbes et al. | 6,171,900 B1 | 1/2001 | Sun ............................ 438/240 |
| 5,939,146 A | 8/1999 | Lavernia | 6,174,809 B1 | 1/2001 | Kang et al. |
| 5,950,925 A | 9/1999 | Fukunaga et al. ........ 239/132.3 | 6,184,146 B1 | 2/2001 | Donohoe et al. ............. 438/710 |
| 5,952,039 A | 9/1999 | Hong | 6,184,550 B1 | 2/2001 | Van Buskirk et al. |
| 5,958,140 A | 9/1999 | Arami et al. | 6,184,612 B1 | 2/2001 | Negishi et al. |
| 5,962,132 A | 10/1999 | Chang et al. | 6,187,484 B1 | 2/2001 | Glass et al. .................... 430/5 |
| 5,962,959 A | 10/1999 | Iwasaki et al. | 6,191,443 B1 | 2/2001 | Al-Shareef et al. |
| 5,963,833 A | 10/1999 | Thakur ....................... 438/677 | 6,191,448 B1 | 2/2001 | Forbes et al. |
| 5,972,847 A | 10/1999 | Feenstra et al. | 6,191,470 B1 | 2/2001 | Forbes et al. |
| 5,981,350 A | 11/1999 | Geusic et al. | 6,194,237 B1 | 2/2001 | Kim et al. |
| 5,989,511 A | 11/1999 | Gruen et al. | 6,194,262 B1 | 2/2001 | Noble |
| 5,990,605 A | 11/1999 | Yoshikawa et al. | 6,198,168 B1 | 3/2001 | Geusic et al. |
| 5,991,225 A | 11/1999 | Forbes et al. | 6,200,893 B1 * | 3/2001 | Sneh ........................... 438/685 |
| 5,994,240 A | 11/1999 | Thakur ....................... 438/758 | 6,203,613 B1 | 3/2001 | Gates et al. .................. 117/104 |
| 5,998,264 A | 12/1999 | Wu | 6,203,726 B1 | 3/2001 | Danielson et al. |
| 5,998,528 A | 12/1999 | Tsipursky et al. | 6,206,972 B1 | 3/2001 | Dunham ..................... 118/715 |
| 6,010,969 A | 1/2000 | Vaarstra ..................... 438/758 | 6,207,522 B1 | 3/2001 | Hunt et al. |
| 6,013,553 A | 1/2000 | Wallace et al. .............. 438/287 | 6,207,589 B1 | 3/2001 | Ma et al. |
| 6,020,024 A | 2/2000 | Maiti et al. ............... 427/248.1 | 6,208,164 B1 | 3/2001 | Noble et al. |
| 6,020,243 A | 2/2000 | Wallace et al. | 6,208,881 B1 | 3/2001 | Champeau |
| 6,022,787 A | 2/2000 | Ma | 6,210,999 B1 | 4/2001 | Gardner et al. |
| 6,023,124 A | 2/2000 | Chuman et al. | 6,211,035 B1 | 4/2001 | Moise et al. ................. 438/396 |
| 6,023,125 A | 2/2000 | Yoshikawa et al. | 6,211,039 B1 | 4/2001 | Noble |
| 6,025,034 A | 2/2000 | Strutt et al. | 6,217,645 B1 | 4/2001 | Vaartstra ................ 106/287.18 |
| 6,025,225 A | 2/2000 | Forbes et al. | 6,218,293 B1 | 4/2001 | Kraus et al. ................. 438/644 |
| 6,025,627 A | 2/2000 | Forbes et al. ................ 257/321 | 6,224,690 B1 | 5/2001 | Andricacos et al. |
| 6,027,960 A | 2/2000 | Kusumoto et al. | 6,225,168 B1 | 5/2001 | Gardner et al. .............. 438/287 |
| 6,027,961 A | 2/2000 | Maiti et al. .................. 438/199 | 6,225,237 B1 | 5/2001 | Vaartstra .................... 438/778 |
| 6,034,015 A | 3/2000 | Lin et al. | 6,232,643 B1 | 5/2001 | Forbes et al. |
| 6,040,243 A | 3/2000 | Li et al. ...................... 438/687 | 6,232,847 B1 | 5/2001 | Marcy, 5th et al. |
| 6,057,271 A | 5/2000 | Kenjiro et al. ............... 505/475 | 6,246,606 B1 | 6/2001 | Forbes et al. |

| Patent | Date | Inventor | Class |
|---|---|---|---|
| 6,255,852 B1 | 7/2001 | Forbes et al. | |
| 6,258,637 B1 | 7/2001 | Wilk et al. | |
| 6,259,198 B1 | 7/2001 | Yanagisawa et al. | |
| 6,270,835 B1 | 8/2001 | Hunt et al. | |
| 6,273,951 B1 | 8/2001 | Vaartstra | 117/104 |
| 6,274,479 B1 | 8/2001 | Srinivasan | |
| 6,274,937 B1 | 8/2001 | Ahn et al. | |
| 6,277,448 B2 | 8/2001 | Strutt et al. | |
| 6,278,230 B1 | 8/2001 | Yoshizawa et al. | |
| 6,281,042 B1 | 8/2001 | Ahn et al. | |
| 6,281,144 B1 | 8/2001 | Cleary et al. | 438/780 |
| 6,282,080 B1 | 8/2001 | DeBoer et al. | |
| 6,285,123 B1 | 9/2001 | Yamada et al. | |
| 6,289,842 B1 | 9/2001 | Tompa | |
| 6,290,491 B1 | 9/2001 | Shahvandi et al. | |
| 6,291,314 B1 | 9/2001 | Henley et al. | |
| 6,291,341 B1 | 9/2001 | Sharan et al. | |
| 6,291,364 B1 | 9/2001 | Gealy et al. | |
| 6,291,866 B1 | 9/2001 | Wallace et al. | |
| 6,294,420 B1 | 9/2001 | Tsu et al. | |
| 6,294,813 B1 | 9/2001 | Forbes et al. | 257/321 |
| 6,296,943 B1 | 10/2001 | Watanabe et al. | |
| 6,297,103 B1 | 10/2001 | Ahn et al. | |
| 6,297,516 B1 | 10/2001 | Forrest et al. | |
| 6,297,527 B1 | 10/2001 | Agarwal et al. | |
| 6,297,539 B1 | 10/2001 | Ma et al. | 257/410 |
| 6,300,203 B1 | 10/2001 | Buynoski et al. | 438/287 |
| 6,300,255 B1 | 10/2001 | Venkataranan et al. | |
| 6,302,964 B1 | 10/2001 | Umotoy et al. | 118/715 |
| 6,303,481 B2 | 10/2001 | Park | 438/591 |
| 6,303,500 B1 | 10/2001 | Jiang et al. | 438/678 |
| 6,313,015 B1 | 11/2001 | Lee et al. | |
| 6,313,035 B1 | 11/2001 | Sandhu et al. | 438/681 |
| 6,313,518 B1 | 11/2001 | Ahn et al. | |
| 6,313,531 B1 | 11/2001 | Geusic et al. | |
| 6,316,800 B1 | 11/2001 | Al-Shareef et al. | |
| 6,316,873 B1 | 11/2001 | Ito et al. | |
| 6,317,175 B1 | 11/2001 | Salerno et al. | |
| 6,317,357 B1 | 11/2001 | Forbes | |
| 6,320,091 B1 | 11/2001 | Ebbinghaus et al. | |
| 6,331,282 B1 | 12/2001 | Manthiram et al. | |
| 6,331,465 B1 | 12/2001 | Forbes et al. | 438/260 |
| 6,337,805 B1 | 1/2002 | Forbes et al. | |
| 6,342,445 B1 | 1/2002 | Marsh | 438/681 |
| 6,346,477 B1 | 2/2002 | Kaloyeros et al. | |
| 6,348,386 B1 | 2/2002 | Gilmer | 438/288 |
| 6,348,709 B1 | 2/2002 | Graettinger et al. | |
| 6,350,649 B1 | 2/2002 | Jeong et al. | |
| 6,350,704 B1 | 2/2002 | Ahn et al. | |
| 6,351,411 B2 | 2/2002 | Forbes et al. | |
| 6,352,591 B1 | 3/2002 | Yieh et al. | |
| 6,355,561 B1 | 3/2002 | Sandhu et al. | |
| 6,365,470 B1 | 4/2002 | Maeda | |
| 6,365,519 B2 | 4/2002 | Kraus et al. | 438/688 |
| 6,368,398 B2 | 4/2002 | Vaartstra | 106/287.18 |
| 6,368,518 B1 | 4/2002 | Vaartstra | 216/67 |
| 6,368,941 B1 | 4/2002 | Chen et al. | 438/424 |
| 6,373,740 B1 | 4/2002 | Forbes et al. | |
| 6,377,070 B1 | 4/2002 | Forbes | |
| 6,380,579 B1 | 4/2002 | Nam et al. | 257/306 |
| 6,381,124 B1 | 4/2002 | Whitcher et al. | |
| 6,381,168 B2 | 4/2002 | Forbes | |
| 6,387,712 B1 | 5/2002 | Yano et al. | 438/3 |
| 6,388,376 B1 | 5/2002 | Negishi et al. | |
| 6,391,769 B1 | 5/2002 | Lee et al. | 438/643 |
| 6,399,979 B1 | 6/2002 | Noble et al. | |
| 6,400,070 B1 | 6/2002 | Yamada et al. | |
| 6,400,552 B2 | 6/2002 | Al-Shareef et al. | |
| 6,403,494 B1 | 6/2002 | Chu et al. | |
| 6,404,027 B1 | 6/2002 | Hong et al. | |
| 6,404,124 B1 | 6/2002 | Sakemura et al. | |
| 6,414,543 B1 | 7/2002 | Beigel et al. | |
| 6,417,537 B1 | 7/2002 | Yang et al. | |
| 6,418,050 B2 | 7/2002 | Forbes | |
| 6,420,230 B1 | 7/2002 | Derderian et al. | 438/255 |
| 6,420,279 B1 | 7/2002 | Ono et al. | 438/785 |
| 6,423,613 B1 | 7/2002 | Geusic | |
| 6,423,649 B2 | 7/2002 | Gealy et al. | |
| 6,429,065 B2 | 8/2002 | Forbes | |
| 6,429,237 B1 | 8/2002 | Tooley | |
| 6,432,779 B1 | 8/2002 | Hobbs et al. | 438/287 |
| 6,433,993 B1 | 8/2002 | Hunt et al. | |
| 6,434,041 B2 | 8/2002 | Forbes et al. | |
| 6,436,203 B1 | 8/2002 | Kaizuka et al. | |
| 6,437,389 B1 | 8/2002 | Forbes et al. | |
| 6,441,417 B1 | 8/2002 | Zhang et al. | |
| 6,444,039 B1 | 9/2002 | Nguyen | 118/715 |
| 6,444,042 B1 | 9/2002 | Yang et al. | |
| 6,444,592 B1 | 9/2002 | Ballantine et al. | |
| 6,444,895 B1 | 9/2002 | Nikawa | 136/212 |
| 6,445,023 B1 | 9/2002 | Vaartstra et al. | 257/295 |
| 6,447,764 B1 | 9/2002 | Bayer et al. | |
| 6,447,848 B1 | 9/2002 | Chow et al. | |
| 6,448,192 B1 | 9/2002 | Kaushik | 438/785 |
| 6,448,601 B1 | 9/2002 | Forbes et al. | |
| 6,451,641 B1 | 9/2002 | Halliyal et al. | 438/200 |
| 6,451,662 B1 | 9/2002 | Chudzik et al. | 438/386 |
| 6,451,695 B2 | 9/2002 | Sneh | 438/685 |
| 6,454,912 B1 | 9/2002 | Ahn et al. | |
| 6,455,717 B1 | 9/2002 | Vaartstra | 556/1 |
| 6,458,431 B2 | 10/2002 | Hill et al. | |
| 6,458,645 B2 | 10/2002 | DeBoer et al. | |
| 6,458,701 B1 | 10/2002 | Chae et al. | 438/680 |
| 6,461,436 B1 | 10/2002 | Campbell et al. | 118/715 |
| 6,461,914 B1 | 10/2002 | Roberts et al. | 438/253 |
| 6,461,970 B1 | 10/2002 | Yin | 438/710 |
| 6,465,298 B2 | 10/2002 | Forbes et al. | |
| 6,465,334 B1 | 10/2002 | Buynoski et al. | 438/591 |
| 6,465,853 B1 | 10/2002 | Hobbs et al. | |
| 6,472,321 B2 | 10/2002 | Srinivasan et al. | 438/680 |
| 6,472,632 B1 | 10/2002 | Peterson et al. | |
| 6,472,803 B1 | 10/2002 | Yoshizawa et al. | |
| 6,476,434 B1 | 11/2002 | Noble et al. | |
| 6,482,740 B2 | 11/2002 | Soininen et al. | 438/686 |
| 6,486,027 B1 | 11/2002 | Noble et al. | |
| 6,486,703 B2 | 11/2002 | Noble et al. | |
| 6,489,648 B1 | 12/2002 | Iwasaki et al. | |
| 6,492,233 B2 | 12/2002 | Forbes et al. | |
| 6,492,241 B1 | 12/2002 | Rhodes et al. | |
| 6,492,288 B2 | 12/2002 | Shindo | |
| 6,495,436 B2 | 12/2002 | Ahn et al. | 438/591 |
| 6,496,034 B2 | 12/2002 | Forbes et al. | |
| 6,498,063 B1 | 12/2002 | Ping | 438/253 |
| 6,498,065 B1 | 12/2002 | Forbes et al. | |
| 6,506,666 B2 | 1/2003 | Marsh | |
| 6,509,280 B2 | 1/2003 | Choi | |
| 6,514,348 B2 | 2/2003 | Miyamoto | |
| 6,514,820 B2 | 2/2003 | Ahn et al. | |
| 6,514,828 B2 | 2/2003 | Ahn et al. | 438/297 |
| 6,515,510 B2 | 2/2003 | Noble et al. | |
| 6,518,121 B2 | 2/2003 | Al-Shareef et al. | |
| 6,518,610 B2 | 2/2003 | Yang et al. | 257/295 |
| 6,518,615 B1 | 2/2003 | Geusic et al. | |
| 6,518,634 B1 | 2/2003 | Kaushik et al. | |
| 6,521,911 B2 | 2/2003 | Parsons et al. | 257/52 |
| 6,524,867 B2 | 2/2003 | Yang et al. | 438/3 |
| 6,524,901 B1 | 2/2003 | Trivedi | 438/183 |
| 6,526,191 B1 | 2/2003 | Geusic et al. | |
| 6,527,866 B1 | 3/2003 | Matijasevic et al. | |
| 6,531,354 B2 | 3/2003 | Maria et al. | |
| 6,533,867 B2 | 3/2003 | Doppelhammer | |
| 6,534,357 B1 | 3/2003 | Basceri et al. | 438/239 |
| 6,534,420 B2 | 3/2003 | Ahn et al. | 438/768 |
| 6,537,613 B1 | 3/2003 | Senzaki et al. | 427/250 |
| 6,538,330 B1 | 3/2003 | Forbes | |
| 6,541,079 B1 | 4/2003 | Bojarczuk, Jr. et al. | |

| | | | | | | |
|---|---|---|---|---|---|---|
| 6,541,280 B2 | 4/2003 | Kaushik et al. | | 6,683,011 B2 | 1/2004 | Smith et al. |
| 6,541,353 B1 | 4/2003 | Sandhu et al. ............... 438/478 | | 6,686,212 B1 | 2/2004 | Conley, Jr. et al. |
| 6,542,229 B1 | 4/2003 | Kalal et al. | | 6,689,192 B1 | 2/2004 | Phillips et al. |
| 6,544,846 B2 | 4/2003 | Ahn et al. | | 6,689,657 B2 | 2/2004 | Gealy et al. |
| 6,544,875 B1 | 4/2003 | Wilk ........................ 438/591 | | 6,689,660 B1 | 2/2004 | Noble et al. |
| 6,545,314 B2 | 4/2003 | Forbes et al. | | 6,696,332 B2 | 2/2004 | Visokay et al. .............. 438/216 |
| 6,551,893 B1 | 4/2003 | Zheng et al. | | 6,699,745 B1 | 3/2004 | Banerjee et al. |
| 6,551,929 B1 | 4/2003 | Kori et al. | | 6,699,747 B2 | 3/2004 | Ruff et al. |
| 6,552,383 B2 | 4/2003 | Ahn et al. | | 6,700,132 B2 | 3/2004 | Chuman et al. |
| 6,552,388 B2 | 4/2003 | Wilk et al. | | 6,709,978 B2 | 3/2004 | Geusic et al. |
| 6,555,858 B1 | 4/2003 | Jones et al. | | 6,709,989 B2 | 3/2004 | Ramdani et al. |
| 6,559,472 B2 | 5/2003 | Sandhu et al. ................ 257/31 | | 6,710,538 B1 | 3/2004 | Ahn et al. |
| 6,566,682 B2 | 5/2003 | Forbes | | 6,713,329 B1 | 3/2004 | Wagner et al. |
| 6,569,757 B1 | 5/2003 | Weling et al. | | 6,713,846 B1 | 3/2004 | Senzaki ...................... 257/635 |
| 6,570,248 B1 | 5/2003 | Ahn et al. | | 6,720,216 B2 | 4/2004 | Forbes |
| 6,572,836 B1 | 6/2003 | Schulz et al. | | 6,720,221 B1 | 4/2004 | Ahn et al. |
| 6,573,199 B2 | 6/2003 | Sandhu et al. ............... 438/798 | | 6,723,577 B1 | 4/2004 | Geusic et al. |
| 6,580,124 B1 | 6/2003 | Cleeves et al. | | 6,723,606 B2 | 4/2004 | Flagan et al. |
| 6,586,349 B1 | 7/2003 | Jeon et al. | | 6,728,092 B2 | 4/2004 | Hunt et al. |
| 6,586,785 B2 | 7/2003 | Flagan et al. | | 6,730,163 B2 | 5/2004 | Vaartstra |
| 6,586,792 B2 | 7/2003 | Ahn et al. .................... 257/295 | | 6,730,367 B2 | 5/2004 | Sandhu |
| 6,587,408 B1 | 7/2003 | Jacobson et al. | | 6,730,575 B2 | 5/2004 | Eldridge |
| 6,590,252 B2 | 7/2003 | Kutsunai et al. | | 6,737,740 B2 | 5/2004 | Forbes et al. |
| 6,592,661 B1 | 7/2003 | Thakur et al. .................. 117/2 | | 6,740,605 B1 | 5/2004 | Shiraiwa et al. |
| 6,592,839 B2 | 7/2003 | Gruen et al. | | 6,744,063 B2 | 6/2004 | Yoshikawa et al. |
| 6,592,942 B1 | 7/2003 | Van Wijck | | 6,744,093 B2 | 6/2004 | Agarwal et al. |
| 6,593,610 B2 | 7/2003 | Gonzalez ..................... 257/296 | | 6,746,893 B1 | 6/2004 | Forbes et al. |
| 6,596,583 B2 | 7/2003 | Agarwal et al. ............. 438/255 | | 6,746,916 B2 | 6/2004 | Agarwal et al. |
| 6,596,636 B2 | 7/2003 | Sandhu et al. ............... 438/676 | | 6,746,930 B2 | 6/2004 | Yang et al. |
| 6,596,651 B2 | 7/2003 | Gealy et al. | | 6,746,934 B2 | 6/2004 | Sandhu et al. |
| 6,597,037 B1 | 7/2003 | Forbes et al. | | 6,750,066 B1 | 6/2004 | Cheung et al. ................. 438/3 |
| 6,602,053 B2 | 8/2003 | Subramanian et al. | | 6,750,126 B1 | 6/2004 | Visokay et al. |
| 6,602,338 B2 | 8/2003 | Chen et al. ............ 106/287.19 | | 6,754,108 B2 | 6/2004 | Forbes |
| 6,608,378 B2 | 8/2003 | Ahn et al. ................... 257/701 | | 6,755,886 B2 | 6/2004 | Phillips |
| 6,613,656 B2 | 9/2003 | Li ............................... 438/584 | | 6,756,292 B2 | 6/2004 | Lee et al. |
| 6,613,702 B2 | 9/2003 | Sandhu et al. ............... 438/798 | | 6,756,298 B2 | 6/2004 | Ahn et al. |
| 6,617,634 B2 | 9/2003 | Marsh et al. ................... 60/276 | | 6,759,081 B2 * | 7/2004 | Huganen et al. .............. 427/58 |
| 6,617,639 B1 | 9/2003 | Wang et al. | | 6,759,151 B1 | 7/2004 | Lee |
| 6,620,670 B2 | 9/2003 | Song et al. .................. 438/216 | | 6,760,257 B2 | 7/2004 | Huang et al. |
| 6,620,752 B2 | 9/2003 | Messing et al. | | 6,762,114 B1 | 7/2004 | Chambers ................... 438/591 |
| 6,627,260 B2 | 9/2003 | Derderian et al. ........... 427/301 | | 6,764,901 B2 | 7/2004 | Noble |
| 6,627,503 B2 | 9/2003 | Ma et al. ..................... 438/287 | | 6,764,919 B2 | 7/2004 | Yu et al. |
| 6,627,508 B1 | 9/2003 | DeBoer et al. | | 6,764,941 B2 | 7/2004 | Yang et al. |
| 6,630,713 B2 | 10/2003 | Geusic | | 6,767,419 B1 | 7/2004 | Branagan |
| 6,632,279 B1 | 10/2003 | Ritala et al. | | 6,767,582 B1 | 7/2004 | Elers |
| 6,638,575 B1 | 10/2003 | Chen et al. | | 6,767,795 B2 | 7/2004 | Ahn |
| 6,638,859 B2 | 10/2003 | Sneh et al. | | 6,768,175 B1 | 7/2004 | Morishita et al. |
| 6,639,267 B2 | 10/2003 | Eldridge ..................... 257/310 | | 6,770,536 B2 | 8/2004 | Wilk et al. |
| 6,641,887 B2 | 11/2003 | Iida et al. | | 6,770,923 B2 | 8/2004 | Nguyen et al. |
| 6,642,567 B1 | 11/2003 | Marsh ......................... 257/306 | | 6,773,981 B1 | 8/2004 | Al-Shareef et al. |
| 6,642,573 B1 | 11/2003 | Halliyal et al. | | 6,773,984 B2 | 8/2004 | Srividya et al. |
| 6,642,782 B2 | 11/2003 | Beigel et al. | | 6,774,050 B2 | 8/2004 | Ahn et al. |
| 6,645,569 B2 | 11/2003 | Cramer et al. | | 6,777,353 B2 | 8/2004 | Putkonen |
| 6,645,882 B1 | 11/2003 | Halliyal et al. | | 6,777,715 B1 | 8/2004 | Geusic et al. |
| 6,652,924 B2 | 11/2003 | Sherman | | 6,777,739 B2 | 8/2004 | Agarwal et al. |
| 6,653,209 B1 | 11/2003 | Yamagata | | 6,778,441 B2 | 8/2004 | Forbes et al. |
| 6,653,591 B1 | 11/2003 | Peterson et al. | | 6,780,704 B1 | 8/2004 | Raaijmakers et al. |
| 6,656,371 B2 | 12/2003 | Drewes ......................... 216/22 | | 6,785,120 B1 | 8/2004 | Basceri et al. |
| 6,656,792 B2 | 12/2003 | Choi et al. | | 6,787,122 B2 | 9/2004 | Zhou |
| 6,656,835 B2 | 12/2003 | Marsh et al. ................ 438/650 | | 6,787,370 B2 | 9/2004 | Forbes |
| 6,660,660 B2 | 12/2003 | Haukka et al. .............. 438/778 | | 6,787,413 B2 | 9/2004 | Ahn |
| 6,661,058 B2 | 12/2003 | Ahn et al. .................... 257/344 | | 6,787,463 B2 | 9/2004 | Mardian et al. |
| 6,669,823 B1 | 12/2003 | Sarkas et al. | | 6,787,906 B1 | 9/2004 | Yang et al. |
| 6,669,996 B2 | 12/2003 | Ueno et al. | | 6,787,992 B2 | 9/2004 | Chuman et al. |
| 6,670,284 B2 | 12/2003 | Yin ............................. 438/759 | | 6,790,791 B2 | 9/2004 | Ahn et al. |
| 6,673,701 B1 | 1/2004 | Marsh et al. ................ 438/493 | | 6,794,255 B1 | 9/2004 | Forbes et al. |
| 6,674,138 B1 | 1/2004 | Halliyal et al. | | 6,794,315 B1 | 9/2004 | Klemperer et al. |
| 6,677,204 B2 | 1/2004 | Cleeves et al. | | 6,794,709 B2 | 9/2004 | Ahn et al. |
| 6,677,250 B2 | 1/2004 | Campbell et al. ........... 438/758 | | 6,797,561 B2 | 9/2004 | Ko et al. |
| 6,677,640 B1 | 1/2004 | Sandhu et al. | | 6,800,567 B2 | 10/2004 | Cho |
| 6,682,602 B2 | 1/2004 | Vaartstra .................... 118/715 | | 6,801,415 B2 | 10/2004 | Slaughter et al. |
| 6,682,969 B1 | 1/2004 | Basceri et al. | | 6,803,311 B2 | 10/2004 | Choi |
| 6,683,005 B2 | 1/2004 | Sandhu et al. .............. 438/715 | | 6,803,326 B2 | 10/2004 | Ahn et al. |

| | | | | | |
|---|---|---|---|---|---|
| 6,804,136 B2 | 10/2004 | Forbes | 7,045,430 B2 | 5/2006 | Ahn et al. |
| 6,806,187 B2 | 10/2004 | Graettinger et al. | 7,049,192 B2 | 5/2006 | Ahn et al. |
| 6,808,978 B2 | 10/2004 | Kim | 7,064,058 B2 | 6/2006 | Ahn et al. |
| 6,812,100 B2 | 11/2004 | Ahn et al. | 7,068,544 B2 | 6/2006 | Forbes et al. |
| 6,812,110 B1 | 11/2004 | Basceri et al. | 7,071,066 B2 | 7/2006 | Wang et al. |
| 6,812,137 B2 | 11/2004 | Forbes et al. | 7,074,380 B2 | 7/2006 | Iwaki et al. |
| 6,812,157 B1 | 11/2004 | Gadgil | 7,081,421 B2 | 7/2006 | Ahn et al. |
| 6,812,513 B2 | 11/2004 | Geusic et al. | 7,084,078 B2 | 8/2006 | Ahn et al. |
| 6,812,516 B2 | 11/2004 | Noble, Jr. et al. | 7,101,813 B2 | 9/2006 | Ahn et al. |
| 6,815,781 B2 | 11/2004 | Vyvoda | 7,122,415 B2 | 10/2006 | Jang et al. |
| 6,818,937 B2 | 11/2004 | Noble et al. | 7,122,464 B2 | 10/2006 | Vaartstra |
| 6,821,862 B2 | 11/2004 | Cho | 7,129,553 B2 | 10/2006 | Ahn et al. |
| 6,821,873 B2 | 11/2004 | Visokay et al. | 7,132,329 B1 | 11/2006 | Hong et al. |
| 6,828,045 B1 | 12/2004 | Tokailin et al. | 7,135,369 B2 | 11/2006 | Ahn et al. |
| 6,828,632 B2 | 12/2004 | Bhattacharyya | 7,135,421 B2 | 11/2006 | Ahn et al. |
| 6,830,676 B2 | 12/2004 | Deevi | 7,138,336 B2 | 11/2006 | Lee et al. |
| 6,831,310 B1 | 12/2004 | Mathew et al. | 7,141,278 B2 | 11/2006 | Koh et al. |
| 6,831,315 B2 | 12/2004 | Raaijmakers et al. | 7,160,577 B2 | 1/2007 | Ahn et al. |
| 6,833,285 B1 | 12/2004 | Ahn et al. | 7,160,817 B2 | 1/2007 | Marsh |
| 6,833,308 B2 | 12/2004 | Ahn et al. | 7,169,673 B2 | 1/2007 | Ahn et al. |
| 6,835,111 B2 | 12/2004 | Ahn et al. | 7,183,186 B2 | 2/2007 | Ahn et al. |
| 6,838,404 B2 | 1/2005 | Hentges et al. | 7,192,824 B2 | 3/2007 | Ahn et al. |
| 6,839,280 B1 | 1/2005 | Chindalore et al. | 7,192,892 B2 | 3/2007 | Ahn et al. |
| 6,842,370 B2 | 1/2005 | Forbes | 7,195,999 B2 | 3/2007 | Forbes et al. |
| 6,844,203 B2 | 1/2005 | Ahn et al. | 7,199,023 B2 | 4/2007 | Ahn et al. |
| 6,844,260 B2 | 1/2005 | Sarigiannis et al. | 7,205,218 B2 | 4/2007 | Ahn et al. |
| 6,844,319 B1 | 1/2005 | Poelstra et al. | 7,211,492 B2 | 5/2007 | Forbes et al. |
| 6,846,574 B2 | 1/2005 | Subramanian | 7,214,994 B2 | 5/2007 | Forbes et al. |
| 6,849,948 B2 | 2/2005 | Chen et al. | 7,235,501 B2 | 6/2007 | Ahn et al. |
| 6,852,167 B2 | 2/2005 | Ahn | 7,235,854 B2 | 6/2007 | Ahn et al. |
| 6,852,645 B2 | 2/2005 | Colombo et al. | 7,323,423 B2 | 1/2008 | Brask et al. |
| 6,853,587 B2 | 2/2005 | Forbes | 7,365,027 B2 | 4/2008 | Ahn et al. |
| 6,858,120 B2 | 2/2005 | Ahn et al. | 7,388,246 B2 | 6/2008 | Ahn et al. |
| 6,858,444 B2 | 2/2005 | Ahn et al. | 7,390,756 B2 | 6/2008 | Ahn et al. |
| 6,858,865 B2 | 2/2005 | Ahn et al. | 7,402,876 B2 | 7/2008 | Ahn et al. |
| 6,858,894 B2 | 2/2005 | Srividya et al. | 7,405,454 B2 | 7/2008 | Ahn et al. |
| 6,859,093 B1 | 2/2005 | Beigel | 2001/0002280 A1 | 5/2001 | Sneh |
| 6,863,933 B2 | 3/2005 | Cramer et al. | 2001/0002582 A1 | 6/2001 | Dunham |
| 6,864,527 B2 | 3/2005 | DeBoer et al. | 2001/0005625 A1 | 6/2001 | Sun et al. |
| 6,869,877 B2 | 3/2005 | Rhodes et al. | 2001/0009383 A1 | 7/2001 | Nakayama et al. |
| 6,878,624 B1 | 4/2005 | Bruley et al. | 2001/0009695 A1 | 7/2001 | Saanila et al. .......... 427/255.39 |
| 6,884,719 B2 | 4/2005 | Chang et al. | 2001/0010957 A1 | 8/2001 | Forbes et al. |
| 6,884,739 B2 | 4/2005 | Ahn et al. | 2001/0011740 A1 | 8/2001 | DeBoer et al. |
| 6,887,758 B2 | 5/2005 | Chindalore et al. | 2001/0012698 A1 | 8/2001 | Hayashi et al. |
| 6,888,739 B2 | 5/2005 | Forbes | 2001/0014526 A1 | 8/2001 | Clevenger et al. |
| 6,893,984 B2 | 5/2005 | Ahn et al. | 2001/0017369 A1 | 8/2001 | Iwasaki et al. |
| 6,896,617 B2 | 5/2005 | Daly | 2001/0019876 A1 | 9/2001 | Juengling et al. |
| 6,900,116 B2 | 5/2005 | Forbes et al. | 2001/0024387 A1 | 9/2001 | Raaijmakers et al. |
| 6,900,122 B2 | 5/2005 | Ahn et al. | 2001/0030352 A1 | 10/2001 | Ruff et al. |
| 6,900,481 B2 | 5/2005 | Jin et al. | 2001/0034117 A1 | 10/2001 | Eldridge et al. |
| 6,903,367 B2 | 6/2005 | Forbes | 2001/0040430 A1 | 11/2001 | Ito et al. |
| 6,914,800 B2 | 7/2005 | Ahn et al. | 2001/0042505 A1 | 11/2001 | Vaartstra .................... 117/104 |
| 6,917,112 B2 | 7/2005 | Basceri et al. | 2001/0050438 A1 | 12/2001 | Juengling et al. |
| 6,919,266 B2 | 7/2005 | Ahn et al. | 2001/0051406 A1 | 12/2001 | Weimer et al. |
| 6,921,702 B2 | 7/2005 | Ahn et al. | 2001/0051442 A1 | 12/2001 | Katsir et al. |
| 6,929,830 B2 | 8/2005 | Tei et al. | 2001/0053082 A1 | 12/2001 | Chipalkatti et al. |
| 6,930,059 B2 | 8/2005 | Conley, Jr. et al. | 2001/0053096 A1 | 12/2001 | Forbes et al. |
| 6,930,346 B2 | 8/2005 | Ahn et al. | 2002/0000593 A1 | 1/2002 | Nishiyama et al. |
| 6,933,225 B2 | 8/2005 | Werkhoven et al. | 2002/0001971 A1 | 1/2002 | Cho ........................... 438/765 |
| 6,949,433 B1 | 9/2005 | Hidehiko et al. | 2002/0002216 A1 | 1/2002 | Tooley |
| 6,950,340 B2 | 9/2005 | Bhattacharyya | 2002/0004276 A1 | 1/2002 | Ahn et al. |
| 6,952,032 B2 | 10/2005 | Forbes et al. | 2002/0004277 A1 | 1/2002 | Ahn et al. |
| 6,953,730 B2 | 10/2005 | Ahn et al. | 2002/0004279 A1 | 1/2002 | Agarwal et al. |
| 6,958,302 B2 | 10/2005 | Ahn et al. | 2002/0013052 A1 | 1/2002 | Visokay |
| 6,960,538 B2 | 11/2005 | Ahn et al. | 2002/0019125 A1 | 2/2002 | Juengling et al. |
| 6,970,053 B2 | 11/2005 | Akram et al. | 2002/0022156 A1 | 2/2002 | Bright |
| 6,979,855 B2 | 12/2005 | Ahn et al. | 2002/0024080 A1 | 2/2002 | Derderian et al. ............ 257/301 |
| 6,984,591 B1 | 1/2006 | Buchanan et al. | 2002/0025628 A1 | 2/2002 | Derderian et al. ............... 438/253 |
| 6,989,565 B1 | 1/2006 | Aronowitz et al. | 2002/0028541 A1 | 3/2002 | Lee et al. |
| 6,989,573 B2 | 1/2006 | Ahn et al. | 2002/0037320 A1 | 3/2002 | Denes et al. |
| 7,005,391 B2 | 2/2006 | Min et al. | 2002/0037603 A1 | 3/2002 | Eldridge et al. |
| 7,026,694 B2 | 4/2006 | Ahn et al. | 2002/0046705 A1 | 4/2002 | Sandhu et al. ................ 118/719 |
| 7,037,574 B2 | 5/2006 | Paranjpe et al. | 2002/0046993 A1 | 4/2002 | Peterson et al. |

| Publication No. | Date | Inventor(s) | Ref |
|---|---|---|---|
| 2002/0051859 A1 | 5/2002 | Iida et al. | |
| 2002/0053869 A1 | 5/2002 | Ahn et al. | |
| 2002/0058578 A1 | 5/2002 | Shindo | |
| 2002/0068466 A1 | 6/2002 | Lee et al. | |
| 2002/0076070 A1 | 6/2002 | Yoshikawa et al. | |
| 2002/0083464 A1 | 6/2002 | Tomsen et al. | |
| 2002/0084480 A1 | 7/2002 | Basceri et al. | |
| 2002/0086507 A1 | 7/2002 | Park et al. | 438/585 |
| 2002/0086521 A1 | 7/2002 | Ahn et al. | |
| 2002/0086555 A1 | 7/2002 | Ahn et al. | 438/783 |
| 2002/0089023 A1 | 7/2002 | Yu et al. | 257/411 |
| 2002/0089063 A1 | 7/2002 | Ahn et al. | 257/762 |
| 2002/0090806 A1 | 7/2002 | Ahn et al. | 438/618 |
| 2002/0094632 A1 | 7/2002 | Agarwal et al. | |
| 2002/0100418 A1 | 8/2002 | Sandhu et al. | |
| 2002/0102818 A1 | 8/2002 | Sandhu et al. | 438/479 |
| 2002/0109138 A1 | 8/2002 | Forbes | |
| 2002/0110991 A1 | 8/2002 | Li | 438/387 |
| 2002/0111001 A1 | 8/2002 | Ahn et al. | 438/592 |
| 2002/0113261 A1 | 8/2002 | Iwasaki et al. | |
| 2002/0117704 A1 | 8/2002 | Gonzalez | |
| 2002/0117963 A1 | 8/2002 | Chuman et al. | |
| 2002/0119297 A1 | 8/2002 | Forrest et al. | |
| 2002/0119916 A1 | 8/2002 | Hassan | |
| 2002/0120297 A1 | 8/2002 | Shadduck | |
| 2002/0122885 A1 | 9/2002 | Ahn | 427/255.28 |
| 2002/0125490 A1 | 9/2002 | Chuman et al. | |
| 2002/0130338 A1 | 9/2002 | Ahn et al. | |
| 2002/0135048 A1 | 9/2002 | Ahn et al. | |
| 2002/0142536 A1 | 10/2002 | Zhang et al. | |
| 2002/0142569 A1 | 10/2002 | Chang et al. | |
| 2002/0145845 A1 | 10/2002 | Hunt et al. | |
| 2002/0145901 A1 | 10/2002 | Forbes et al. | |
| 2002/0146916 A1 | 10/2002 | Irino et al. | 438/785 |
| 2002/0148566 A1 | 10/2002 | Kitano et al. | |
| 2002/0155688 A1 | 10/2002 | Ahn et al. | 438/592 |
| 2002/0155689 A1 | 10/2002 | Ahn et al. | 29/76 |
| 2002/0164420 A1 | 11/2002 | Derderian et al. | 248/427 |
| 2002/0167057 A1 | 11/2002 | Ahn et al. | |
| 2002/0167089 A1 | 11/2002 | Ahn et al. | 257/762 |
| 2002/0170671 A1 | 11/2002 | Matsushita et al. | |
| 2002/0172799 A1 | 11/2002 | Ramesh | |
| 2002/0176989 A1 | 11/2002 | Knudsen et al. | |
| 2002/0177244 A1 | 11/2002 | Hsu et al. | |
| 2002/0177282 A1 | 11/2002 | Song | |
| 2002/0187091 A1 | 12/2002 | Deevi | |
| 2002/0190251 A1 | 12/2002 | Kunitake et al. | |
| 2002/0190294 A1 | 12/2002 | Iizuka et al. | |
| 2002/0192366 A1 | 12/2002 | Cramer et al. | |
| 2002/0192974 A1 | 12/2002 | Ahn et al. | 438/722 |
| 2002/0192975 A1 | 12/2002 | Ahn | |
| 2002/0192979 A1 | 12/2002 | Ahn | |
| 2002/0193040 A1 | 12/2002 | Zhou | |
| 2002/0195056 A1 | 12/2002 | Sandhu et al. | 427/248.1 |
| 2002/0196405 A1 | 12/2002 | Colgan et al. | |
| 2002/0197793 A1 | 12/2002 | Dornfest et al. | |
| 2002/0197856 A1 | 12/2002 | Matsuse et al. | |
| 2002/0197881 A1 | 12/2002 | Ramdani et al. | |
| 2003/0001190 A1 | 1/2003 | Basceri et al. | |
| 2003/0001194 A1 | 1/2003 | DeBoer et al. | |
| 2003/0001212 A1 | 1/2003 | Hu et al. | 257/388 |
| 2003/0001241 A1 | 1/2003 | Chakrabarti et al. | |
| 2003/0003621 A1 | 1/2003 | Rhodes et al. | |
| 2003/0003635 A1 | 1/2003 | Paranjpe et al. | |
| 2003/0003702 A1 | 1/2003 | Ahn et al. | 438/591 |
| 2003/0003722 A1 | 1/2003 | Vaarstra et al. | 438/656 |
| 2003/0003730 A1 | 1/2003 | Li | 438/680 |
| 2003/0004051 A1 | 1/2003 | Kim et al. | |
| 2003/0008243 A1 | 1/2003 | Ahn et al. | 430/314 |
| 2003/0015769 A1 | 1/2003 | DeBoer et al. | |
| 2003/0017717 A1 | 1/2003 | Ahn et al. | 438/768 |
| 2003/0020169 A1 | 1/2003 | Ahn et al. | 257/762 |
| 2003/0020180 A1 | 1/2003 | Ahn et al. | 257/786 |
| 2003/0025142 A1 | 2/2003 | Rhodes et al. | |
| 2003/0026697 A1 | 2/2003 | Subramanian et al. | |
| 2003/0027360 A1 | 2/2003 | Hsu et al. | |
| 2003/0030074 A1 | 2/2003 | Walker et al. | |
| 2003/0030093 A1 | 2/2003 | Agarwal et al. | |
| 2003/0032270 A1 | 2/2003 | Snyder et al. | |
| 2003/0042526 A1 | 3/2003 | Weimer | 257/309 |
| 2003/0043637 A1 | 3/2003 | Forbes et al. | |
| 2003/0045060 A1 | 3/2003 | Ahn et al. | |
| 2003/0045078 A1 | 3/2003 | Ahn et al. | |
| 2003/0045082 A1 | 3/2003 | Eldridge et al. | 438/593 |
| 2003/0048666 A1 | 3/2003 | Eldridge et al. | 365/185.28 |
| 2003/0048745 A1 | 3/2003 | Yoshikawa et al. | |
| 2003/0049942 A1 | 3/2003 | Haukka et al. | |
| 2003/0052356 A1 | 3/2003 | Yang et al. | 257/309 |
| 2003/0052358 A1 | 3/2003 | Weimer | 257/310 |
| 2003/0059535 A1 | 3/2003 | Luo et al. | |
| 2003/0062261 A1 | 4/2003 | Shindo | |
| 2003/0064607 A1 | 4/2003 | Leu et al. | |
| 2003/0067046 A1 | 4/2003 | Iwasaki et al. | |
| 2003/0089314 A1 | 5/2003 | Matsuki et al. | |
| 2003/0102501 A1 | 6/2003 | Yang et al. | 257/295 |
| 2003/0104666 A1 | 6/2003 | Bojarczuk, Jr. et al. | |
| 2003/0108612 A1 | 6/2003 | Xu et al. | |
| 2003/0119246 A1 | 6/2003 | Ahn | |
| 2003/0119291 A1 | 6/2003 | Ahn et al. | |
| 2003/0119313 A1 | 6/2003 | Yang et al. | 438/681 |
| 2003/0124794 A1 | 7/2003 | Girardie | |
| 2003/0130127 A1 | 7/2003 | Hentges et al. | |
| 2003/0132491 A1 | 7/2003 | Ahn | |
| 2003/0139039 A1 | 7/2003 | Ahn et al. | |
| 2003/0142569 A1 | 7/2003 | Forbes | |
| 2003/0143801 A1 | 7/2003 | Basceri et al. | |
| 2003/0148577 A1 | 8/2003 | Merkulov et al. | |
| 2003/0152700 A1 | 8/2003 | Asmussen et al. | |
| 2003/0157764 A1 | 8/2003 | Ahn et al. | 438/212 |
| 2003/0159653 A1 | 8/2003 | Dando et al. | 118/715 |
| 2003/0161782 A1 | 8/2003 | Kim | |
| 2003/0162399 A1 | 8/2003 | Singh et al. | |
| 2003/0162587 A1 | 8/2003 | Tanamoto et al. | |
| 2003/0170389 A1 | 9/2003 | Sandru | 427/255.28 |
| 2003/0170403 A1 | 9/2003 | Doan et al. | 427/569 |
| 2003/0172872 A1 | 9/2003 | Thakur et al. | |
| 2003/0174529 A1 | 9/2003 | Forbes et al. | |
| 2003/0175411 A1 | 9/2003 | Kodas et al. | 427/58 |
| 2003/0176049 A1 | 9/2003 | Hegde et al. | |
| 2003/0181039 A1 | 9/2003 | Sandhu et al. | 438/685 |
| 2003/0181060 A1 | 9/2003 | Asai et al. | |
| 2003/0183156 A1 | 10/2003 | Dando et al. | 117/84 |
| 2003/0183306 A1 | 10/2003 | Hehmann et al. | |
| 2003/0183901 A1 | 10/2003 | Kanda et al. | |
| 2003/0185980 A1 | 10/2003 | Endo | |
| 2003/0185983 A1 | 10/2003 | Morfill et al. | |
| 2003/0193061 A1 | 10/2003 | Osten | |
| 2003/0194861 A1 | 10/2003 | Mardian et al. | 438/680 |
| 2003/0194862 A1 | 10/2003 | Mardian | 438/680 |
| 2003/0196513 A1 | 10/2003 | Phillips et al. | |
| 2003/0203626 A1 | 10/2003 | Derderian et al. | 438/689 |
| 2003/0207032 A1 | 11/2003 | Ahn et al. | 427/255.34 |
| 2003/0207540 A1 | 11/2003 | Ahn et al. | 438/287 |
| 2003/0207564 A1 | 11/2003 | Ahn et al. | 438/638 |
| 2003/0207593 A1 | 11/2003 | Derderian et al. | 438/778 |
| 2003/0209324 A1 | 11/2003 | Fink | |
| 2003/0216038 A1 | 11/2003 | Madhukar et al. | |
| 2003/0222300 A1 | 12/2003 | Basceri et al. | 257/309 |
| 2003/0224600 A1 | 12/2003 | Cao et al. | 438/684 |
| 2003/0227033 A1 | 12/2003 | Ahn et al. | 257/213 |
| 2003/0228747 A1 | 12/2003 | Ahn et al. | 438/591 |
| 2003/0230479 A1 | 12/2003 | Sarkas et al. | |
| 2003/0231992 A1 | 12/2003 | Sarkas et al. | |
| 2003/0232511 A1 | 12/2003 | Metzner et al. | 438/785 |
| 2003/0234420 A1 | 12/2003 | Forbes | |
| 2003/0235064 A1 | 12/2003 | Batra et al. | |

| | | |
|---|---|---|
| 2003/0235066 A1 | 12/2003 | Forbes |
| 2003/0235076 A1 | 12/2003 | Forbes |
| 2003/0235961 A1 | 12/2003 | Metzner et al. |
| 2004/0004244 A1 | 1/2004 | Ahn et al. .................. 257/314 |
| 2004/0004245 A1 | 1/2004 | Forbes et al. ............... 237/315 |
| 2004/0004247 A1 | 1/2004 | Forbes et al. ............... 257/324 |
| 2004/0004859 A1 | 1/2004 | Forbes et al. .......... 365/185.05 |
| 2004/0005982 A1 | 1/2004 | Park et al. |
| 2004/0007171 A1 | 1/2004 | Ritala et al. |
| 2004/0009118 A1 | 1/2004 | Phillips et al. |
| 2004/0009679 A1 | 1/2004 | Yeo et al. |
| 2004/0012043 A1 | 1/2004 | Gealy et al. |
| 2004/0014060 A1 | 1/2004 | Hoheisel et al. |
| 2004/0016944 A1 | 1/2004 | Ahn et al. |
| 2004/0023461 A1 | 2/2004 | Ahn et al. |
| 2004/0028811 A1 | 2/2004 | Cho et al. |
| 2004/0033661 A1 | 2/2004 | Yeo et al. |
| 2004/0033681 A1 | 2/2004 | Ahn et al. .................. 438/591 |
| 2004/0033701 A1 | 2/2004 | Ahn et al. .................. 438/785 |
| 2004/0038525 A1 | 2/2004 | Meng et al. ................. 438/656 |
| 2004/0038554 A1 | 2/2004 | Ahn |
| 2004/0040494 A1 | 3/2004 | Vaartstra et al. |
| 2004/0042128 A1 | 3/2004 | Slaughter et al. |
| 2004/0043541 A1 | 3/2004 | Ahn |
| 2004/0043557 A1 | 3/2004 | Haukka et al. |
| 2004/0043559 A1 | 3/2004 | Srividya et al. |
| 2004/0043569 A1 | 3/2004 | Ahn |
| 2004/0043635 A1 | 3/2004 | Vaartstra |
| 2004/0045807 A1 | 3/2004 | Sarkas et al. |
| 2004/0046130 A1 | 3/2004 | Rao et al. |
| 2004/0051139 A1 | 3/2004 | Kanda et al. |
| 2004/0055892 A1 | 3/2004 | Oh et al. |
| 2004/0058385 A1 | 3/2004 | Abel et al. |
| 2004/0065171 A1 | 4/2004 | Hearley et al. |
| 2004/0065255 A1 | 4/2004 | Yang et al. .................. 118/715 |
| 2004/0066484 A1 | 4/2004 | Tokailin et al. |
| 2004/0075111 A1 | 4/2004 | Chidambarrao et al. |
| 2004/0086897 A1 | 5/2004 | Mirkin et al. |
| 2004/0087124 A1 | 5/2004 | Kubota et al. ............... 438/591 |
| 2004/0092073 A1 | 5/2004 | Cabral et al. |
| 2004/0099889 A1 | 5/2004 | Frank et al. ................. 257/288 |
| 2004/0102002 A1 | 5/2004 | Sandhu et al. |
| 2004/0104439 A1 | 6/2004 | Haukka et al. |
| 2004/0107906 A1 | 6/2004 | Collins et al. |
| 2004/0110347 A1 | 6/2004 | Yamashita |
| 2004/0110348 A1 | 6/2004 | Ahn et al. |
| 2004/0110391 A1 | 6/2004 | Ahn et al. |
| 2004/0126649 A1 | 7/2004 | Chen et al. |
| 2004/0127001 A1 | 7/2004 | Colburn et al. |
| 2004/0130951 A1 | 7/2004 | Forbes |
| 2004/0131795 A1 | 7/2004 | Kuo et al. |
| 2004/0131865 A1 | 7/2004 | Kim et al. |
| 2004/0134365 A1 | 7/2004 | Mori |
| 2004/0135186 A1 | 7/2004 | Yamamoto |
| 2004/0135951 A1 | 7/2004 | Stumbo et al. |
| 2004/0135997 A1 | 7/2004 | Chan et al. |
| 2004/0144980 A1 | 7/2004 | Ahn et al. |
| 2004/0145001 A1 | 7/2004 | Kanda et al. |
| 2004/0147098 A1 | 7/2004 | Mazen et al. |
| 2004/0149759 A1 | 8/2004 | Moser et al. |
| 2004/0156578 A1 | 8/2004 | Geusic et al. |
| 2004/0158028 A1 | 8/2004 | Buhler |
| 2004/0159863 A1 | 8/2004 | Eldridge et al. |
| 2004/0161899 A1 | 8/2004 | Luo et al. |
| 2004/0164357 A1 | 8/2004 | Ahn et al. |
| 2004/0164365 A1 | 8/2004 | Ahn et al. |
| 2004/0165412 A1 | 8/2004 | Forbes |
| 2004/0168627 A1 | 9/2004 | Conley, Jr. et al. |
| 2004/0169453 A1 | 9/2004 | Ahn et al. |
| 2004/0171280 A1 | 9/2004 | Conley, Jr. et al. |
| 2004/0175882 A1 | 9/2004 | Ahn et al. |
| 2004/0178439 A1 | 9/2004 | Ahn et al. |
| 2004/0183108 A1 | 9/2004 | Ahn |
| 2004/0185654 A1 | 9/2004 | Ahn |
| 2004/0189175 A1 | 9/2004 | Ahn et al. |
| 2004/0196620 A1 | 10/2004 | Knudsen et al. |
| 2004/0198069 A1 | 10/2004 | Metzner et al. |
| 2004/0202032 A1 | 10/2004 | Forbes |
| 2004/0203254 A1 | 10/2004 | Conley, Jr. et al. |
| 2004/0206957 A1 | 10/2004 | Inoue et al. |
| 2004/0212426 A1 | 10/2004 | Beigel |
| 2004/0214399 A1 | 10/2004 | Ahn et al. |
| 2004/0217410 A1 | 11/2004 | Meng et al. |
| 2004/0219783 A1 | 11/2004 | Ahn et al. |
| 2004/0222476 A1 | 11/2004 | Ahn et al. |
| 2004/0224466 A1 | 11/2004 | Basceri et al. |
| 2004/0224467 A1 | 11/2004 | Basceri et al. |
| 2004/0224505 A1 | 11/2004 | Nguyen et al. |
| 2004/0224527 A1 | 11/2004 | Sarigiannis et al. |
| 2004/0229745 A1 | 11/2004 | Miyauchi et al. |
| 2004/0233010 A1 | 11/2004 | Akram et al. |
| 2004/0235313 A1 | 11/2004 | Frank et al. |
| 2004/0245085 A1 | 12/2004 | Srinivasan |
| 2004/0248398 A1 | 12/2004 | Ahn et al. |
| 2004/0251815 A1 | 12/2004 | Tokailin et al. |
| 2004/0251841 A1 | 12/2004 | Negishi et al. |
| 2004/0258192 A1 | 12/2004 | Angeliu et al. |
| 2004/0262700 A1 | 12/2004 | Ahn et al. |
| 2004/0264236 A1 | 12/2004 | Chae et al. |
| 2004/0266107 A1 | 12/2004 | Chindalore et al. |
| 2004/0266117 A1 | 12/2004 | Hwang |
| 2004/0266217 A1 | 12/2004 | Kim et al. |
| 2005/0006727 A1 | 1/2005 | Forbes et al. |
| 2005/0007820 A1 | 1/2005 | Chindalore et al. |
| 2005/0009335 A1 | 1/2005 | Dean et al. |
| 2005/0009370 A1 | 1/2005 | Ahn |
| 2005/0011748 A1 | 1/2005 | Beck et al. |
| 2005/0019365 A1 | 1/2005 | Frauchiger et al. |
| 2005/0019836 A1 | 1/2005 | Vogel et al. |
| 2005/0020017 A1 | 1/2005 | Ahn et al. |
| 2005/0023574 A1 | 2/2005 | Forbes et al. |
| 2005/0023578 A1 | 2/2005 | Bhattacharyya |
| 2005/0023594 A1 | 2/2005 | Ahn et al. |
| 2005/0023595 A1 | 2/2005 | Forbes et al. |
| 2005/0023602 A1 | 2/2005 | Forbes et al. |
| 2005/0023603 A1 | 2/2005 | Eldridge et al. |
| 2005/0023613 A1 | 2/2005 | Bhattacharyya |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0023627 A1 | 2/2005 | Ahn et al. |
| 2005/0023664 A1 | 2/2005 | Chudzik et al. |
| 2005/0024092 A1 | 2/2005 | Forbes |
| 2005/0026349 A1 | 2/2005 | Forbes et al. |
| 2005/0026360 A1 | 2/2005 | Geusic et al. |
| 2005/0026374 A1 | 2/2005 | Ahn et al. |
| 2005/0026375 A1 | 2/2005 | Forbes |
| 2005/0026458 A1 | 2/2005 | Basceri et al. |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0030803 A1 | 2/2005 | Forbes et al. |
| 2005/0030825 A1 | 2/2005 | Ahn |
| 2005/0031785 A1 | 2/2005 | Carlisle et al. |
| 2005/0032292 A1 | 2/2005 | Ahn et al. |
| 2005/0032299 A1 | 2/2005 | Basceri et al. |
| 2005/0032342 A1 | 2/2005 | Forbes et al. |
| 2005/0034662 A1 | 2/2005 | Ahn |
| 2005/0035430 A1 | 2/2005 | Beigel |
| 2005/0036370 A1 | 2/2005 | Forbes |
| 2005/0037374 A1 | 2/2005 | Melker et al. |
| 2005/0037563 A1 | 2/2005 | Ahn |
| 2005/0040034 A1 | 2/2005 | Landgraf et al. |
| 2005/0041455 A1 | 2/2005 | Beigel et al. |
| 2005/0041503 A1 | 2/2005 | Chindalore et al. |
| 2005/0048414 A1 | 3/2005 | Harnack et al. |

| | | | | | | |
|---|---|---|---|---|---|---|
| 2005/0048570 A1 | 3/2005 | Weber et al. | | 2006/0257563 A1 | 11/2006 | Doh et al. |
| 2005/0048796 A1 | 3/2005 | Numasawa et al. | | 2006/0261397 A1 | 11/2006 | Ahn et al. |
| 2005/0051824 A1 | 3/2005 | Iizuka et al. | | 2006/0263972 A1 | 11/2006 | Ahn et al. |
| 2005/0051828 A1 | 3/2005 | Park et al. | | 2006/0264064 A1 | 11/2006 | Ahn et al. |
| 2005/0053826 A1 | 3/2005 | Wang et al. | | 2006/0264066 A1 | 11/2006 | Bartholomew et al. |
| 2005/0054165 A1 | 3/2005 | Ahn et al. | | 2006/0267113 A1 | 11/2006 | Tobin et al. |
| 2005/0061785 A1 | 3/2005 | Schroder et al. | | 2006/0270147 A1 | 11/2006 | Ahn et al. |
| 2005/0064185 A1 | 3/2005 | Buretea et al. | | 2006/0281330 A1 | 12/2006 | Ahn et al. |
| 2005/0070098 A1 | 3/2005 | Bruley | | 2006/0284246 A1 | 12/2006 | Forbes et al. |
| 2005/0070126 A1 | 3/2005 | Senzaki | | 2007/0007560 A1 | 1/2007 | Forbes et al. |
| 2005/0077519 A1 | 4/2005 | Ahn et al. | | 2007/0007635 A1 | 1/2007 | Forbes et al. |
| 2005/0085151 A1 | 4/2005 | Tokailin et al. | | 2007/0010060 A1 | 1/2007 | Forbes et al. |
| 2005/0087134 A1 | 4/2005 | Ahn | | 2007/0010061 A1 | 1/2007 | Forbes et al. |
| 2005/0112874 A1 | 5/2005 | Skarp et al. | | 2007/0018214 A1 | 1/2007 | Ahn |
| 2005/0118807 A1 | 6/2005 | Kim et al. | | 2007/0018342 A1 | 1/2007 | Sandhu et al. |
| 2005/0124109 A1 | 6/2005 | Quevado-Lopez et al. | | 2007/0020835 A1 | 1/2007 | Ahn et al. |
| 2005/0124174 A1 | 6/2005 | Ahn et al. | | 2007/0037415 A1 | 2/2007 | Ahn et al. |
| 2005/0124175 A1 | 6/2005 | Ahn et al. | | 2007/0045676 A1 | 3/2007 | Forbes et al. |
| 2005/0138262 A1 | 6/2005 | Forbes | | 2007/0045752 A1 | 3/2007 | Forbes et al. |
| 2005/0140462 A1 | 6/2005 | Akram et al. | | 2007/0046402 A1 | 3/2007 | Mukaiyama et al. |
| 2005/0145957 A1 | 7/2005 | Ahn et al. | | 2007/0047319 A1 | 3/2007 | Bhattacharyya |
| 2005/0145959 A1 | 7/2005 | Forbes | | 2007/0048926 A1 | 3/2007 | Ahn |
| 2005/0151261 A1 | 7/2005 | Kellar et al. | | 2007/0048953 A1 | 3/2007 | Gealy et al. |
| 2005/0158973 A1 | 7/2005 | Ahn et al. | | 2007/0048989 A1 | 3/2007 | Ahn et al. |
| 2005/0164521 A1 | 7/2005 | Ahn et al. | | 2007/0049023 A1 | 3/2007 | Ahn et al. |
| 2005/0218462 A1 | 10/2005 | Ahn et al. | | 2007/0049051 A1 | 3/2007 | Ahn et al. |
| 2005/0227442 A1 | 10/2005 | Ahn et al. | | 2007/0049054 A1 | 3/2007 | Ahn et al. |
| 2005/0266700 A1 | 12/2005 | Jursich et al. | | 2007/0059881 A1 | 3/2007 | Ahn et al. |
| 2005/0277256 A1 | 12/2005 | Ahn et al. | | 2007/0087563 A1 | 4/2007 | Ahn et al. |
| 2005/0280067 A1 | 12/2005 | Ahn et al. | | 2007/0090439 A1 | 4/2007 | Ahn et al. |
| 2005/0285225 A1 | 12/2005 | Ahn et al. | | 2007/0090440 A1 | 4/2007 | Ahn et al. |
| 2005/0285226 A1 | 12/2005 | Lee | | 2007/0090441 A1 | 4/2007 | Ahn et al. |
| 2006/0000412 A1 | 1/2006 | Ahn et al. | | 2007/0092989 A1 | 4/2007 | Kraus et al. |
| 2006/0001151 A1 | 1/2006 | Ahn et al. | | 2007/0101929 A1 | 5/2007 | Ahn et al. |
| 2006/0003517 A1 | 1/2006 | Ahn et al. | | 2007/0134931 A1 | 6/2007 | Ahn et al. |
| 2006/0019033 A1 | 1/2006 | Muthukrishnan et al. | | 2007/0134942 A1 | 6/2007 | Ahn et al. |
| 2006/0019501 A1 | 1/2006 | Jin et al. | | 2007/0141784 A1 | 6/2007 | Wager et al. |
| 2006/0023513 A1 | 2/2006 | Forbes et al. | | 2007/0141832 A1 | 6/2007 | Farrar |
| 2006/0024975 A1 | 2/2006 | Ahn et al. | | 2007/0151861 A1 | 7/2007 | Xi et al. |
| 2006/0028867 A1 | 2/2006 | Forbes et al. | | 2007/0158765 A1 | 7/2007 | Ahn et al. |
| 2006/0028869 A1 | 2/2006 | Forbes et al. | | 2007/0181931 A1 | 8/2007 | Ahn et al. |
| 2006/0035405 A1 | 2/2006 | Park et al. | | 2007/0187772 A1 | 8/2007 | Ahn et al. |
| 2006/0043492 A1 | 3/2006 | Ahn et al. | | 2007/0187831 A1 | 8/2007 | Ahn et al. |
| 2006/0043504 A1 | 3/2006 | Ahn et al. | | 2007/0234949 A1 | 10/2007 | Ahn et al. |
| 2006/0046383 A1 | 3/2006 | Chen et al. | | 2008/0014689 A1 | 1/2008 | Cleavelin et al. |
| 2006/0046384 A1 | 3/2006 | Joo et al. | | 2008/0029790 A1 | 2/2008 | Ahn et al. |
| 2006/0046505 A1 | 3/2006 | Ahn et al. | | 2008/0032424 A1 | 2/2008 | Ahn et al. |
| 2006/0046522 A1 | 3/2006 | Ahn et al. | | 2008/0042211 A1 | 2/2008 | Bhattacharyya et al. |
| 2006/0054943 A1 | 3/2006 | Li et al. | | 2008/0048225 A1 | 2/2008 | Ahn et al. |
| 2006/0063318 A1 | 3/2006 | Datta et al. | | 2008/0057659 A1 | 3/2008 | Forbes et al. |
| 2006/0081895 A1 | 4/2006 | Lee et al. | | 2008/0057690 A1 | 3/2008 | Forbes et al. |
| 2006/0105523 A1 | 5/2006 | Afzali-Ardakani et al. | | 2008/0087890 A1 | 4/2008 | Ahn et al. |
| 2006/0118853 A1 | 6/2006 | Takata et al. | | 2008/0087945 A1 | 4/2008 | Forbes et al. |
| 2006/0125030 A1 | 6/2006 | Ahn et al. | | 2008/0121962 A1 | 5/2008 | Forbes et al. |
| 2006/0128168 A1 | 6/2006 | Ahn et al. | | 2008/0124907 A1 | 5/2008 | Forbes et al. |
| 2006/0148180 A1 | 7/2006 | Ahn et al. | | 2008/0124908 A1 | 5/2008 | Forbes et al. |
| 2006/0176645 A1 | 8/2006 | Ahn et al. | | 2008/0191350 A1 | 8/2008 | Ahn et al. |
| 2006/0177975 A1 | 8/2006 | Ahn et al. | | 2008/0191351 A1 | 8/2008 | Ahn et al. |
| 2006/0183272 A1 | 8/2006 | Ahn et al. | | 2008/0193791 A1 | 8/2008 | Ahn et al. |
| 2006/0189154 A1 | 8/2006 | Ahn et al. | | 2008/0194094 A1 | 8/2008 | Ahn et al. |
| 2006/0194438 A1 | 8/2006 | Rao et al. | | 2008/0217676 A1 | 9/2008 | Ahn et al. |
| 2006/0223337 A1 | 10/2006 | Ahn et al. | | 2008/0274625 A1 | 11/2008 | Ahn et al. |
| 2006/0228868 A1 | 10/2006 | Ahn et al. | | | | |
| 2006/0231889 A1 | 10/2006 | Chen et al. | | FOREIGN PATENT DOCUMENTS | | |
| 2006/0237764 A1 | 10/2006 | Ahn et al. | | | | |
| 2006/0237803 A1 | 10/2006 | Zhu et al. | | CN | 1375085 A | 10/2002 |
| 2006/0244082 A1 | 11/2006 | Ahn et al. | | EP | 0540993 A1 | 5/1993 |
| 2006/0244100 A1 | 11/2006 | Ahn et al. | | EP | 1096042 | 5/2001 |
| 2006/0245984 A1 | 11/2006 | Kulkarni et al. | | EP | 1122795 A2 | 8/2001 |
| 2006/0246741 A1 | 11/2006 | Ahn et al. | | EP | 1124262 | 8/2001 |
| 2006/0252202 A1 | 11/2006 | Dai et al. | | EP | 1324376 | 7/2003 |
| 2006/0252211 A1 | 11/2006 | Ahn et al. | | EP | 1324376 A1 | 7/2003 |
| 2006/0255470 A1 | 11/2006 | Ahn et al. | | EP | 1358678 | 11/2003 |

| | | |
|---|---|---|
| JP | 03-028162 | 2/1991 |
| JP | 03028162 | 2/1991 |
| JP | 06175506 | 6/1994 |
| JP | 07-320996 | 12/1995 |
| JP | 1996175506 | 7/1996 |
| JP | 09-293845 | 11/1997 |
| JP | 11-335849 | 12/1999 |
| JP | 2000-192241 | 7/2000 |
| JP | 01044420 | 2/2001 |
| WO | WO-200106370 | 1/2001 |
| WO | WO-01/97257 | 12/2001 |
| WO | WO-02/31875 | 4/2002 |
| WO | WO-0233729 A2 | 4/2002 |
| WO | WO-02/43115 | 5/2002 |
| WO | WO-03063250 A1 | 7/2003 |
| WO | WO-03083947 A2 | 10/2003 |
| WO | WO-2004079796 A3 | 9/2004 |
| WO | WO-2006026716 | 3/2006 |
| WO | WO-2006026716 A1 | 3/2006 |

OTHER PUBLICATIONS

Aarik, Jaan, et al., "Atomic layer growth of epitaxial TiO/sub2/thin films from TiCl/sub 4/ and H/sub 2/O on alpha -Al/sub 2/O/sub 3/ substrates", *Journal of Crystal Growth*, 242(1-2), (2002),189-198.

Aarik, Jaan, et al., "Influence of substrate temperature on atomic layer growth and properties of HfO/sub 2/ thin films", *Thin Solid Films*, 340(1-2), (1999),110-116.

Aarik, Jaan, et al., "Phase transformations in hafnium dioxide thin films grown by atomic layer doposition at high temperatures", *Applied Surface Science*, 173(1-2), (Mar. 2001),15-21.

Aarik, Jaan, et al., "Texture Development in nanocrystalline hafnium dioxide thin films grown by atomic layer deposition", *Journal of Crystal Growth*, 220, (2000),105-113.

Ahn, Kie Y., et al., "Highly Reliable Amorphous High-K Gate Oxide ZrO2", *Micron Docket No. 01-0516*, (May 17, 2001),3 pages.

Alen, Petra, "Atomic Layer deposition of Ta(Al)N(C) thin films using trimethylaluminum as a reducing agent", *Journal of the Electrochemical Society*, 148(10), (Oct. 2001),G566-G571.

Bendoraitis, J G., et al., "Optical energy gaps in the monoclinic oxides of hafnium and zirconium and their solid solutions", *Journal of Physical Chemistry*, 69(10), (1965),3666-3667.

Braud, F., "Ultra Thin Diffusion Barriers for Cu Interconnections at The Gigabit Generation and Beyond", *VMIC Conference Proceedings*, (1996),174-179.

Bright, A A., et al., "Low-rate plasma oxidation of Si in a dilute oxygen/helium plasma for low-temperature gate quality Si/Sio2 interfaces", *Applied Physics Letters*, 58(6), (Feb. 1991),619-621.

Bunshah, Rointan F., et al., "Deposition Technologies for Films and Coatings: Developments and Applications", Park Ridge, N.J., U.S.A. : *Noyes Publications*,(1982), 102-103.

Callegari, A., et al., "Physical and electrical characterizations of Hafnium oxide and Hafnium silicate sputtered films", *Journal of Applied Physics*, 90(12), (Dec. 15, 2001),6466-75.

Cava, R J., "Improved of the dielectric properties of Ta/sub 2/O/sub 5/ through substitution with Al/sub 2/O/sub 3/", *Applied Physics Letters*, 70(11), (Mar. 1997),1396-8.

Chang, Hyo S., et al., "Excellent thermal stability of Al2O3/ZrO2/Al2O3 stack structure of metal-oxide-semiconductor gate dielectrics application", *Applied Physics Letters*, 80(18), (May 6, 2002),3385-7.

Chen, P. J., et al., "Thermal stability ans scalability of Zr-aluminate-based high-k gate stacks", *Symposium on VLSI Technology Digest*, (2002),192-3.

Cheng, Baohong, et al., "The Impact of High-k Gate Dielectrics and Metal Gate Electrodes on Sub-100nm MOSFET's", *IEEE Transactions on Electron Devices*, 46(7), (Jul. 1999),1537-1544.

Clark, P , "IMEC Highlights Hafnium, Metal Gates for High-k Integration", *Semiconductor Business News*, at Silicon Strategies. com,(Oct. 11, 2002),2 pages.

Colombo, D., et al., "Anhydrous Metal Nitrates as Volatile Single Source Precursors for the CVD of Metal Oxide Films", *Communications, Department of EE, U of M, Mpls, MN*, (Jul. 7, 1998),3 pages.

Conley, Jr., J. F., et al., "Atomic Layer Deposition of Hafnium Oxide Using Anhydrous Hafnium Nitrate", *Electrochemical and Solid-State Lett.*, 5,(5), (2002),C57-C59.

Copel, M., "Structure and stability of ultrathin zirconium oxide layers on Si(001)", *Applied Physics Letters*, 76(4), (Jan. 2000),436-438.

Da Rosa, E B., et al., "Annealing of ZrAl/sub x/O/sub y/ ultrathin films on Si in a vacuum or in O/sub 2/", *Journal of the Electrochemical Society*, 148 (12), (Dec. 2001),G695-G703.

De Flaviis, Franco , et al., "Planar microwave integrated phase-shifter design with high purity ferroelectric material", *IEEE Transactions on Microwave Theory & Techniques*, 45(6), (Jun. 1997),963-969.

Desu, S B., "Minimization of Fatigue in Ferroelectric Films", *Physica Status Solidi A*, 151(2), (1995),467-480.

Ding, "Copper Barrier, Seed Layer and Planerization Technologies", *VMIC Conference Proceedings*, (1997),87-92.

Dusco, C , et al., "Deposition of tin oxide into porous silicon by atomic layer epitaxy", *Journal of the Electrochemical Society*, 143, (1996),683-687.

El-Kareh, B , et al., "The evolution of DRAM cell technology", *Solid State Technology*, 40(5), (1997),89-90, 92, 95-6, 98, 100-1.

Engelhardt, M. , "Modern Applications of Plasma Etching and Patterning in Silicon Process Technology", *Contributions to Plasma Physics*, 39(5), (1999),473-478.

Fong, Y. , "Oxides Grown on Textured Single-Crystal Silicon—Dependence on Process and Application in EEPROMs", *IEEE Transactions on Electron Devices*, 37(3), (Mar. 1990),pp. 583-590.

Forsgren, Katarina , "Atomic Layer Deposition of HfO2 using hafnium iodide", *Conference held in Monterey, California*, (May 2001), 1 page.

Fuyuki, Takashi, et al., "Electronic Properties of the Interface between Si and TiO2 Deposited at Very Low Temperatures", *Japanese Journal of Applied Physics*, 25(9), (Sep. 1986),1288-1291.

Fuyuki, Takashi, et al., "Initial stage of ultra-thin SiO/sub 2/formation at low temperatures using activated oxygen", *Applied Surface Science*, 117-118, (Jun. 1997),123-126.

Gartner, M , et al., "Spectroellipsometric characterization of lanthanide-doped TiO2 films obtained via the sol-gel technique", *Thin Solid Films*, 234(1-2), (1993),561-565.

Gasser, Werner, et al., "Quasi-monolayer deposition of silicon dioxide", *Thin Solid Films*, 250(1-2), (1994),213-218.

Geller, S. , et al., "Crystallographic Studies of Perovskite-like Compounds. II. Rare Earth Aluminates", *Acta Cryst.*, 9, (May 1956),1019-1025.

Geusic, J., et al., "Structured Silicon Surfaces and Tunnel Oxides for Flash Memory Devices", *Micron Disclosure*, (Sep. 25, 1997).

Giess, E. A., et al., "Lanthanide gallate perovskite-type substrates for epitaxial, high-T/sub c/superconducting Ba/sub 2/YCu/sub 3/O/sub 7-delta/films", *IBM Journal of Research and Development*, 34(6), (Nov. 1990),916-926.

Guo, Xin, et al., "High quality ultra-thin (1.5 nm) TiO2-Si3N 4 gate dielectric for deep sub-micron CMOS technology", *IEDM Technical Digest, International Electron Devices Meeting*, Ctied in related application,(Dec. 5-8, 1999),137-140.

Gusev, E P., et al., "Ultrathin High-K Dielectrics Grown by Atomic Layer Deposition: A Comparative Study of ZrO2, HfO2, Y2O3 and Al2O3", *Electrochemical Society Proceedings vol. 2001-9*, (2001),189-195.

Gutowski, M J., "Thermodynamic stability of high-K dielectric metal oxides ZrO/sub 2/ and HfO/sub 2/ in contact with Si and SiO/sub 2/", *Applied Physics Letters*, 80(11), (Mar. 18, 2002),1897-1899.

Hao, M. Y., "Electrical Characteristics of Oxynitrides Grown on Textured Single-Crystal Silicon", *Appl. Phys. Lett.*, 60, (Jan. 1992),445-447.

Hirayama, Masaki, et al., "Low-Temperature Growth of High-Integrity Silicon Oxide Films by Oxygen Radical Generated in High Density Krypton Plasma", *International Electron Devices Meeting 1999, Technical Digest*, (1999),249-252.

Hubbard, K. J., "Thermodynamic stability of binary oxides in contact with silicon", *Journal of Materials Research*, 11(11), (Nov. 1996),2757-2776.

Hunt, C. E., et al., "Direct bonding of micromachined silicon wafers for laser diode heat exchanger applications", *Journal of Micromechanics and Microengineering*, 1(3), (Sep. 1991),152-156.

Iddles, D M., et al., "Relationships between dopants, microstructure and the microwave dielectric properties of ZrO2-TiO2-SnO2 ceramics", *Journal of Materials Science*, 27(23), (Dec. 1992),6303-6310.

Iijima, T. , "Microstructure and Electrical Properties of Amorphous W-Si-N Barrier Layer for Cu Interconnections", *1996 VMIC Conference*, (1996),168-173.

Jeon, Sanghun, et al., "Excellent electrical characteristics of lanthanide (Pr, Nd, Sm, Gd, and Dy) oxide and lanthanide-doped oxide for MOS gate dielectric applications", *Electron Devices Meeting, 2001, IEDM Technical Digest. International*, (2001),471-474.

Jeon, Sanghun, et al., "Ultrathin nitrided-nanolaminate (AI203/ZrO2/AI203) for metal?oxide?semiconductor gate dielectric applications", *Journal of Vacuum Science & Technology B: Microelectronics and Nanometer Structures*, 20(3), (May 2002),1143-5.

Jeong, Chang-Wook, et al., "Plasma-Assisted Atomic layer Growth of High-Quality Aluminum Oxide Thin Films", *Japanese Journal of Applied Physics*, 40, (Jan. 2001),285-289.

Kawai, Y , et al., "Ultra-low-temperature growth of high-integrity gate oxide films by low-energy Ion-assisted oxidation", *Applied Physics Letters*, 64(17), (Apr. 1994),2223-2225.

Keomany, D. , et al., "Sol gel preparaton of mixed cerium-titanium oxide thin films", *Solar Energy Materials and Solar Cells*, 33(4), (Aug. 1994),429-441.

Kim, C T., et al., "Application of AI203 Grown by Atomic Layer Deposition to DRAM and FeRAM" *International Symposium in Integrated Ferroelectrics*, (Mar. 2000),316.

Kim, D., et al. , "Atomic Control of Substrate Termination and Heteroepitaxial Growth of SrTiO3/LaAI03 Films", *Journal of the Korean Physical Society*, 36(6), (Jun. 2000),444-448.

Kim, Byoung-Youp , et al., "Comparison study for TiN films deposited from different method: chemical vapor deposition and atomic layer deposition", *Mechanisms of Surface and Microstructure Evolution in Deposited Films and Film Structures Symposium (Materials Research Society Symposium Proceedings vol. 672)*, (2001),7.8.1-7.8.6.

Kim, Taeseok , et al., "Correlation between strain and dielectric properties in ZrTiO/sub 4/ thin films", *Applied Physics Letters*, 76(21), (May 2000),3043-3045.

Kim, Taeseok, et al., "Dielectric properties and strain analysis in paraelectric ZrTiO/sub 4/ thin films deposited by DC magnetron sputtering", *Japenese Journal of Applied Physics Part 1-Regular Papers Short Notes & Review Papers*, 39(7A), (2000),4153-4157.

Kim, Yongjo , et al., "Effect of microstructures on the microwave dielectric properties of ZrTiO/sub 4/ thin films", *Applied Physics Letters*, 78(16), (Apr. 16, 2001),2363-2365.

Kim, Y. et al., "Substrate dependence on the optical properties of Al/sub 2/O/sub 3/ films grown by atomic layer deposition", *Applied Physics Letters*, 71(25, 22 ), (Dec. 1997),3604-3606.

Klaus, J W., et al., "Atomic Layer Controlled Growth of SiO2 Films Using Binary Reaction Sequence Chemistry", *Applied Physics Letters*, 70(9), (Mar. 3, 1997),1092-94.

Krauter, G. , et al., "Room Temperature Silicon Wafer Bonding with Ultra-Thin Polymer Films", *Advanced Materials*, 9(5), (1997),417-420.

Kukli, Kaupo, "Atomic Layer Deposition of Titanium Oxide from TiI4 and H202", *Chemical Vapor Deposition*, 6(6), (2000), 303-310.

Kukli, K , et al., "Comparison of hafnium oxide films grown by atomic layer deposition from iodide and chloride precursors", *Thin Solid Films*, 416, (2002),72-79.

Kukli, K , et al., "Controlled growth of yttrium oxysulphide thin films by atomic layer deposition", *Materials Science Forum*, 315-317, (1999),216-221.

Kukli, Kaupo , "Dielectric Properties of Zirconium Oxide Grown by Atomic Layer Deposition from Iodide Precursor", *Journal of The Electrochemical Society*, 148(12), (2001),F227-F232.

Kukli, Kaupo , et al., "Influence of thickness and growth temperature on the properties of zirconium oxide films growth by atomic layer deposition on silion", *Thin Solid Films*, 410(1-2), (2002),53-60.

Kukli, Kaupo , et al., "Low-Temperature Deposition of Zirconium Oxide-Based Nanocrystalline Films by Alternate Supply of Zr[OC(CH3)3]4 and H2O", *Chemical Vapor Deposition*, 6(6), (2000),297-302.

Kukli, K J., et al., "Properties of hafnium oxide films grown by atomic layer deposition from hafnium tetraiodide and oxygen", *Journal of Applied Physics*, 92(10), (Nov. 15, 2002),5698-5703.

Laursen, T. , "Encapsulation of Copper by Nitridation of Cu-Ti Alloy/Bilayer Structures", *International Conference on Metallurgical Coatings and Thin Films*, Abstract No. H1.03, San Diego, CA, (Apr. 1997),309.

Lee, A E., et al., "Epitaxially grown sputtered LaAIO3 films", *Applied Physics Letters*, 57(19), (Nov. 1990),2019-2021.

Lee, S. J., et al., "Hafnium oxide gate stack prepared by in situ rapid thermal chemical vapor deposition process for advanced gate dielectrics" *Journal of Applied Physics*, 92 (5), (Sep. 1, 2002),2807-09.

Lee, Cheng-Chung, et al., "Ion-assisted deposition of silver films", *Thin Solid Films*, vol. 359, (2000),95-97.

Lee, Dong H., et al., "Metalorganic chemical vapor deposition of TiO/sub 2/:N anatase thin films on Si substrate", *Applied Physics Letters*, 66(7), (Feb. 1995),815-816.

Lee, L P., et al., "Monolithic 77 K dc SQUID magnetometer", *Applied Physics Letters*, 59(23), (Dec. 1991),3051-3053.

Lee, C. H., et al., "MOS Characteristics of Ultra Thin Rapid Thermal CVD ZrO2 and Zr Silicate Gate Dielectrics", *Electron Devices Meeting, 2000. IEDM Technical Digest. International*, (2000),27-30.

Lee, C H., et al., "MOS Device with High Quality Ultra Thin CVD ZrO2 Gate Dielectrics and Self-Aligned TaN and TaN/Poly-Si Gate electrodes", *2001 Symposium on VLSI, Technology Digest of Technical Papers*, (2001),137-138.

Lee, et al., "Ultrathin Hafnium Oxide with Low Leakage and excellent Reliability fo rAlternative Gae Dielecric Application", *IEEE Technical Digest of International Electron Devices Meeting 1999*, (1999),133-136.

Lee, Byoung H., et al., "Ultrathin Hafnium Oxide with Low Leakage and Excellent Reliability for Alternative Gate Dielectric Application", *Technical Digest of IEDM*, (1999),133-136.

Leskela, M. , et al., "ALD precursor chemistry: Evolution and future challenges", *J. Phys. IV France*, 9, (1999),837-852.

Liu, C. T., "Circuit Requirement and Integration Challenges of Thin Gate Dielectrics for Ultra Small MOSFETs", *International Electron Devices Meeting 1998. Technical Digest*, (1998),747-750.

Liu, Y C., et al., "Growth of ultrathin SiO/sub 2/ on Si by surface irradiation with an O/sub 2/+Ar electron cyclotron resonance microwave plasma at low temperatures", *Journal of Applied Physics*, 85(3), (Feb. 1999),1911-1915.

Luan, et al., "High Quality Ta2O5 Gate Dielectrics and T[. . . ]", *IEEE Technical Digest of Int. Elec. Digest Mtng 1999*, (1999),141-142.

Lucovsky, G , et al., "Microscopic model for enhanced dielectric constants in low concentration SiO/sub 2/-rich noncrystalline Zr and Hf silicate alloys", *Applied Physics Letters*, 77(18), (Oct. 2000),2912-2914.

Luo, Z J., et al., "Ultra-thin ZrO2 (or Silicate) with High Thermal Stability for CMOS GAte Applications", *2001 Symposium on VLSI Technology Digest of Technical Papers*, (2001),135-136.

Martin, P J., et al., "Ion-beam-assisted deposition of thin films", *Applied Optics*, 22(1), (Jan. 1983),178-184.

Molodyk, A A., et al., "Volatile Surfactant-Assisted MOCVD: Application to LaAl03 Thin Film Growth", *Chemical Vapor Deposition*, 6(3), (Jun. 2000),133-138.

Molsa, Heini, et al., "Growth of yttrium oxide thin films from beta-diketonate precursor", *Advanced Materials for Optics and Electronics*, 4(6), (Nov.-Dec. 1994),389-400.

Muller, D. A., "The electronic structure at the atomic scale of ultrathin gate oxides", *Nature*, 399(6738), (Jun. 24, 1999),758-61.

Nakagawara, Osamu , et al., "Electrical properties of (Zr, Sn)TiO4 dielectric thin film prepared by pulsed laser deposition", *Journal of Applied Physics*, 80(1), (Jul. 1996), 388-392.

Nakajima, Anri, et al., "Atomic-layer deposition of ZrO/sub 2/with a Si nitride barrier layer", *Applied Physics Letters*, 81(15), (Oct. 2002),2824-2826.

Nakajima, Anri, et al., "NH/sub 3/-annealed atomic-layer-deposited silicon nitride as a high-k gate dielectric with high reliability", *Applied Physics Letters*, 80(7), (Feb. 2002),1252-1254.

Nakajima, Anri, "Soft breakdown free atomic-layer-deposited silicon-nitride/SiO/sub 2/ stack gate dielectrics", *International Electron Devices Meeting. Technical Digest*, (2001),6.5.1-4.

Neumayer, D A., et al., "Materials characterization of ZrO/sub 2/-SiO/sub 2/ and HfO/sub 2/-SiO/sub 2/ binary oxides deposited by chemical solution deposition", *Journal of Applied Physics*, 90(4), (Aug. 15, 2001),1801-1808.

Nieminen, Minna, et al., "Formation and stability of lanthanum oxide thin films deposited from B-diketonate precursor", *Applied Surface Science*, 174(2), (Apr. 16, 2001),155-165.

Niilisk, A , "Atomic-scale optical monitoring of the initial growth of TiO2 thin films", *Proceedings of the SPIE—The International Society for Optical Engineering*, 4318, (2001),72-77.

None Identified, "Improved Metallurgy for Wiring Very Large Scale Integrated Circuits", *International Technology Disclosures*, vol. 4, No. 9, (1986),p. 2.

Oates, D E., et al., "Surface impedance measurements of YBa/sub 2/Cu/sub 3/O/sub 7-x/ thin films in stripline resonators", *IEEE Transactions on Magnetics*, vol. 27, No. 2, pt. 2, (Mar. 1991),867-871.

Ohring, Milton, "The Materials Science of Thin Films", *Boston: Academic Press*, (1992), 118, 121, 125.

Osten, H J., et al., "High-k Gate Dielectrics with Ultra-low Leakage Current Based on Praseodymium Oxide", *Technical Digest of IEDM*, (2000),653-656.

Ott, A W., et al., "Al3O3 Thin Film Growth on Si(100) Using Binary Reaction Sequence Chemistry", *Thin Solid Films*, vol. 292, (1997),135-44.

Pan, Tung M., et al., "High quality ultrathin CoTiO/sub 3/ high-k gate dielectrics", *Electrochemical and Solid-State Letters*, 3(9), (Sep. 2000),433-434.

Pan, Tung M., et al., "High-k cobalt-titanium oxide dielectrics formed by oxidation of sputtered Co/Ti or Ti/Co films", *Applied Physics Letters*, 78(10), (Mar. 5, 2001),1439-1441.

Park, Byung-Eun, et al., "Electrical properties of LaAlO3/Si and Sr0.8Bi2.2Ta2O9/LaAlO3/Si structures", *Applied Physics Letters*, 79(6), (Aug. 2001),806-808.

Park, Byoung K., et al., "Interfacial reaction between chemically vapor-deposited HfO2 thin films and a HF-cleaned Si substrate during film growth and postannealing", *Applied Physics Letters*, 80(13), (Apr. 1, 2002),2368-70.

Perkins, Charles M., et al., "Electrical and materials properties of ZrO2 gate dielectrics grown by atomic layer chemical vapor deposition", *Applied Physics Letters*, 78(16), (Apr. 2001),2357-2359.

Poveshchenko, V P., et al., "Investigation of the phas composition of films of zirconium, hafnium and yttrium oxides", *Soviet Journal of Optical Technology*, 51(5), (1984),277-279.

Qi, Wen-Jie, et al., "MOSCAP and MOSFET characteristics using ZrO2 gate dielectric deposited directly on Si", *Electron Devices Meeting, 1999. IEDM Technical Digest. International*, (1999), 145-148.

Qi, Wen-Jie , et al., "Performance of MOSFETs with ultra thin ZrO/sub 2/ and Zr silicate gate dielectrics", *2000 Symposium on VLSI Technology. Digest of Technical Papers*, (2000),40-41.

Rahtu, Antti, et al., "Atomic Layer Deposition of Zirconium Titanium Oxide from Titanium Isopropoxide and Zirconium Chloride", *Chemistry of Materials*, 13(5), (May 2001),1528-1532.

Ramakrishnan, E S., et al., "Dielectric properties of radio frequency magnetron sputter deposited zirconium titanate-based thin films", *Journal of the Electrochemical Society*, 145(1), (Jan. 1998),358-362.

Rayner Jr., G , et al., "The structure of plasma-deposited and annealed pseudo-binary ZrO2-SiO2 alloys", *Materials Research Society Symposium—Proceedings*, 611, (2000),C131-C139.

Ritala, Mikko , "Atomic Layer Epitaxy Growth of Titanium, Zirconium and Hafnium Dioxide Thin Films", *Annales Academiae Scientiarum Fennicae*, (1994),24-25.

Ritala, Mikko , et al., "Zirconium dioxide thin films deposited by ALE using zirconium tetrachloride as precursor", *Applied Surface Science*, 75, (Jan. 1994),333-340.

Robertson, J. , "Band offsets of wide-band-gap oxides and implications for future electronic devices", *Journal of Vacuum Science & Technology B (Microelectronics and Nanometer Structures)*, 18(3), (May-Jun. 2000),1785-1791.

Rossnagel, S M., S M., et al., "Plasma-enhanced atomic layer deposition of Ta and Ti for Interconnect diffusion barriers", *Journal of Vacuum Science & Technology B (Microelectronics and Nanometer Structures)*, 18(4), (Jul. 2000),2016-2020.

Rotondaro, A L., et al., "Advanced CMOS Transistors with a Novel HfSiON Gate Dielectric", *Symposium on VLSI Technology Digest of Technical Papers*, (2002),148-149.

Ryu, Changsup, "Barriers for Copper Interconnections", *Solid State Technology*, 42(4), (Apr. 1999),pp. 1-3.

Saito, Yuji, et al., "Advantage of Radical Oxidation for Improving Reliability of Ultra-Thin Gate Oxide", *2000 Symposium on VLSI Technology Digest of Technical Papers*, (2000),176-177.

Saito, Yuji, et al., "High-Integrity Silicon Oxide Grown at Low-Temperature by Atomic Oxygen Generated in High-Density Krypton Plasma", *Extended Abstracts of the 1999 International Conference on Solid State Devices and Materials*, (1999),152-153.

Semiconductor Industry Associati, "International Technology for Semiconductor Roadmap", http://public.itrs.net/Files/2001ITRS/Links/1999_SIA_Roadmap/, (1999).

Shanware, A , et al., "Reliability evaluation of HfSiON gate dielectric film with 12.8 A SiO2 equivalent thickness", *International Electron Devices Meeting. Technical Digest*, (2001),6.6.1-6.6.4.

Shin, Chang H., et al., "Fabrication and Characterization of MFISFET Using Al2O3 Insulating Layer for Non-volatile Memory", *12th International Symposium in Integrated Ferroelectrics*, (Mar. 2000),9 pages.

Smith, Ryan C., et al., "Chemical Vapour Deposition of the Oxides of Titanium, Zirconium and Hafnium for Use as High-k Materials in Microelectronic Devices. A Carbon-free Precursor for the Synthesis of Hafnium Dioxide", *Advanced Materials for Optics and Electronics*, 10(3-5), (Jun. 29, 2000),105-14.

Sneh, Ofer, "Thin film atomic layer deposition equipment for semiconductor processing", *Thin Solid Films*, 402(1-2), (Jan. 1, 2002),248-261.

Song, Hyun-Jung, et al., "Atomic Layer Deposition of Ta2O5 Films Using Ta(OC2H5)5 and NH3", *Ultrathin SiO/sub 2/ and High-K Materials for ULSI Gate Dielectrics. Symposium*, (1999),469-471.

Souche, D , et al., "Visible and infrared ellipsometry study of ion assisted SiO2 films", *Thin Solid Films*, 313-314, (1998),676-681.

Stathis, J. H., et al, "Reliability Projection for Ultra-Thin Oxides at Low Voltage", *Tech. Dig. International Electron Device Meeting*, (1998),167-9.

Suntola, T. , "Atomic Layer Epitaxy", *Handbook of Crystal Growth, 3; Thin Films of Epitaxy, Part B: Growth Mechanics and Dynamics*, Amsterdam,(1994),602-663.

Suntola, T , "Atomic layer eptiaxy", *Thin Solid Films*, 216(1), (Aug. 28, 1992),84-89.

Sze, S M., "Physics of Semiconductor Devices", *New York: Wiley*, (1981), 431.

Takemoto, J. H., et al., "Microstrip Resonators and Filters Using High-TC Superconducting Thin Films on LaAlO3", *IEEE Transaction on Magnetics*, 27(2), (Mar. 1991),2549-2552.

Tarre, A , et al., "Comparative study of low-temperature chloride atomic-layer chemical vapor deposition of TiO2 and SnO2", *Applied Surface Science*, 175-176, (May 2001),111-116.

Van Dover, R B., et al., "Amorphous lanthanide-doped TiOx dielectric films", *Applied Physics Letters*, 74(20), (May 1999),3041-3043.

Van Dover, Robert B., et al., "Deposition of Uniform Zr-Sn-Ti-O films by ON-Axis Reactive Sputtering", *IEEE Electron Device Letters*, 19(9), (Sep. 1998),329-331.

Van Dover, R. B., et al., "Discovery of a useful thin-film dielectric using a composition-spread approach", *Nature*, 392, (Mar. 12, 1998),162-164.

Viirola, H , "Controlled growth of antimony-doped tin dioxide thin films by atomic layer epitaxy", *Thin Solid Films*, 251, (Nov. 1994), 127-135.

Viirola, H , "Controlled growth of tin oxide thin films by atomic layer epitaxy", *Thin Solid Films*, 249(2), (Sep. 1994),144-149.

Visokay, M R., "Applications of HfSiON as a gate dielectric material", *Applied Physics Letters*, 80(17), (Apr. 2002),3183-3185.

Wang, P. W., "Excellent Emission Characteristics of Tunneling Oxides Formed Using Ultrathin Silicon Films for Flash Memory Devices", *Japanese Journal of Applied Physics*, 35, (Jun. 1996),3369-3373.

Wilk, G D., "Hafnium and zirconium silicates for advanced gate dielectrics", *Journal of Applied Physics*, 87(1), (Jan. 2000),484-492.

Wilk, G. D., "High-K gate dielectrics: Current status and materials properties considerations", *Journal of Applied Physics*, 89(10), (2001),5243-5275.

Wolf, Stanley, et al., "Silicon Processing for the VLSI Era—vol. I: Process Technology", *Second Edition, Lattice Press*, Sunset Beach, California,(2000),443.

Wolfram, G , et al., "Existence range, structural and dielectric properties of ZrxTiySnzO4 ceramics (x + y =2)", *Materials Research Bulletin*, 16(11), (Nov. 1981),1455-63.

Yamaguchi, Takeshi, "Band Diagram and Carrier Conduction Mechanism in ZrO2/Zr-silicates/Si MIS Structure Fabricated by Pulsed-laser-ablation Deposition", *Electron Devices Meeting, 2000. IEDM Technical Digest International*, (2000),19-22.

Yamaguchi, Takeshi, et al., "Study on Zr-Silicate Interfacial Layer of ZrO2-MIS Structure FAbricated by Pulsed Laser Ablation Deposition Method", *Solid State Devices and Materials*, (2000),228-229.

Yamamoto, K. , et al., "Effect of Hf metal predepositition on the properties of sputtered HfO/2/Hf stacked gate dielectrics", *Applied Physics Letters*, 81(11), (Sep. 9, 2002),2053-5.

Zhang, H. , "Atomic Layer Deposition of High Dielectric Constant Nanolaminates", *Journal of The Electrochemical Society*, 148(4), (Apr. 2001),F63-F66.

Zhang, H , "High permittivity thin film nanolaminates", *Journal of Applied Physics*, 87(4), (Feb. 2000),1921-1924.

Zhu, W , et al., "HfO2 and HfAlO for CMOS: Thermal Stability and Current Transport", *IEEE International Electron Device Meeting 2001*, (2001), 463-466.

Zucker, O , et al., "Application of Oxygen Plasma Processing to Silicon Direct Bonding", *Sensors and Actuators A*, 36, (1993),227-231.

Hoshino, Y. , et al., "Characterization and Control of the HfO2/Si(001) Interfaces", *Applied Physics Letters*, 81, (Sep. 30, 2002),2650-2652.

Chin, A. , et al., "High Quality La2O3 and Al2O3 Gate Dielectrics with Equivalent Oxide Thickness 5-10A", *Digest of Technical Papers, 2000 Symposium on VLSI Technology*, 2000, Honolulu, (Jun. 13-15, 2000),16-17.

Copel, M. , et al., "Formation of a stratified lanthanum silicate dielectric by reaction with Si(001)", *Applied Physics Letters*, 78(11), (Mar. 12, 2001),1607-1609.

Dimoulas, A. , et al., "Structural and electrical quality of the high-k dielectric Y2O3 on Si (001): Dependence on growth parameters", *Journal of Applied Physics*, 92(1), (Jul. 1, 2002),426-431.

Guha, S , et al., "Atomic beam deposition of lanthanum-and yttrium-based oxide thin films for gate dielectrics", *Applied Physics Letters*, 77, (2000),2710-2712.

Huang, C. H., et al., "La/sub 2/O/sub 3//Si/sub 0.3/Ge/sub 0.7/ p-MOSFETs with high hole mobility and good device characteristics", *IEEE Electron Device Letters*, 23(12), (Dec. 2002),710-712.

Iwai, H. , et al., "Advanced gate dielectric materials for sub-100 nm CMOS", *International Electron Devices Meeting, 2002. IEDM '02. Digest.*, (Dec. 8-11, 2002),625-628.

Kwo, J. , et al., "High gate dielectrics Gd2O3 and Y2O3 for silicon", *Applied Physics Letters*, 77(1), (Jul. 3, 2000),130-132.

Maria, J. P., et al., "High temperature stability in lanthanum and zirconia-based gate dielectrics", *Journal of Applied Physics*, 90(7), (Oct. 1, 2001),3476-3482.

Michaelson, Herbert B., "The work function of the elements and its periodicity", *Journal of Applied Physics*, 48(11), (Nov. 1977),4729-4733.

Shimizu, Takashi , et al., "Electrical Properties of Ruthenium/Metalorganic Chemical Vapor Deposited La-Oxide/Si Field Effect Transistors", *Jpn. J. Appl. Phys.*, vol. 42, Part 2, No. 11A, (2003),L1315-L1317.

Sneh, Ofer , et al., "Thin film atomic layer deposition equipment for semiconductor processing", *Thin Solid Films*, 402(1-2), (Jan. 2002),248-261.

Yamada, Hirotoshi , et al., "MOCVD of High-Dielectric-Constant Lanthanum Oxide Thin Films", *Journal of The Electrochemical Society*, 150(8), (Aug. 2003),G429-G435.

Zhong, Huicai , et al., "Electrical Properties of Ru and RuO2 Gate Electrodes for Si-PMOSFET with ZrO2 and Zr-Silicate Dielectrics", *Journal of Electronic Materials*, 30(12), (Dec. 2001),1493-1498.

Guha, S., et al., "High Temperature Stability of $Al_2O_3$ Dielectrics on Si: Interfacial Metal Diffusion and Mobility Degradation", *Applied Physics Letters*, 81(16), (2002), 2956-2958.

Ko, M.-G., et al., "High Density Plasma Enhanced Atomic Layer Deposition of Lanthanum Oxide for High-κ Gate Oxide Material", *207th Meeting of the Electrochemical Society*, (May 2005), 1 pg.

Tewg, J. Y., et al., "Electrical and Physical Characterization of Zirconium-Doped Tantalum Oxide Films", *Electrochemical Society Proceedings*, vol. 2002-28, (2002), 75-81.

Wilk, G. D., et al., "High-κ Gate Dielectrics: Current Status and Materials Properties Considerations", *Journal of Applied Physics*, 89(10), (May 2001), 5243-5275.

"Thin Solid Films, Elsevier Science", http://202.114.9.3/xueke/wldz/ak/thin.htm, (observed Jan. 4, 2006), 8 pgs.

Iwamoto, K. , et al., "Advanced Layer-By-Layer Deposition and Annealing Process For High-Quality High-K Dielectrics Formation", *Electrochemical Society Proceedings*, vol. 2003-14, (2003), 265-272.

Ritala, M., et al., "Atomic layer deposition of oxide thin films with metal alkoxides as oxygen sources", *Science*, 288(5464), (Apr. 14, 2000), 319-321.

Sneh, Ofer, "Thin Film Atomic Layer Deposition Equipment for Semiconductor Processing", *Thin Solid Films*, 402(1-2), (2002),248-261.

Nakajima, et al., "Atomic-layer-deposited silicon-nitride/SiO2 stacked gate dielectrics for highly reliable p-metal-oxide-semiconductor filed-effect transistors", *Applied Physics Letters*, vol. 77, (Oct. 2000),2855-2857.

"Praseodymium Oxide, $Pr_2O_3$ For Optical Coating", *Technical Publication by CERAC about Praseodymium Oxide*, http://www.cerac.com/pubs/proddata/Pr2O3.htm,(2005),1-2.

Aarik, Jaan, "Texture development in nanocrystalline hafnium dioxide thin films grown by atomic layer deposition", *Journal of Crystal Growth*, 220(1-2), (2000),105-113.

Abe, T, "Silicon Wafer-Bonding Process Technology for SOI Structures", *Extended Abstracts of the 22nd (1990 International) Conference on Solid State Devices and Materials*, (1990),853-856.

Adler, E., et al., "The Evolution of IBM CMOS Dram Technology", *IBM Journal of Reserarch & Development*, 39(1-2), (1995),167-188.

Ahn, Kie Y., "Ald of Amorphous Lanthanide Doped $T_iO_x$ Films", U.S. Appl. No. 11/092,072; filed Mar. 29, 2005.

Ahn, Kie Y., "Atomic Layer Deposited Hafnium Tantalum Oxide Dielectrics", U.S. Appl. No. 11/029,757; filed Jan. 5, 2005.

Ahn, Kie Y., "Atomic Layer Deposited Lanthanum Aluminum Oxide Dielectric Layer", U.S. Appl. No. 10/930,167; filed Aug. 31, 2004.

Ahn, Kie Y., "Atomic Layer Deposited Lanthanum Hafnium Oxide Dielectrics", U.S. Appl. No. 11/010,529; filed Dec. 13, 2004.

Ahn, Kie Y., "Atomic Layer Deposited Titanium Aluminum Oxide Films", U.S. Appl. No. 10/931,533; filed Aug. 31, 2004.

Ahn, Kie Y., "Atomic Layer Deposited Titanium Silicon Oxide Films", U.S. Appl. No. 11/093,104; filed Mar. 29, 2005.

Ahn, Kie Y., "Atomic Layer Deposited Zirconium Silicon Oxide Films", U.S. Appl. No. 11/117,121; filed Apr. 28, 2005.

Ahn, Kie Y., "Atomic Layer Deposition of a Ruthenium Layer to a Lanthanide Oxide Dielectric Layer", U.S. Appl. No. 11/117,125; filed Apr. 28, 2005.

Ahn, Kie Y., "Atomic Layer Deposition of $CeO_2/AL_2O_3$ Films as Gate Dielectrics", U.S. Appl. No. 11/055,380; filed Feb. 10, 2005.

Ahn, Kie Y., "Atomic Layer Deposition of Dy-Doped $HfO_2$ Films as Gate Dielectrics", U.S. Appl. No. 11/053,577; filed Feb. 8, 2005.

Ahn, Kie Y., "Atomic Layer Deposition of $Hf_3N_4/HfO_2$ Films as Gate Dielectrics", U.S. Appl. No. 11/063,717; filed Feb. 23, 2005.

Ahn, Kie Y., et al., "Atomic Layer Deposition of Zirconium-Doped Tantalum Oxide Films", U.S. Appl. No. 10/909,959; filed Aug. 2, 2004.

Ahn, Kie Y., "Atomic Layer Deposition of $Zr_3N_4/ZrO_2$ Films as Gate Dielectrics", U.S. Appl. No. 11/058,563; filed Feb. 15, 2005.

Ahn, Kie Y., "Hafnium Titanium Oxide Films", U.S. Appl. No. 11/140,643, filed May 27, 2005.

Ahn, Kie Y., "Hybrid Ald-CVD of $PrXOY/ZrO_2$ Films as Gate Dielectrics", U.S. Appl. No. 11/010,766; filed Dec. 13, 2004.

Ahn, Kie Y., "Ruthenium Gate for a Lanthanide Oxide Dielectric Layer", U.S. Appl. No. 10/926,812; filed Aug. 26, 2004.

Asai, S., "Technology Challenges for Integration Near and Below 0.1 micrometer", *Proceedings of the IEEE*, 85(4), Special Issue on Nanometer-Scale Science & Technology,(1997),505-520.

Auberton-Herve, A.J., "SOI: Materials to Systems", *Digest of the International Electron Device Meeting*, San Francisco,(1996),3-10.

Banerjee, S., "Applications of silicon-germanium-carbon in MOS and bipolar transistors", *Proceedings of the SPIE—The International Society for Optical Engineering*, 3212, (1997),118-128.

Banerjee, S. K., et al., "Characterization of Trench Transistors for 3-D Memories", *1986 Symposium on VLSI Technology, Digest of Technical Papers*, San Diego, CA,(1986),79-80.

Beensh-Marchwicka, G., et al., "Preparation of thermosensitive magnetron sputtered thin films", *Vacuum*, 53(1-2), (1999),47-52.

Bengtsson, Stefan, et al., "Interface charge control of directly bonded silicon structures" *J. Appl. Phys.*, 66(3), (1989),1231-1239.

Blalock, T. N., et al., "A High-Speed Sensing Scheme for 1T Dynamic RAM's Utilizing the Clamped Bit-Line Sense Amplifier", *IEEE Journal of Solid-State Circuits*, 27(4), (1992),pp. 618-624.

Bomchil, G., "Porous Silicon: The Material and its Application in Silicon-On-Insulator Technologies", *Applied Surface Science*, 41/42, (1989),604-613.

Burnett, D., "Implications of Fundamental Threshold Voltage Variations for High-Density SRAM and Logic Circuits", *1994 Symposium on VLSI Technology, Digest of Technical Papers*, Honolulu, HI,(1994),15-16.

Burnett, D., "Statistical Threshold-Voltage Variation and its Impact on Supply-Voltage Scaling", *Proceedings SPIE: Microelectronic Device and Multilevel Interconnection Technology*, 2636, (1995),83-90.

Cartagena, E, "Bonded Etchback Silicon on Sapphire Bipolar Junction Transistors", *Extended Abstracts—Electrochemical Society* (1), Program and Abstracts: 183rd Meeting of the Electrochemical Society, Pennington, NJ,(1993),1199-1200.

Chambers, J J., et al., "Physical and electrical characterization of ultrathin yttrium silicate insulators on silicon", *Journal of Applied Physics*, 90(2), (2001),918-33.

Chen, F., "A study of mixtures of $HfO_2$ and $TiO_2$ as high-k gate dielectrics", *Microelectronic Engineering* 72, (2004),263.

Chen, M. J., et al., "Back-Gate Forward Bias Method for Low-Voltage CMOS Digital Cicuits", *IEEE Transactions on Electron Devices*, 43, (1996),904-909.

Chen, M. J., et al., "Optimizing the Match in Weekly Inverted MOSFET's by Gated Lateral Bipolar Action", *IEEE Transactions on Electron Devices*, 43, (1996),766-773.

Chesler, R., et al., "Solid-State Ionic Lasers", *In: Laser Handbook, vol. 1*, Arecchi, F.T., et al., (eds.), North-Holland Publishing Company, Amsterdam,(1972),p. 353.

Chung, I. Y., et al., "A New SOI Inverter for Low Power Applications", *Proceedings of the 1996 IEEE International SOI Conference*, Sanibel Island, FL,(1996),20-21.

Clark-Phelps, R. B., et al., "Engineered Tantalum Aluminate and Hafnium Aluminate ALD Films for Ultrathin Dielectric Films with Improved Electric and Thermal Properties", *Gate Stack and Silicide Issues in Silicon Processing II. Symposium (Materials Research Society Symposium Proceedings vol. 670)*, (2001),K2.2.1-6.

Conley Jr., J F., et al., "Atomic Layer Deposition of Hafnium Oxide Using Anhydrous Hafnium Nitrate", *Electrochemical and Solid State Letters*, 5(5), (2002),C57-C59.

Dalal, Vikram L., et al., "Microcrystalline Germanium Carbide-A new material for PV conversion", *Presented at 2001 NCPV Program Review Meeting*, (2001),348-349.

De, V. K., "Random MOSFET Parameter Fluctuation Limits to Gigascale Integration (GSI)", *1996 Symposium on VLSI Technology, Digest of Technical Papers*, Honolulu, HI,(1996),198-199.

Denton, Jack P., et al., "Fully depleted dual-gated thin-film SOI P-MOSFETs fabricated in SOI islands with an isolated buried polysilicon backgate", *IEEE Electron Device Letters*, 17(11), (1996),509-511.

Forbes, L., et al., "Resonant Forward-Biased Guard-Ring Diodes for Suppression of Substrate Noise in Mixed-Mode CMOS Circuits", *Electronics Letters*, 31, (1995),720-721.

Foster, R., et al., "High Rate Low-Temperature Selective Tungsten", *In: Tungsten and Other Refractory Metals for VLSI Applications III*, V.A. Wells, ed., Materials Res. Soc., Pittsburgh, PA,(1988),69-72.

Fukumoto, Hirofumi, et al., "Heteroepitaxial growth of $Y_2O_3$ films on silicon", *Applied Physics Letters*, 55(4), (1989),360-361.

Fuse, Tsuneaki, et al., "A 0.5V 200MHz 1-Stage 32b ALU Using a Body Bias Controlled SOI Pass-Gate Logic", *1997 IEEE International Solid-State Circuits Conference, Digest of Technical Papers*, (1997),286-287.

Fuyuki, Takashi, et al., "Electronic Properties of the Interface between Si and $TiO_2$ Deposited at Very Low Temperatures", *Japanese Journal of Applied Physics*, 25(9), (1986),1288-1291.

Gagliano, F. P., et al., "Laser Processing Fundamentals", *In Lasers in Industry*, edited by S.S. Charschan, Van Nostrand Reinhold Company,(1972),156-164.

Gong, S., "Techniques for reducing switching noise in high speed digital systems", *Proceedings Eighth Annual IEEE International ASIC Conference and Exhibit*, (1995),21-24.

Gosele, U., et al., "Self-propagating Room-temperature Silicon Wafer Bonding in Ultrahigh Vacuum", *Applied Physics Letters*, 67(24), (1995),3614-3616.

Guillaumot, B, et al., "75 nm damascene metal gate and high-k integration for advanced CMOS devices", *Technical Digest of International Electron Devices Meeting 2002*, (2002),355-358.

Harada, M., "Suppression of Threshold Voltage Variation in MTCMOS/SIMOX Circuit Operating Below 0.5 V", *1996 Symposium on VLSI Technology, Digest of Technical Papers*, Honolulu, HI,(1996),96-97.

Harendt, Christine, "Silicon on Insulator Material by Wafer Bonding", *Journal of Electronic Materials*, 20(3), (1991),267-77.

Hayashi, H., et al., "Fabrication of Low-temperature bottom-gate Poly-Si TFTs on large-area substrate by linear-beam excimer laser crystallization and ion doping method", *IEEE IEDM*, vol. 95, (1995),829-832.

Heavens, O., *Optical Properties of Thin Solid Films*, Dover Pubs. Inc., New York,(1965),155-206.

Herrold, J., et al., "Growth and properties of microcrystalline germanium-carbide alloys", *Amorphous and Heterogeneous Silicon Thin Films: Fundamentals to Devices—1999 Symposium*, San Francisco, CA, Apr. 5-9, 1999,(1999),16 pgs.

Herrold, J. et al., "Growth and properties of microcrystalline germanium-carbide alloys grown using electron cyclotron resonance plasma processing", *Journal of Non-Crystalline Solids (Netherlands)*, 270(1-3), (2000),255-259.

Hisamoto, D., et al., "A New Stacked Cell Structures for Giga-Bit DRAMs using Vertical Ultra-Thin SOI (DELTA) MOSFETs", *1991 IEEE International Electron Devices Meeting, Technical Digest*, Washington, D.C.,(1991),959-961.

Hodges, David A., et al., "MOS Decoders", *In: Analysis and Design of Digital Integrated Circuits, 2nd Edition*, Section: 9.1.3,(1988),354-357.

Holman, W. T., "A Compact Low Noise Operational Amplifier for a 1.2 Micrometer Digital CMOS Technology", *IEEE Journal of Solid-State Circuits*, 30, (1995),710-714.

Horiuchi, M. et al., "A mechanism of silicon wafer bonding", *of the First International Symposium on Semiconductor Wafer Bonding: Science, Technology and Applications*, (1992),48-62.

Hu, G., "Will Flash Memory Replace Hard Disk Drive?", *1994 IEEE International Electron Device Meeting*, Panel Discussion, Session 24, Outline,(1994),2 pages.

Huang, W. L., et al., "TFSOI Complementary BiCMOS Technology for Low Power Applications", *IEEE Transactions on Electron Devices*, 42, (1995),506-512.

Imthurn, George P., et al., "Bonded Silicon-on-Sapphire Wafers and Devices", *Journal of Applied Physics*, 72(6), (1992),2526-7.

Jun, Y. K., "The Fabrication and Electrical Properties of Modulated Stacked Capacitor for Advanced DRAM Applications", *IEEE Electron Device Letters*, 13, (1992),430-432.

Jung, T. S., "A 117-mm2 3.3-V Only 128Mb Multilevel NAND Flash Memory for Mass Storage Applications", *IEEE Journal of Solid-State Circuits*, 31, (1996),1575-1583.

Jung, H S., et al., "Improved current performance of CMOSFETs with nitrogen incorporated $HfO_2$—$Al_2O_3$ laminate gate dielectric", *Technical Digest of International Electron Devices Meeting 2002*, (2002),853-856.

Kang, H. K., et al., "Highly Manufacturable Process Technology for Reliable 256 Mbit and 1Gbit DRAMs", *IEEE International Electron Devices Meeting, Technical Digest*, San Francisco, CA,(1994),635-638.

Kang, L, et al., "MOSFET devices with polysilicon on single-layer $HfO_2$ high-K dielectrics", *International Electron Devices Meeting 2000. Technical Digest. IEDM*, (2000),35-8.

Kim, Y W., et al., "50nm gate length logic technology with 9-layer Cu interconnects for 90nm node SoC applications", *Technical Digest of International Electron Devices Meeting 2002*, (2002),69-72.

Kim, Y. S., "A Study on Pyrolysis DMEAA for Selective Deposition of Aluminum", *In: Advanced Metallization and Interconnect Systems for ULSI Applications in 1995*, R.C. Ellwanger, et al., (eds.), Materials Research Society, Pittsburgh, PA,(1996),675-680.

Kishimoto, T., et al., "Well Structure by High-Energy Boron Implantation for Soft-Error Reduction in Dynamic Random Access Memories (DRAMs)", *Japanese Journal of Applied Physics*, 34, (1995),6899-6902.

Kohyama, Y., et al., "Buried Bit-Line Cell for 64MB DRAMs", *1990 Symposium on VLSI Technology, Digest of Technical Papers*, Honolulu, HI,(1990),17-18.

Koshida, N., "Efficient Visible Photoluminescence from Porous Silicon", *Japanese Journal of Applied Physics*, 30, (1991),L1221-L1223.

Kouvetakis, J., et al., "Novel chemical routes to silicon-germanium-carbon materials", *Applied Physics Letters*, 65(23), (1994),2960-2962.

Kuge, Shigehiro, et al., "SOI-DRAM Circuit Technologies for Low Power High Speed Multigiga Scale Memories", *IEEE Journal of Solid-State Circuits*, 31(4), (1996),pp. 586-591.

Kwo, J., "Properties of high k gate dielectrics $Gd_2O_3$ and $Y_2O_3$ for Si", *Journal of Applied Physics*, 89(7), (2001),3920-3927.

Lantz, II, L., "Soft Errors Induced By Alpha Particles", *IEEE Transactions on Reliability*, 45, (1996), 174-179.

Lasky, J. B., "Wafer Bonding for Silicon-on-Insulator Technologies", *Applied Physics Letters*, 48(1), (1986),78-80.

Lee, Byoung H., et al., "Characteristics of TaN gate MOSFET with ultrathin hafnium oxide (8 A-12 A)", *Electron Devices Meeting, 2000. IEDM Technical Digest. International*, (2000),39-42.

Lee, S J., "High quality ultra thin CVD $HfO_2$ gate stack with poly-Si gate electrode", *Electron Devices Meeting, 2000, IEDM Technical Digest, International*, (2000),31-34.

Lee, Cheng-Chung, et al., "Ion-assisted deposition of silver thin films", *Thin Solid Films*, 359(1), (2000),95-97.

Lee, Jung-Hyoung, et al., "Mass production worthy $HfO2$—$Al_2O_3$ laminate capacitor technology using Hf liquid precursor for sub-100 nm DRAMs", *International Electron Devices Meeting, 2002. IEDM '02. Digest.*, (2002),221-224.

Lee, B. H., et al., "Novel Pattern Transfer Process for Bonded SOI Giga-bit DRAMs", *IEEE International SOI Conference*, Piscataway, NJ,(1996), 114-115.

Lehmann, V., "The Physics of Macropore Formation in Low Doped n-Type Silicon", *Journal of the Electrochemical Society*, 140(10), (1993),2836-2843.

Leskela, M, "ALD precursor chemistry: Evolution and future challenges", *Journal de Physique IV (Proceedings)*, 9(8), (1999),837-852.

Lopez, E., et al., "Laser assisted integrated processing of SiGeC films on silicon", *Thin Solid Films*, vol. 453-454, (2004),46-51.

Lu, D., "Bonding Silicon Wafers by Use of Electrostatic Fields Followed by Rapid Thermal Heating", *Materials Letters*, 4(11), (1986),461-464.

Lu, N., et al., "The SPT Cell—A New Substrate-Plate Trench Cell for DRAMs", *1985 IEEE International Electron Devices Meeting, Technical Digest*, Washington, D.C., (1985),771-772.

Macsweeney, D., et al., "Modelling of Lateral Bipolar Devices in a CMOS Process", *IEEE Bipolar Circuits and Technology Meeting*, Minneapolis, MN,(1996),27-30.

Maeda, S., et al., "A Vertical Phi-Shape Transistor (VPhiT) Cell for 1 Gbit DRAM and Beyond", *1994 Symposium of VLSI Technology, Digest of Technical Papers*, Honolulu, HI,(1994),133-134.

Maeda, S., et al., "Impact of a Vertical Phi-Shape Transistor (VPhiT) Cell for 1 Gbit DRAM and Beyond", *IEEE Transactions on Electron Devices*, 42, (1995),2117-2123.

Malaviya, S., *IBM TBD*, 15, (1972),p. 42.

Masu, K., et al., "Mulitlevel Metallization Based on AI CVD", *1996 IEEE Symposium on VLSI Technology, Digest of Technical Papers*, Honolulu, HI,(1996),44-45.

McCredie, B. D., et al., "Modeling, Measurement, and Simulation of Simultaneous Switching Noise", *IEEE Transactions on Components, Packaging, and Manufacturing Technology—Part B*, 19, (1996),461-472.

Muller, D. A., et al., "The Electronic Structure at the Atomic Scale of Ultrathin Gate Oxides", *Nature*, 399, (1999),758-761.

Mumola, P. B., et al., "Recent Advances in Thinning of Bonded SOI Wafers by Plasma Assisted Chemical Etching", *Electrochemical Society Proceedings*, 95-7, (1995),28-32.

Nakamura, et al., "Giga-bit DRAM Cells with Low Capacitance and Low Resistance Bit-Lines on Buried MOSFET's and Capacitors by Using Bonded SOI Technology—Reversed-Stacked-Capacitor (RSTC) Cell-", *Technical Digest—International Electron Devices Meeting*, (1995),889-892.

Nitayama, A., et al., "High Speed and Compact CMOS Circuits with Multipillar Surrounding Gate Transistors", *IEEE Transactions on Electron Devices*, 36, (1989),2605-2606.

Oh, C B., et al., "Manufacturable embedded CMOS 6T-SRAM technology with high-k gate dielectric device for system-on-chip applications", *Technical Digest of International Electron Devices Meeting 2002*, (2002), 423-426.

Ohba, T., et al., "Evaluation on Selective Depositiion of CVD W Films by Measurement of Surface Temperature", *In: Tungsten and Other Refractory Metals for VLSI Applications II*, Materials Research Society, Pittsburgh, PA,(1987),59-66.

Ohba, T., et al., "Selective Chemical Vapor Deposition of Tungsten Using Silane and Polysilane Reductions", *In: Tungsten and Other Refractory Metals for VLSI Applications IV*, Materials Research Society, Pittsburgh, PA,(1989),17-25.

Ohmi, S., et al., "Rare Earth Metal Oxides for High-K Gate Insulator", *Electrochemical Society Proceedings*, vol. 2002-2, (2002),376-387.

Ohno, Y., et al., "Estimation of the Charge Collection for the Soft-Error Immunity by the 3D-Device Simulation and the Quantitative Investigation", *Simulation of Semiconductor Devices and Processes*, 6, (1995),302-305.

Oowaki, Y., et al., "New alpha-Particle Induced Soft Error Mechanism in a Three Dimensional Capacitor Cell", *IEICE Transactions on Electronics*, 78-C, (1995),845-851.

Oshida, S., et al., "Minority Carrier Collection in 256 M-bit DRAM Cell on Incidence of Alpha-Particle Analyzed by Three-Dimensional Device Simulation", *IEICE Transactions on Electronics, 76-C*, (1993), 1604-1610.

Osten, H. J., et al., "High-k gate dielectrics with ultra-low leakage current based on praseodymium oxide", *International Electron Devices Meeting 2000. Technical Digest. IEDM*, (2000),653-656.

Ozaki, T., et al., "A Surrounding Isolation-Merged Plate Electrode (SIMPLE) Cell with Checkered Layout for 256Mbit DRAMs and Beyond", *1991 IEEE International Electron Devices Meeting*, Washington, D.C.,(1991),469-472.

Park, Jaehoo, et al., "Chemical vapor deposition of $HfO_2$ thin films using a novel carbon-free precursor: characterization of the interface with the silicon substrate", *Journal of the Electrochemical Scoiety*, 149(1), (2002),G89-G94.

Parke, S. A., et al., "A High-Performance Lateral Bipolar Transistor Fabricated on SIMOX" *IEEE Electron Device Letters*, 14, (1993),33-35.

Pein, H., "A 3-D Sidewall Flash EPROM Cell and Memory Array", *IEEE Transactions on Electron Devices*, 40, (1993),2126-2127.

Pein, H., "Performance of the 3-D Pencil Flash EPROM Cell and Memory Array", *IEEE Transactions on Electron Devices*, 42, (1995),1982-1991.

Pein, H. B., "Performance of the 3-D Sidewall Flash EPROM Cell", *IEEE International Electron Meeting, Technical Digest*, (1993), 11-14.

Ramm, J., et al., "Hydrogen cleaning of silicon wafers. Investigation of the wafer surface after plasma treatment", *Thin Solid Films*, 228, (1993),23-26.

Ramo, S., "Fields and Waves in Communication Electronics, Third Edition", John Wiley & Sons, Inc.,(1994),428-433.

Rao, K. V., et al., "Trench Capacitor Design Issues in VLSI DRAM Cells", *1986 IEEE International Electron Devices Meeting, Technical Digest*, Los Angeles, CA,(1986),140-143.

Richardson, W. F., et al., "A Trench Transistor Cross-Point DRAM Cell" *IEEE International Electron Devices Meeting*, Washington, D.C., (1985),714-717.

Sagara, K., "A 0.72 micro-meter2 Recessed STC (RSTC) Technology for 256Mbit DRAMs using Quarter-Micron Phase-Shift Lithography", *1992 Symposium on VLSI Technology, Digest of Technical Papers*, Seattle, WA, (1992),10-11.

Seevinck, E., et al., "Current-Mode Techniques for High-Speed VLSI Circuits with Application to Current Sense Amplifier for CMOS SRAM's", *IEEE Journal of Solid State Circuits*, 26(4), (Apr. 1991),pp. 525-536.

Senthinathan, R., et al., "Reference Plane Parasitics Modeling and Their Contribution to the Power and Ground Path "Effective" Inductance as Seen by the Output Drivers", *IEEE Transactions on Microwave Theory and Techniques*, 42, (Sep. 1994),1765-1773.

Shah, A. H., et al., "A 4-Mbit DRAM with Trench-Transistor Cell", *IEEE Journal of Solid-State Circuits, SC-21*, (Oct. 1986),618-625.

Shah, A. H., et al., "A 4Mb DRAM with Cross-Point Trench Transistor Cell", *1986 IEEE International Solid-State Circuits Conference, Digest of Technical Papers*, (Feb. 21, 1986),268-269.

Sherony, M. J., "Reduction of Threshold Voltage Sensitivity in SOI MOSFET's", *IEEE Electron Device Letters*, 16, (1995), 100-102.

Shimbo, M., et al., "Silicon-to-Silicon direct bonding method", *J. Appl. Phys.* vol. 60, No. 8, (1986),2987-2989.

Shimomura, K., et al., "A 1V 46ns 16Mb SOI-DRAM with Body Control Technique", *1997 IEEE International Solid-State Circuits Conference, Digest of Technical Papers*, (1997),68-69.

Stanisic, B. R., et al., "Addressing Noise Decoupling in Mixed-Signal IC's: Power Distribution Design and Cell Customization", *IEEE Journal of Solid-State Circuits*, 30, (1995),321-326.

Stellwag, T. B., "A Vertically-Integrated GaAs Bipolar DRAM Cell", *IEEE Transactions on Electron Devices*, 38, (1991),2704-2705.

Su, D. K., et al., "Experimental Results and Modeling Techniques for Substrate Noise in Mixed-Signal Integrated Circuits", *IEEE Journal of Solid-State Circuits*, 28(4), (1993), 420-430.

Suma, Katsuhiro, et al., "An SOI-DRAM with Wide Operating Voltage Range by CMOS/SIMOX Technology", *IEEE Journal of Solid-State Circuits*, 29(11), (1994),pp. 1323-1329.

Summonte, C., et al., "Wide band-gap silicon-carbon alloys deposited by very high frequency plasma enhanced chemical vapor deposition", *Journal of Applied Physics*, 96(7), (Oct. 1, 2004),3987-3997.

Sunouchi, K., et al., "A Surrounding Gate Transistor (SGT) Cell for 64/256Mbit DRAMs", *1989 IEEE International Electron Devices Meeting, Technical Digest*, Washington D.C., (1989),23-26.

Sunouchi, K., et al., "Process Integration for 64M DRAM Using an Asymmetrical Stacked Trench Capacitor (AST) Cell", *1990 IEEE International Electron Devices Meeting*, San Francisco, CA,(1990),647-650.

Sze, S. M., *In: Physics of Semiconductor Devices, Second Edition*, John Wiley & Sons, New York,(1981),p. 42.

Sze, S M., "Physics of Semiconductor Devices", *New York : Wiley*, (1981),473.

Takai, M., et al., "Direct Measurement and Improvement of Local Soft Error Susceptibility in Dynamic Random Access Memories", *Nuclear Instruments & Methods in Physics Research, B-99*, (1994),562-565.

Takato, H., et al., "High Performance CMOS Surrounding Gate Transistor (SGT) for Ultra High Density LSIs", *IEEE International Electron Devices Meeting, Technical Digest*, (1988),222-225.

Takato, H., et al., "Impact of Surrounding Gate Transistor (SGT) for Ultra-High Density LSI's", *IEEE Transactions on Electron Devices*, 38, (1991), 573-578.

Tanabe, N., et al., "A Ferroelectric Capacitor Over Bit-Line (F-COB) Cell for High Density Nonvolatile Ferroelectric Memories", *1995 Symposium on VLSI Technology, Digest of Technical Papers*, Kyoto, Japan,(1995),123-124.

Tavel, B, et al., "High performance 40 nm nMOSFETs with $HfO_2$ gate dielectric and polysilicon damascene gate", *Technical Digest of International Electron Devices Meetings 2002*, (2002),429-432.

Temmler, D., "Multilayer Vertical Stacked Capactors (MVSTC) for 64Mbit and 256Mbit DRAMs", *1991 Symposium on VLSI Technology, Digest of Technical Papers*, Oiso, (1991), 13-14.

Terauchi, M., "A Surrounding Gate Transistor (SGT) Gain Cell for Ultra High Density DRAMs", *1993 Symposium on VLSI Technology, Digest of Technical Papers*, Kyoto, Japan,(1993),21-22.

Tong, Q. Y., et al., "Hydrophobic Silicon Wafer Bonding", *Applied Physics Letter* 64(5), (1994),625-627.

Tsui, P. G., et al., "A Versatile Half-Micron Complementary BiCMOS Technology of Microprocessor-Based Smart Power Applications", *IEEE Transactions on Electron Devices*, 42, (1995),564-570.

Tyczkowski, J., et al., "Electronic band structure of insulating hydrogenated carbon-germanium films", *Journal of Applied Physics*, 86(8), (1999),4412-4418.

Van Dover, R. B., "Amorphous lanthanide-doped TiOx dielectric films", *Applied Physics Letters*, 74(20), (1999),3041-3043.

Van Dover, R B., et al., "Deposition of Uniform Zr-Sn-Ti-O Films by On-Axis Reactive Sputtering", *IEEE Electron Device Letters*, 19(9), (1998),329-331.

Verdonckt-Vanderbroek, S., et al., "High-Gain Lateral Bipolar Action in a MOSFET Structure", *IEEE Transactions on Electron Devices 38*, (1991),2487-2496.

Vittal, A., et al., "Clock Skew Optimization for Ground Bounce Control", *1996 IEEE/ACM International Conference on Computer-Aided Design, Digest of Technical Papers*, San Jose, CA,(1996),395-399.

Wang, N., *Digital MOS Integrated Circuits*, Prentice Hall, Inc., Englewood Cliffs, NJ,(1989),p. 328-333.

Watanabe, H., et al., "A New Cylindrical Capacitor Using Hemispherical Grained Si (HSG-Si) for 256Mb DRAMs", *IEEE International Electron Devices Meeting, Technical Digest*, San Francisco, CA,(1992),259-262.

Watanabe, S., et al., "A Novel Circuit Technology with Surrounding Gate Transistors (SGT's) for Ultra High Density DRAM's", *IEEE Journal of Solid-State Circuits*, 30, (1995),960-971.

Watanabe, H., "A Novel Stacked Capacitor with Porous-Si Electrodes for High Density DRAMs", *1993 Symposium on VLSI Technology, Digest of Technical Papers*, Kyoto, Japan,(1993),17-18.

Watanabe, H., "An Advanced Fabrication Technology of Hemispherical Grained (HSG) Poly-Si for High Capacitance Storage Electrodes", *Extended Abstracts of the 1991 International Conference on Solid State Devices and Materials*, Yokohama, Japan, (1991),478-480.

Watanabe, H., "Device Application and Structure Observation for Hemispherical-Grained Si", *J. Appl. Phys., 71*, (1992),3538-3543.

Watanabe, H., "Hemispherical Grained Silicon (HSG-Si) Formation on In-Situ Phosphorous Doped Amorphous-Si Using the Seeding Method", *Extended Abstracts of the 1992 International Conference on Solid State Devices and Materials*, Tsukuba, Japan,(1992),422-424.

Weldon, M. K., et al., "Physics and Chemistry of Silicon Wafer bonding Investigated by Infrared Absorption Spectroscopy", *Journal of Vacuum Sci. Technology*, B 14(4), c1996 American Vacuum Society,(1996),3095-3106.

Wolf, S., et al., *Silicon Processing for the VLSI Era—vol. 4: Deep-Submicron Process Technology*, Lattice Press, Sunset Beach, CA,(2002),p. 98, 146 173-174.

Wolf, Stanley, et al., "Future Trends in Sputter Deposition Processes", *In: Silicon Processing of the VLSI Era*, vol. 1, Lattice Press,(1986),374-380.

Yamada, T., et al., "A New Cell Structure with a Spread Source/Drain (SSD) MOSFET and a Cylindrical Capacitor for 64-Mb DRAM's", *IEEE Transactions on Electron Devices*, 38, (1991),2481-2486.

Yamada, T., et al., "Spread Source/Drain (SSD) MOSFET Using Selective Silicon Growth for 64Mbit DRAMs", *1989 IEEE International Electron Devices Meeting, Technical Digest*, Washington, D.C. ,(1989),35-38.

Yeh, Ching-Fa, et al., "The advanced improvement of PN mesa junction diode prepared by silicon-wafer direct bonding", *1991 International Symposium on VLSI Technology, Systems, and Applications, 1991. Proceedings of Technical Papers*, (1991),136-140.

Nalwa, H. S., "Handbook of Thin Film Materials", *Deposition and Processing of thin Films*, vol. 1, San Diego : Academic Press,(2002),114-119.

Ahn, "Atomic Layer Deposited Dielectric Layers", U.S. Appl. No. 10/379,470, filed Mar. 4, 2003.

Ahn, "Iridium/Zirconium Oxide Structure", U.S. Appl. No. 11/152,759, filed Jun. 14, 2005.

Ahn, Kie Y., "Lanthanide Yttrium Aluminum Oxide Dielectric Films", U.S. Appl. No. 11/297,567, filed Dec. 8, 2005, 05-0711.

Ahn, "Lanthanum Aluminum Oxynitride Dielectric Films", U.S. Appl. No. 11/216,474, filed Aug. 31, 2005.

Ahn, Kie Y., "Magnesium Titanium Oxide Films", U.S. Appl. No. 11/189,075, filed Jul. 25, 2005, 05-0381.

Gealy, et al., "Graded Dielectric Layers", U.S. Appl. No. 11/216,542, filed Aug. 30, 2005.

Ahn, Kie Y., "Lanthanum Aluminum Oxynitride Dielectric Films", *U.S. Appl. No. 11/216,474, filed Aug. 31, 2005*.

Conley, J. F., "Atomic Layer Deposition of Hafnium Oxide Using Anhydrous Hafnium Nitrate", *Electrochemical and Solid-State Letters*, 5(5), (May 2002), C57-C59.

Lu, Xu-Bing, et al., "Structure and dielectric properties of amorphous LaAlOsub3 and LaAlOsub x Nsub y films as alternative gate dielectric materials", *Journal of Applied Physics*, 94(2), (Jul. 15, 2003), 1229-1234.

Reidy, S., et al., "Comparison of two sufrace preparations used in the homoepitaxial growth of silicon films by plasma enhanced chemical vapor deposition", *J. Vac. Sci. Technol. B* 21(3), (May/Jun.), 970-974.

Rhee, H. S., et al. "Cobalt Metallorganic Chemical Vapor Deposition and Formation of Epitaxial CoSI2 Layer on Si(100) Substrate", *Journal of Electrochemical Society*, 146(6), (1999), 2720-2724.

"U.S. Appl. No. 09/780,126 Amendment Under 37 CFR mailed Mar. 3, 2003", 9 pgs.

"U.S. Appl. No. 09/780,126 Notice of Allowance mailed Jun. 7, 2002", 8 pgs.

"U.S. Appl. No. 09/780,126 Notice of Allowance mailed Dec. 3, 2002", 10 pgs.

"U.S. Appl. No. 10/137,058, Final office action mailed May 31, 2007", 23 pgs.

"U.S. Appl. No. 10/137,058, Non-final office action mailed Nov. 20, 2006", 47 pgs.

"U.S. Appl. No. 10/137,058, Response filed Feb. 20, 2007 to non-final office action mailed Nov. 20, 2006", 25 pgs.

"U.S. Appl. No. 10/137,168 Amendment Under 37 CFR 1.312 mailed Sep. 15, 2006", 3 pgs.

"U.S. Appl. No. 10/137,058, Non final office action mailed Jan. 5, 2006", 6 pgs.

"U.S. Appl. No. 10/137,168, Non final office action mailed Jun. 26, 2003", 8 pgs.

"U.S. Appl. No. 10/137,168 Notice of allowance mailed Apr. 9, 2004", 28 pgs.

"U.S. Appl. No. 10/137,168 Notice of allowance mailed Jun. 28, 2005", 10 pgs.

"U.S. Appl. No. 10/137,168 Notice of allowance mailed Jul. 25, 2006", 12 pgs.

"U.S. Appl. No. 10/137,168 Notice of allowance mailed Sep. 24, 2004", 8 pgs.

"U.S. Appl. No. 10/137,168 Notice of allowance mailed Nov. 13, 2003", 5 pgs.

"U.S. Appl. No. 10/137,168 Response filed Apr. 5, 2006 to Non-final office action mailed Jan. 5, 2006", 9 pgs.

"U.S. Appl. No. 10/137,168 Response filed Sep. 26, 2003 to Non-final office action mailed Jun. 26, 2003", 11 pgs.

"U.S. Appl. No. 10/137,499 Amendment under 37 CFR filed May 16, 2005", 16 pgs.

"U.S. Appl. No. 10/137,499 Non-final office action mailed Nov. 15, 2002", 9 pgs.

"U.S. Appl. No. 10/137,499 Notice of Allowance mailed Jan. 12, 2006", 13 pgs.

"U.S. Appl. No. 10/137,499 Notice of Allowance mailed Nov. 4, 2003", 13 pgs.

"U.S. Appl. No. 10/137,499 Notice of Allowance mailed Feb. 24, 2005", 15 pgs.

"U.S. Appl. No. 10/137,499 Notice of Allowance mailed Mar. 23, 2004", 14 pgs.

"U.S. Appl. No. 10/137,499 Notice of Allowance mailed May 5, 2003", 18 pgs.

"U.S. Appl. No. 10/137,499 Preliminary Amendment filed Jan. 9, 2006", 5 pgs.

"U.S. Appl. No. 10/137,499 Response filed Feb. 18, 2003 to final office action mailed Feb. 18, 2002", 42 pgs.

"U.S. Appl. No. 10/163,481 Final Office Action mailed Jul. 21, 2005", 9 pgs.

"U.S. Appl. No. 10/163,481 Non Final Office Action mailed Jan. 5, 2006", 8 pgs.

"U.S. Appl. No. 10/163,481 Non Final Office Action mailed Jan. 25, 2005", 7 pgs.

"U.S. Appl. No. 10/163,481 Response filed Jan. 5, 2006 to Non Final Office Action mailed Apr. 5, 2006", 23 pgs.

"U.S. Appl. No. 10/163,481 Response filed Mar. 23, 2005 to Non Final Office Action mailed Jan. 25, 2005", 21 pgs.

"U.S. Appl. No. 10/163,481 Response filed Sep. 21, 2005 to Final Office Action mailed Jul. 21, 2005", 20 pgs.

"U.S. Appl. No. 10/163,686 final office action mailed Dec. 27, 2004", 7 pgs.

"U.S. Appl. No. 10/163,686 non-final office action mailed May 26, 2005", 8 pgs.

"U.S. Appl. No. 10/163,686 non-final office action mailed Jun. 28, 2004", 6 pgs.

"U.S. Appl. No. 10/163,686 non-final office action mailed Jun. 7, 2006", 9 pgs.

"U.S. Appl. No. 10/163,686 Notice of Allowance mailed Nov. 29, 2006", 4 pgs.

"U.S. Appl. No. 10/163,686 Response filed Jan. 23, 2006 to final office action mailed Nov. 23, 2005", 16 pgs.

"U.S. Appl. No. 10/163,686 Response filed Feb. 25, 2005 to final office action mailed Dec. 27, 2004", 11 pgs.

"U.S. Appl. No. 10/163,686 Response filed Aug. 24, 2005 to non-final office action mailed May 26, 2005", 16 pgs.

"U.S. Appl. No. 10/163,686 Response filed Sep. 1, 2006 to non-final office action mailed Jun. 7, 2006", 19 pgs.

"U.S. Appl. No. 10/163,686 Response filed Sep. 28, 2004 to non-final office action mailed Jun. 28, 2004", 13 pgs.

"U.S. Appl. No. 10/163,686 final office action mailed Nov. 23, 2005", 8 pgs.

"U.S. Appl. No. 10/219,878 Notice of allowance mailed Dec. 16, 2003", 5 pgs.

"U.S. Appl. No. 10/219,878 Notice of allowance mailed Apr. 20, 2004", 2 pgs.

"U.S. Appl. No. 10/229,903 final office action mailed Mar. 25, 2004", 11 pgs.

"U.S. Appl. No. 10/229,903 final office action mailed Mar. 8, 2006", 16 pgs.

"U.S. Appl. No. 10/229,903 non-final office action mailed Oct. 27, 2005", 12 pgs.

"U.S. Appl. No. 10/229,903 non-final office action mailed Oct. 30, 2003", 7 pgs.

"U.S. Appl. No. 10/229,903 Notice of allowance mailed Jan. 26, 2005", 3 pgs.

"U.S. Appl. No. 10/229,903 Notice of allowance mailed Jun. 21, 2004", 4 pgs.

"U.S. Appl. No. 10/229,903 Notice of allowance mailed Aug. 1, 2006", 5 pgs.

"U.S. Appl. No. 10/229,903 Response filed Jan. 27, 2006 to non-final office action mailed Oct. 27, 2005", 20 pgs.

"U.S. Appl. No. 10/229,903 Response filed Jan. 30, 2004 to non-final office action mailed Oct. 30, 2003", 15 pgs.

"U.S. Appl. No. 10/229,903 Response filed May 19, 2004 to final office action mailed Mar. 25, 2004.pdf", 24 pgs.

"U.S. Appl. No. 10/229,903 Response filed May 8, 2006 to final office action mailed May 8, 2006", 22 pgs.

"U.S. Appl. No. 10/233,309 Amendment and Response filed Apr. 26, 2005 to Final Office Action mailed Mar. 16, 2005", 16 pgs.

"U.S. Appl. No. 10/233,309 Final Office Action mailed Mar. 16, 2005", 13 pgs.

"U.S. Appl. No. 10/233,309 Non-final Office Action mailed aug. 22, 2005", 8 pgs.

"U.S. Appl. No. 10/233,309 non-final office action mailed May 20, 2004", 10 pgs.

"U.S. Appl. No. 10/233,309 non-final office action mailed Aug. 22, 2005", 5 pgs.

"U.S. Appl. No. 10/233,309 Notice of allowance mailed Feb. 7, 2006", 4 pgs.

"U.S. Appl. No. 10/233,309 Response filed Aug. 20, 2004 to Non-final Office Action mailed May 20, 2004", 16 pgs.

"U.S. Appl. No. 10/233,309 Response filed Nov. 21, 2005 to non-final office action mailed Aug. 22, 2005", 15 pgs.

"U.S. Appl. No. 10/233,309 Response filed Apr. 25, 2005 to final office action mailed mar. 16, 2005", 19 pgs.

"U.S. Appl. No. 10/233,309 Response filed Aug. 20, 2004 to non-final office action mailed may 20, 2004", 20 pgs.

"U.S. Appl. No. 10/309,583, Non-final office action mailed Dec. 19, 2003", 8 pgs.

"U.S. Appl. No. 10/309,583, Notice of allowance mailed Nov. 3, 2004", 4 pgs.

"U.S. Appl. No. 10/309,583, Notice of allowance mailed Jun. 16, 2004", 4 pgs.

"U.S. Appl. No. 10/309,583, Notice of Allowance mailed May 19, 2005", 4 pgs.

"U.S. Appl. No. 10/309,583, Notice of allowance mailed Nov. 3, 2004", 7 pgs.

"U.S. Appl. No. 10/309,583, Non Final Office Action mailed Dec. 19, 2003", 18 pgs.

"U.S. Appl. No. 10/309,583 Response filed Mar. 19, 2004 to non-final office action mailed Dec. 19, 2003", 20 pgs.

"U.S. Appl. No. 10/309,583, Notice of allowance mailed Jun. 16, 2004", 10 pgs.

"U.S. Appl. No. 10/309,935 Amendment Under 37 CFR 1.312 mailed Mar. 8, 2005", 15 pgs.

"U.S. Appl. No. 10/309,935 Non Final Office Action mailed Apr. 23, 2004", 8 pgs.

"U.S. Appl. No. 10/309,935 Notice of allowance mailed Dec. 13, 2004", 5 pgs.

"U.S. Appl. No. 10/309,935 Response filed Jul. 23, 2004 to Non final Office Action mailed Apr. 23, 2004", 23 pgs.

"U.S. Appl. No. 10/379,470 Non Final Office Action mailed Mar. 10, 2005", 27 pgs.

"U.S. Appl. No. 10/379,470 Non Final Office Action mailed Jul. 28, 2004", 21 pgs.

"U.S. Appl. No. 10/403,734, Non-final office action mailed Oct. 12, 2005", 12 pgs.

"U.S. Appl. No. 10/379,470 Notice of allowance mailed Nov. 11, 2006", 11 pgs.

"U.S. Appl. No. 10/379,470 Response filed Jan. 12, 2006 to non-final office action mailed Oct. 12, 2005", 18 pgs.

"U.S. Appl. No. 10/379,470 Response filed Jun. 10, 2005 to non-final office action mailed Mar. 10, 2005", 17 pgs.

"U.S. Appl. No. 10/379,470 Response filed Oct. 27, 2004 to non-final office action mailed Jul. 28, 2004", 17 pgs.

"U.S. Appl. No. 10/403,734, Non-final office action mailed Jun. 14, 2005", 17 pgs.

"U.S. Appl. No. 10/403,734, Non-final office action mailed Oct. 19, 2005", 10 pgs.

"U.S. Appl. No. 10/403,734, Notice of allowance mailed Jun. 30, 2006", 12 pgs.

"U.S. Appl. No. 10/403,734, Response filed Jan. 19, 2006 to non-final office action mailed Oct. 19, 2005", 18 pgs.

"U.S. Appl. No. 10/403,734, Response filed Sep. 13, 2005 to non-final office action mailed Jun. 14, 2005", 13 pgs.

"U.S. Appl. No. 10/403,734, Final Office Action mailed Mar. 1, 2006", 10 pgs.

"U.S. Appl. No. 10/403,734, Non-Final Office Action mailed Oct. 19, 2005", 8 pgs.

"U.S. Appl. No. 10/403,734, Non-Final Office Action mailed Jun. 14, 2005", 8 pgs.

"U.S. Appl. No. 10/403,734, Notice of allowance mailed Jun. 30, 2006", 5 pgs.

"U.S. Appl. No. 10/403,734, Response filed Jan. 19, 2006 Non-Final Office Action mailed Oct. 19, 2005", 18 pgs.

"U.S. Appl. No. 10/403,734, Response filed Jun. 1, 2006 Final Office Action mailed Mar. 1, 2006", 19 pgs.

"U.S. Appl. No. 10/403,734, Response filed Sep. 13, 2005 Non-Final Office Action mailed Jun. 14, 2005", 13 pgs.

"U.S. Appl. No. 10/420,307 Final office action mailed Jul. 27, 2005", 14 pgs.

"U.S. Appl. No. 10/420,307 Non-final office action mailed Feb. 8, 2005", 19 pgs.

"U.S. Appl. No. 10/420,307 Non-final office action mailed Dec. 22, 2005", 14 pgs.

"U.S. Appl. No. 10/420,307 Notice of allowance mailed Oct. 17, 2006", 7 pgs.

"U.S. Appl. No. 10/420,307 Response filed Mar. 22, 2006 to non-final office action mailed Dec. 22, 2005", 15 pgs.

"U.S. Appl. No. 10/420,307 Response filed Apr. 26, 2005 to non-final office action mailed Feb. 8, 2005", 12 pgs.

"U.S. Appl. No. 10/420,307 Final Office Action mailed Jul. 27, 2005", 11 pgs.

"U.S. Appl. No. 10/420,307 Non Final Office Action mailed Feb. 8, 2005", 10 pgs.

"U.S. Appl. No. 10/420,307 Non Final Office Action mailed Dec. 22, 2005", 11 pgs.

"U.S. Appl. No. 10/420,307 Notice of allowance mailed Oct. 17, 2006", 4 pgs.

"U.S. Appl. No. 10/420,307 Response filed Mar. 22, 2006 Non Final Office Action mailed Dec. 22, 2005", 15 pgs.

"U.S. Appl. No. 10/420,307 Response filed Apr. 26, 2005 Non Final Office Action mailed Feb. 8, 2005", 12 pgs.

"U.S. Appl. No. 10/420,307 Response filed Oct. 27, 2005 Final Office Action mailed Jul. 27, 2005", 12 pgs.

"U.S. Appl. No. 10/443,021, Notice of allowance mailed Mar. 18, 2005", 13 pgs.

"U.S. Appl. No. 10/443,021 Notice of allowance mailed Nov. 5, 2004", 8 pgs.

"U.S. Appl. No. 10/602,315, Non-final office action mailed Aug. 8, 2004", 13 pgs.

"U.S. Appl. No. 10/602,315, Notice of allowance mailed May 4, 2005", 7 pgs.

"U.S. Appl. No. 10/602,315, Notice of allowance mailed Nov. 14, 2005", 9 pgs.

"U.S. Appl. No. 10/602,315, Notice of allowance mailed Dec. 10, 2004", 10 pgs.

"U.S. Appl. No. 10/602,315, Response filed Nov. 12, 2004 to non-final office action mailed Aug. 11, 2004", 13 pgs.

"U.S. Appl. No. 10/602,323, Notice of allowance mailed Oct. 10, 2006", 4 pgs.

"U.S. Appl. No. 10/602,323, Non-final office action mailed Apr. 28, 2006", 8 pgs.

"U.S. Appl. No. 10/602,323, Non-final office action mailed Jun. 6, 2005", 21 pgs.

"U.S. Appl. No. 10/602,323, Notice of allowance mailed Dec. 1, 2005", 9 pgs.

"U.S. Appl. No. 10/602,323, Response filed Jul. 27, 2006 to non-final office action mailed Apr. 28, 2006", 12 pgs.

"U.S. Appl. No. 10/602,323, Response filed Sep. 6, 2005 to non-final office action mailed Jun. 6, 2005", 14 pgs.

"U.S. Appl. No. 10/602,323 Amendment under 37 C.F.R. filed Feb. 7, 2006", 10 pgs.

"U.S. Appl. No. 10/602,323 Non Final Office Action mailed Apr. 28, 2006", 6 pgs.

"U.S. Appl. No. 10/602,323 Non Final Office Action mailed Jun. 6, 2005", 9 pgs.

"U.S. Appl. No. 10/602,323 Notice of allowance mailed Oct. 20, 2006", 2 pgs.

"U.S. Appl. No. 10/602,323 Response filed Jul. 27, 2006 Non Final Office Action mailed Apr. 28, 2006", 12 pgs.

"U.S. Appl. No. 10/602,323 Response filed Sep. 6, 2005 Non Final Office Action mailed Jun. 6, 2005", 14 pgs.

"U.S. Appl. No. 10/789,042 Final Office Action mailed Sep. 5, 2006", 14 pgs.

"U.S. Appl. No. 10/789,042 Non Final Office Action mailed Mar. 23, 2006", 17 pgs.

"U.S. Appl. No. 10/789,042 Non Final Office Action mailed Aug. 30, 2007", 12 pgs.

"U.S. Appl. No. 10/789,042 Non Final Office Action mailed Sep. 29, 2005", 4 pgs.

"U.S. Appl. No. 10/789,042 Response filed Feb. 6, 2006 to final office action mailed Feb. 6, 2006", 20 pgs.

"U.S. Appl. No. 10/789,042 Response filed May 23, 2006 to non-final office action mailed May 23, 2006", 27 pgs.

"U.S. Appl. No. 10/789,042 Response filed Sep. 29, 2005 to Non Final Office Action mailed Sep. 29, 2004", 26 pgs.

"U.S. Appl. No. 10/789,042 Response filed Nov. 6, 2006 to Non Final Office Action mailed Sep. 5, 2006", 16 pgs.

"U.S. Appl. No. 10/789,042 Response filed Dec. 29, 2005 to Non Final Office Action mailed Sep. 29, 2005", 12 pgs.

"U.S. Appl. No. 10/789,044 final office action mailed Nov. 3, 2005", 8 pgs.

"U.S. Appl. No. 10/789,044 final office action mailed Sep. 11, 2006", 8 pgs.

"U.S. Appl. No. 10/789,044 non-final office action mailed Feb. 23, 2006", 7 pgs.

"U.S. Appl. No. 10/789,044 Non-final office action mailed May 16, 2005", 7 pgs.

"U.S. Appl. No. 10/789,044 Notice of allowance mailed Feb. 21, 2007", 4 pgs.

"U.S. Appl. No. 10/789,044 Response filed Nov. 13, 2006 to final office action mailed Sep. 11, 2006", 11 pgs.

"U.S. Appl. No. 10/789,044 Response filed May 23, 2006 to non-final office action mailed Feb. 23, 2006-2007", 14 pgs.

"U.S. Appl. No. 10/789,044 Response filed Aug. 15, 2005 to non-final office action mailed May 16, 2005", 10 pgs.

"U.S. Appl. No. 10/789,044 Response filed Jan. 3, 2006 to final office action mailed Nov. 3, 2005", 13 pgs.

"U.S. Appl. No. 10/909,959, Non-final office action mailed Feb. 20, 2007", 18 pgs.

"U.S. Appl. No. 10/909,959, Response filed May 11, 2007 to non-final office action mailed Feb. 20, 2007", 13 pgs.

"U.S. Appl. No. 10/909,959 Final Office Action mailed Aug. 8, 2007", 10 pgs.

"U.S. Appl. No. 10/909,959, Non Final Office Action mailed Feb. 20, 2007", 9 pgs.

"U.S. Appl. No. 10/909,959 Response filed May 11, 2007 Non-Final Office Action mailed Feb. 20, 2007", 13 pgs.

"U.S. Appl. No. 10/926,812, Notice of allowance mailed Feb. 9, 2006", 19 pgs.

"U.S. Appl. No. 10/926,812, Non-final office action mailed Sep. 29, 2005", 23 pgs.

"U.S. Appl. No. 10/926,812, Notice of allowance mailed May 16, 2005", 14 pgs.

"U.S. Appl. No. 10/926,812, Response filed Dec. 29, 2005 to non-final office action mailed Sep. 29, 2005", 13 pgs.

"U.S. Appl. No. 10/926,812, Amendment under 37 C.F.R. filed Feb. 9, 2006", 2 pgs.

"U.S. Appl. No. 10/926,812, Non-Final Office Action mailed Sep. 29, 2005", 5 pgs.

"U.S. Appl. No. 10/926,812, Notice of allowance mailed Feb. 9, 2006", 4 pgs.

"U.S. Appl. No. 10/926,812, Notice of allowance mailed May. 16, 2005", 4 pgs.

"U.S. Appl. No. 10/926,812, Response filed Dec. 29, 2005 Non-Final Office Action mailed Sep. 29, 2005", 13 pgs.

"U.S. Appl. No. 10/930,431, Response filed Sep. 11, 2007 to Final Office Action mailed Jul. 11, 2007", 11 pgs.

"U.S. Appl. No. 10/930,431 Final Office Action mailed Jul. 11, 2007", 5 pgs.

"U.S. Appl. No. 10/930,431 Final Office Action mailed Aug. 1, 2006", 4 pgs.

"U.S. Appl. No. 10/930,431 Non Final Office Action mailed Jan. 17, 2007", 4 pgs.

"U.S. Appl. No. 10/930,431 Non Final Office Action mailed Feb. 9, 2006", 4 pgs.

"U.S. Appl. No. 10/930,431 Non Final Office Action mailed Aug. 24, 2005", 4 pgs.

"U.S. Appl. No. 10/930,431 Response filed Apr. 12, 2007 to Non Final Office Action mailed Jan. 17, 2007", 13 pgs.

"U.S. Appl. No. 10/930,431 Response filed May 9, 2006 to Non Final Office Action mailed Feb. 9, 2006", 9 pgs.

"U.S. Appl. No. 10/930,431 Response filed Oct. 2, 2006 to Final Office Action mailed Aug. 1, 2006", 16 pgs.

"U.S. Appl. No. 10/930,431 Response filed Dec. 21, 2005 to Non Final Office Action mailed Aug. 24, 2005", 12 pgs.

"U.S. Appl. No. 10/930,516 Non Final Office Action mailed Mar. 8, 2007", 20 pgs.

"U.S. Appl. No. 10/930,516 Notice of Allowance mailed Aug. 10, 2007", 19 pgs.

"U.S. Appl. No. 10/930,516 Response filed Jun. 8, 2007 to Non Final Office Action mailed Mar. 3, 2007", 15 pgs.

"U.S. Appl. No. 10/931,341 Advisory Action mailed Jun. 13, 2006", 3 pgs.

"U.S. Appl. No. 10/931,341 Final Office Action mailed Mar. 24, 2006", 11 pgs.

"U.S. Appl. No. 10/931,341 Non Final Office Action mailed Mar. 8, 2007", 6 pgs.

"U.S. Appl. No. 10/931,341 Non Final Office Action mailed Aug. 29, 2005", 17 pgs.

"U.S. Appl. No. 10/931,341 Non Final Office Action mailed Sep. 13, 2006", 6 pgs.

"U.S. Appl. No. 10/931,341 Response filed May 24, 2006 to Final Office Action mailed Mar. 24, 2006", 15 pgs.

"U.S. Appl. No. 10/931,341 Response filed Jun. 8, 2007 to Non Final Office Action mailed Mar. 8, 2007", 11 pgs.

"U.S. Appl. No. 10/931,341 Response filed Jun. 26, 2006 to Advisory Action mailed Jun. 13, 2006", 15 pgs.

"U.S. Appl. No. 10/931,341 Response filed Nov. 21, 2005 to Non Final Office Action mailed Aug. 29, 2005", 12 pgs.

"U.S. Appl. No. 10/931,341 Final Office Action mailed Sep. 12, 2007", 18 pgs.

"U.S. Appl. No. 10/931,341 Response filed Dec. 13, 2006 to non-final office action mailed Sep. 13, 2006", 11 pgs.

"U.S. Appl. No. 10/931,343, Notice of Allowance mailed Aug. 13, 2007", 5 pgs.

"U.S. Appl. No. 10/931,343, Non-final office action mailed Oct. 26, 2006", 6 pgs.

"U.S. Appl. No. 10/931,343, Non-final office action mailed Nov. 29, 2005", 20 pgs.

"U.S. Appl. No. 10/931,343, Notice of allowance mailed Apr. 23, 2007", 7 pgs.

"U.S. Appl. No. 10/931,343, Response filed Jan. 26, 2007 to non-final office action mailed Oct. 26, 2006", 10 pgs.

"U.S. Appl. No. 10/931,343, Response filed Feb. 20, 2006 to non-final office action mailed Nov. 29, 2005", 11 pgs.

"U.S. Appl. No. 10/931,343 Final Office Action mailed May 15, 2006", 10 pgs.

"U.S. Appl. No. 10/931,343, Non-Final Office Action mailed Oct. 26, 2006", 5 pgs.

"U.S. Appl. No. 10/931,343, Non-Final Office Action mailed Nov. 29, 2005", 8 pgs.

"U.S. Appl. No. 10/931,343, Notice of allowance mailed Apr. 23, 2007", 2 pgs.
"U.S. Appl. No. 10/931,343, Notice of allowance mailed Aug. 13, 2007", 2 pgs.
"U.S. Appl. No. 10/931,343, Response file Jan. 26, 2007 Non Final Office Action mailed Oct. 26, 2006", 10 pgs.
"U.S. Appl. No. 10/931,343, Response filed Feb. 28, 2006 Non-Final Office Action mailed Nov. 29, 2005", 11 pgs.
"U.S. Appl. No. 10/931,343, Response filed Jul. 17, 2006 Final Office Action mailed May 15, 2006", 7 pgs.
"U.S. Appl. No. 10/931,533, Final office action mailed Apr. 4, 2007", 20 pgs.
"U.S. Appl. No. 10/931,533, Notice of allowance mailed Dec. 12, 2006", 7 pgs.
"U.S. Appl. No. 10/931,533, Response filed Jul. 5, 2007 to non-final office action mailed Apr. 4, 2007", 19 pgs.
"U.S. Appl. No. 10/931,533 Non Final Office Action mailed Apr. 4, 2007", 8 pgs.
"U.S. Appl. No. 10/931,533 Notice of Allowance mailed Dec.21, 2006", 4 pgs.
"U.S. Appl. No. 10/931,533 Response filed Jul. 3, 2007 Non-Final Office Action mailed Apr. 4, 2007", 19 pgs.
"U.S. Appl. No. 11/010,529, Response filed Dec. 5, 2006 to non-final office action mailed Sep. 5, 2006", 17 pgs.
"U.S. Appl. No. 11/010,529, Non-Final Office Action mailed Sep. 5, 2006", 14 pgs.
"U.S. Appl. No. 11/010,529, Notice of allowance mailed Feb. 13, 2007", 2 pgs.
"U.S. Appl. No. 11/010,529, Response filed Dec. 5, 2006 to Non-Final Office Action mailed Sep. 5, 2006", 17 pgs.
"U.S. Appl. No. 11/084,968, Restriction Requirement Received Jun. 27, 2007".
"U.S. Appl. No. 11/093,104 Non Final Office Action mailed Jun. 27, 2007", 30 pgs.
"U.S. Appl. No. 11/140,643 Final office action mailed Sep. 13, 2006", 34 pgs.
"U.S. Appl. No. 11/140,643, Non-final office action mailed Mar. 9, 2006", 30 pgs.
"U.S. Appl. No. 11/140,643, Non-final office action mailed Jun. 4, 2007", 30 pgs.
"U.S. Appl. No. 11/140,643, Response filed Jun. 9, 2006 to non-final office action mailed Mar. 9, 2006", 16 pgs.
"U.S. Appl. No. 11/140,643, Response filed Aug. 31, 2007 to Non-final office action mailed Jun. 4, 2007", 13 pgs.
"U.S. Appl. No. 11/197,184, Non-final office action mailed Mar. 13, 2007", 71 pgs.
"U.S. Appl. No. 11/197,184, Response filed Jun. 15, 2007 to non-final office action mailed Mar. 15, 2007", 32 pgs.
"U.S. Appl. No. 11/197,184, Final Office Action Mailed Aug. 21, 2007", FOAR, 48 pgs.
"U.S. Appl. No. 11/213,013, Non-Final Office Action mailed Aug. 9, 2006", 14 pgs.
"U.S. Appl. No. 11/213,013, Response filed Nov. 9, 2006 to non-final office action mailed Aug. 9, 2006", 9 pgs.
"U.S. Appl. No. 11/213,013, Notice of Allowance and Fee(S) Due mailed Aug. 9, 2007", NOAR, 32 pgs.
"U.S. Appl. No. 11/213,013 Final Office Action mailed Feb. 13, 2007", 6 pgs.
"U.S. Appl. No. 11/213,013 Non Final Office Action mailed Aug. 9, 2006", 5 pgs.
"U.S. Appl. No. 11/213,013 Response filed Nov. 8, 2006 to Non Final Office Action mailed Aug. 9, 2006", 9 pgs.
"U.S. Appl. No. 11/213,013, Response filed Mar. 30, 2007 Final Office Action mailed Feb. 13, 2007", 10 pgs.
"U.S. Appl. No. 11/214,693 Non Final Office Action mailed Oct. 31, 2006", 22 pgs.
"U.S. Appl. No. 11/214,693 Notice of Allowance mailed Mar. 5, 2007", 10 pgs.
"U.S. Appl. No. 11/214,693 Response filed Jan. 31, 2007 to Non Final Office Action mailed Oct. 31, 2006", 12 pgs.
"U.S. Appl. No. 11/215,451, Non-final office action mailed Jul. 18, 2007", 53 pgs.

"U.S. Appl. No. 11/216,474 Response to Non Final Office Action mailed May 22, 2007 iled Aug. 21, 2007", 16 pgs.
"U.S. Appl. No. 11/216,474, Non-final office action mailed May 22, 2007", 20 pgs.
"U.S. Appl. No. 11/216,474, Non-final office action mailed Dec. 7, 2006", 36 pgs.
"U.S. Appl. No. 11/216,474, Response filed Feb. 27, 2007 to non-final office action mailed Dec. 7, 2006", 25 pgs.
"U.S. Appl. No. 11/216,474, Response filed Aug. 21, 2007 to Non-final office action mailed May 22, 2007", 16 pgs.
"U.S. Appl. No. 11/427,569 Non-final office action mailed May 29, 2007", 15 pgs.
"U.S. Appl. No. 11/427,569, Response filed Aug. 29, 2007 to Non-Final Office Action mailed May 29, 2007", 11 pgs.
Application Partial File History U.S. Appl. No. 10/420,307 (as of Oct. 30, 2007), 164 pgs.
Application Partial File History U.S. Appl. No. 10/137,058, (as of Oct. 29, 2007), 166 pgs.
Application Partial File History U.S. Appl. No. 10/137,499, (as of Oct. 29, 2007), 185 pgs.
Application Partial File History U.S. Appl. No. 10/163,481, (as of Oct. 25, 2007), 175 pgs.
Application Partial File History U.S. Appl. No. 10/163,686, (as of Oct. 25, 2007), 183 pgs.
Application Partial File History U.S. Appl. No. 10/219,878, (as of Oct. 30, 2007), 55 pgs.
Application Partial File History U.S. Appl. No. 10/233,309, (as of Oct. 25, 2007), 178 pgs.
Application Partial File History U.S. Appl. No. 10/309,583, (as of Oct. 29, 2007), 114 pgs.
Application Partial File History U.S. Appl. No. 10/379,470, (as of Oct. 25, 2007), 230 pgs.
Application Partial File History U.S. Appl. No. 10/430,734, (as of Oct. 25, 2007), 172 pgs.
Application Partial File History U.S. Appl. No. 10/602,315, (as of Oct. 25, 2007), 88 pgs.
Application Partial File History U.S. Appl. No. 10/602,323, (as of Oct. 25, 2007), 140 pgs.
Application Partial File History U.S. Appl. No. 10/789,042, (as of Oct. 25, 2007), 175 pgs.
Application Partial File History U.S. Appl. No. 10/789,044, (as of Oct. 25, 2007), 149 pgs.
Application Partial File History U.S. Appl. No. 10/909,959, (as of Oct. 29, 2007), 152 pgs.
Application Partial File History U.S. Appl. No. 10/926,812, (as of Oct. 25, 2007), 148.
Application Partial File History U.S. Appl. No. 10/930,167, (as of Oct. 24, 2007), 105 pgs.
Application Partial File History U.S. Appl. No. 10/930,431, (as of Oct. 25, 2007), 129 pgs.
Application Partial File History U.S. Appl. No. 10/931,341, (as of Oct. 29, 2007), 148 pgs.
Application Partial File History U.S. Appl. No. 10/931,343, (as of Oct. 25, 2007), 140 pgs.
Application Partial File History U.S. Appl. No. 10/931,533, (as of Oct. 24, 2007), 162 pgs.
Application Partial File History U.S. Appl. No. 11/010,529, (as of Oct. 24, 2007), 141 pgs.
Application Partial File History U.S. Appl. No. 11/093,104, (as of Oct. 29, 2007), 70 pgs.
Application Partial File History U.S. Appl. No. 11/117,121, (as of Oct. 29, 2007), 65 pgs.
Application Partial File History U.S. Appl. No. 11/117,125, (as of Oct. 24, 2007), 44 pgs.
Application Partial File History U.S. Appl. No. 11/213,013, (as of Oct. 25, 2007), 104 pgs.
Application Partial File History U.S. Appl. No. 11/214,693, (as of Oct. 29, 2007), 84 pgs.
Application Partial File History U.S. Appl. No. 11/215,412, (as of IFW Oct. 25, 2007), 43 pgs.
Application Partial File History U.S. Appl. No. 11/215,451, (as of Oct. 29, 2007), 45 pgs.

Application Partial File History U.S. Appl. No. 11/216,474, (as of Oct. 24, 2007), 81 pgs.
Application Partial File History U.S. Appl. No. 11/427,569, (as of Oct. 25, 2007), 66 pgs.
Application Partial File History U.S. Appl. No. 11/459,792, (as of Oct. 25, 2007), 45 pgs.
Application Partial File History U.S. Appl. No. 11/493,074, (as of Oct. 25, 2007), 49 pgs.
Application Partial File History U.S. Appl. No. 11/453,112, (as of Oct. 29, 2007), 44 pgs.
Application Partial File History U.S. Appl. No. 11/566,038, (as of Oct. 24, 2007), 37 pgs.
Application Partial File History U.S. Appl. No. 11/566,042, (as of Oct. 24, 2007), 47 pgs.
Application Partial File History U.S. Appl. No. 11/584,229, (as of Oct. 25, 2007), 54 pgs.
Application Partial File History U.S. Appl. No. 11/598,437, (as of Oct. 25, 2007), 65 pgs.
Application Partial File History U.S. Appl. No. 11/608,281, (as of Oct. 29, 2007), 46 pgs.
Application Partial File History U.S. Appl. No. 11/608,286, (as of Oct. 24, 2007), 43 pgs.
Morais, J., et al., Composition, atomic transport, and chemical stability of ZrAlxOy ultrathin films deposited on Si(001), *Applied Physics Letters, 79(13)*, (Sep. 24, 2001), 1998-2000.
"U.S. Appl. No. 10/229,903 Partial Prosecution History (as of Nov. 28, 2007)", (as of Nov. 28, 2007), 140 pgs.
"U.S. Appl. No. 11/197,184 Response filed Nov. 19, 2007 to Final Office Action mailed Aug. 21, 2007", (Nov. 19, 2007), 32 pages.
"U.S. Appl. No. 10/909,959, Response filed Nov. 8, 2007 to Final Office Action mailed Aug. 8, 2007", 13 pages.
"U.S. Appl. No. 10/930,167 Response filed Oct. 3, 2007 to Restriction Requirement mailed Oct. 4, 2006".
"U.S. Appl. No. 10/930,167 Restriction Requirement mailed Oct. 4, 2006", 4 pgs.
"U.S. Appl. No. 10/930,431, Response filed Nov. 11, 2007 to Final Office Action", 11 pages.
"U.S. Appl. No. 10/931,341, Response filed Nov. 13, 2007 to Final Office Action mailed Sep. 12, 2007", 12 pages.
"U.S. Appl. No. 11/010,529 Notice of Allowance mailed Feb. 13, 2007", 4 pages.
"U.S. Appl. No. 11/117,125 Restriction Requirement mailed Oct. 31, 2007", 6 pgs.
"U.S. Appl. No. 11/215,578 Response to Restriction Requirement mailed Nov. 9, 2007", 13.
"U.S. Appl. No. 11/215,578 Restriction Requirement mailed", 4 pgs.
"U.S. Appl. No. 11/216,474 Non Final Office Action mailed Dec. 7, 2006", 16 pages.
"U.S. Appl. No. 11/216,474 Notice of Allowance mailed Nov. 7, 2007", 4 pages.
"U.S. Appl. No. 11/216,474 Response filed Oct. 13, 2006 to Response filed Oct. 13, 2006 to Restriction Requirement mailed Sep. 13, 2006", 11 pages.
"U.S. Appl. No. 11/216,474 Response filed Aug. 21, 2007 to Non Final Office Action mailed Dec. 7, 2006", 16 pages.
"U.S. Appl. No. 11/216,474 Restriction Requirement mailed Sep. 13, 2006".
"U.S. Appl. No. 11/216,474, Notice of Allowance mailed Nov. 7, 2007", 7 pages.
"U.S. Appl. No. 11/427,569 Notice of Allowance mailed Nov. 15, 2007", 4 pages.
"U.S. Appl. No. 11/215,451, Final Office Action mailed Nov. 7, 2007", 18.
Ahn, et al., "Ald Of Zr-Substituted BaTiO3 Films as Gate Dielectrics", *U.S. Appl. No. 11/498,559, filed Aug. 3, 2006*.
Ahn, K Y., "Atomic Layer Deposited Barium Strontium Titanium Oxide Films", *U.S. Appl. No. 11/510,803, filed Aug. 26, 2006*.
Ahn, Kie Y., "Atomic Layer Deposition of GDSC03 Films as Gate Dielectrics", *U.S. Appl. No. 11/215,507, filed Aug. 30, 2005*, 05-0665.
Ahn, Kie Y., "Cobalt Titanium Oxide Dielectrics Films", *U.S. Appl. No. 11/216,958, filed Aug. 31, 2005*, 05-0523.
Ahn, Kie Y., et al., "Hafnium Lanthanide Oxynitride Films", *U.S. Appl. No. 11/515,143, filed Aug. 31, 2006*.

Ahn, Kie Y., "Magnesium-Doped Zinc Oxide Structures and Methods", *U.S. Appl. No. 11/706,820, filed Feb. 13, 2007*.
Ahn, Kie Y., et al., "Methods to Form Dielectric Structures in Semiconductor Devices and Resulting Devices", *U.S. Appl. No. 11/581,675, filed Aug. 16, 2006*.
Ahn, Kie Y., "Molybdenum-Doped Indium Oxide Structures and Methods", *U.S. Appl. No. 11/709,944, filed Feb. 13, 2007*.
Ahn, Kie Y., et al., "Tungsten-Doped Indium Oxide Structures and Methods", *U.S. Appl. No. 11/706,498, filed Feb. 13, 2007*.
Ahn, Kie Y., et al., "Zirconium-Doped Zinc Oxide Structures and Methods", *U.S. Appl. No. 11/707,173, filed Feb. 13, 2007*.
Algers, G.B., et al., "Intermixing at the tantalum oxide/silicon interface in gate dielectric structures", *Applied Physics Letters, 73(11)*, (Sep. 14, 1998), 1517-1519.
Atanassova, E., et al., "Breakdown Fields and Conduction Mechanisms in thin Ta2O5 Layers on Si for high density DRAMs", *Microelectronics Reliability, 42*, (2002), 157-173.
Forbes, "Hafnium Aluminium Oxynitride High-K Dielectric and Metal Gates", *U.S. Appl. No. 11/514,558, filed Aug. 31, 2006*.
Forbes, "Hafnium Tantalum Oxynitride High-K Dielectric and Metal Gates", *U.S. Appl. No. 11/515,114, filed Aug. 31, 2005*.
Forbes, Leonard, et al., "Silicon Lanthanide Oxynitride Films", *U.S. Appl. No. 11/514,533, filed Aug. 31, 2006*.
Forbes, et al., "Tantalum Aluminum Oxynitride High-K Dielectric and Metal Gates", *U.S. Appl. No. 11/514,655, filed Aug. 31, 2006*.
Forbes, Leonard, et al., "Tantalum Silicon Oxynitride High-K Dielectric and Metal Gates", *U.S. Appl. No. 11/514,601, filed Aug. 31, 2006*.
Dover, V., et al., "Deposition of Uniform Zr-Sn-Ti-O Films by On-Axis Reactive Sputtering", *IEEE Electron Device Letters, vol. 19, No. 9*, (Sep. 1998), 329-331.
Forbes, Leonard, "Memory Utilizing Oxide-Conductor Nanolaminates", *U.S. Appl. No. 11/496,196, filed Jul. 31, 2006*, 58 pgs.
Jones, A. J., et al., "Some recent developments in the MOCVD and ALD of high k dielectric oxides", *J. of Materials Chemistry, par. 3.2*, (Sep. 2004), 3109.
Nieminen, Minna, et al., "Growth of gallium oxide thin films from gallium acetylacetonate by atomic layer deposition", *J. Mater. Chem., 6(1)*, (1996), 27-31.
Chen, F., et al., "Hafnium Titanate as a High-K Gate Insulator", *Electrochemical Society Proceedings, vol. 2004-01*, (2004), 278-285.
Domagala, R. F., et al., "The Pseudobinary Ti-Zr-O2", *J. Am. Ceramic Soc., vol. 56*, Paper first presented in 1970, (1973), 584-587.
Miko, R., et al., "Atomic layer Deposition of Oxide Thin Films with Metal Alkoxides as Oxygen Sources", *Science 288(5465)*(Apr. 14, 2000), 319-321.
Nabatame, T., et al., "Design and Proof of high quality HfA10/sub x/film formation for MOSCAPs and nMOSFETs through Layer-by Layer Deposition and Annealing process", *VLSI Technology, 2003. Digest of Technical Papers. 2003 Symposium*, (Jun. 10-12, 2003), 25-26.
Robertson, John, "Band offsets of wide-band-gap oxides and implications for future electronic devices", *Journal of Vacuum Science & Technology B: Microelectronics and Nanometer Structures, 18(3)*, (May 2000), 1785-1791.
Ruh, Robert, et al., "Phase Relations and Thermal Expansion in the System HfO2-TiO2", *J. Am. Ceramic Soc., 59*, (Nov.-Dec. 1976), 495-499.
Smith, Ryan C, "Chemical vapour deposition of the oxides of titanium, zirconium and hafnium for use as high-k materials in microelectronics devices. A carbon-free precursor for the synthesis of hafnium dioxide", *Advanced Materials for Optics and Electronics, 10(3-5)*, (May-Oct. 2000), 105-106.
Duenas, et al., "Interface Quality of High-Pressure Reactive Sputterd and Atomic Layer Deposited Titanium oxide Thin Films on Silicon", *IEEE Transaction, Spanish Conference on Electronic Devices*, (Feb. 2-4, 2005), 49-52.
Kingon, Angus I., et al., "Alternative dielectrics to Silicon dioxide for Memory and Logic Devices", *Nature, vol. 406*, (Aug. 31, 2000), 1032-1038.

Kukli, Kaupo, "Tailoring the dielectric properties of $HfO_2$ -$Ta_2O_3$ nanolaminates", *Appl. Phys. Lett.*, 68, (1996), 3737-3739.

Yu, Xiongfei, et al., "High Mobility and Excellent Electrical Stability of MOSFETs Using a Novel HfTaO Gate Dielectric", *2004 Symposium on VLSI Technology Digest of Technical Papers*, (Jun. 15-17, 2004), 110-111.

Morais, J., et al., "Composition, atomic transport and chemical stability of ZrAlxOy ultrathin films deposited on Si(001)", *Applied Physics letter*, vol. 79(13), (2001), 1998.

US 6,827,790, 12/2004, Gealy et al. (withdrawn)

* cited by examiner

ATOMIC LAYER DEPOSITION AND CONVERSION

This application is a Divisional of U.S. application Ser. No. 10/137,058, filed May 2, 2002 which is incorporated herein by reference.

FIELD OF THE INVENTION

The present invention relates to deposition techniques and, more particularly, to deposition techniques for forming thin films on wafers or substrates and then converting the films into a different another composition.

BACKGROUND OF THE INVENTION

Integrated circuits (IC) are often fabricated with one or more semiconductor devices, which may include diodes, capacitors, and different varieties of transistors. These devices are generally fabricated by creating thin films of various materials, e.g. metals, semiconductors or insulators, upon a substrate or semiconductor wafer. Wafer and substrate are used interchangeably to refer to semiconductor structures during processing, and may include other layers that have been fabricated thereon. The physical characteristics and tightly controlled placement of films on a substrate will define the performance of the semiconductor device and its surrounding circuitry. Many semiconductor devices require a dielectric layer that must be reliable. Specifically, the dielectric layer must be essentially free from defects that cause shorting through the dielectric layer. Oxides and nitrides are used to form dielectric layers in semiconductor devices.

One process for forming metal oxide thin films on semiconductor wafers is chemical vapor deposition ("CVD"). CVD is used to form a thin film of a desired material from a reaction of vapor-phase chemicals containing the chemical constituents of the material. CVD processes operate by confining one or more semiconductor wafers in a reaction chamber. The chamber is filled with one or more gases that surround the wafer. The gases for the deposition of metal oxides includes a metal precursor and a reactant gas, e.g. water vapor, to be introduced into the chamber at the same time. Energy is supplied within the chamber and particularly to the reactant gases near the wafer surface. A typical energy is heat applied to the substrate. The energy activates the reactant gas chemistry to deposit a film from the gases onto the heated substrate. Such chemical vapor deposition of a solid onto a surface involves a heterogeneous surface reaction of the gaseous species that adsorb onto the surface. The rate of film growth and the quality of the film depend on the process conditions. Unfortunately, the metal precursor and the reactant gas also react during the gas phase remote from the substrate. Such a gas phase reaction produces contaminants and/or involve a significant quantity of precursor so that an insufficient amount is available for deposition on the substrate. As a result, the gas phase reaction may become dominant and the thin film coverage is poor. That is, pinholes may be formed in the resulting metal oxide layer. Moreover, using water ($H_2O$) gas as the reactant gas results in impurities, such as hydroxide (OH), remaining in the resulting metal oxide layer.

Semiconductor fabrication continues to advance, requiring finer dimensional tolerances and control. Modem integrated circuit design has advanced to the point where line width may be 0.25 microns or less. As a result, repeatability and uniformity of processes and their results is becoming increasingly important. Generally, it is desired to have thin films deposited on the wafer to save space. Yet reducing the thickness of films can result in pinholes and in less mechanical strength.

Another development in the field of thin film technology for coating substrates is atomic layer deposition (ALD). A description of ALD is set forth in U.S. Pat. No. 5,879,459, which is herein incorporated by reference in its entirety. ALD operates by confining a wafer in a reaction chamber at a typical temperature of less than 300 degrees C. Precursor gas is pulsed into the chamber, wherein the pulsed precursor forms a monolayer on the substrate by chemisorption. The low temperature limits the bonding of the precursor to chemisorption, thus only a single layer, usually only one atom or molecule thick, is grown on the wafer. Each pulse is separated by a purge pulse which completely purges all of the precursor gas from the chamber before the next pulse of precursor gas begins. Each injection of precursor gas provides a new single atomic layer on the previously deposited layers to form a layer of film. Obviously, this significantly increases the time it takes to depose a layer having adequate thickness on the substrate. As a numerical example, ALD has a typical deposition rate of about 100 Å/min and CVD has a typical deposition rate of about 1000 Å/min. For at least this reason, ALD has not met with widespread commercial acceptance.

In light of the foregoing, there is a need for fabrication of thin films which are thinner and have a reduced number of defects.

SUMMARY OF THE INVENTION

The above mentioned problems with thin film fabrication techniques are addressed by the present invention and will be understood by reading and studying the following specification. Systems and methods are provided for fabricating thin films on substrates. The fabrication technique of the present invention grows a thin film by atomic layer deposition and then converts the film to produce a thin film having a different composition than the ALD deposited film. In an embodiment, each ALD thin film is converted before a subsequent ALD film is deposited. In one embodiment of the invention, a metal film is deposited by ALD. The metal film is then oxidized to produce a metal oxide film. In an embodiment, the metal is aluminum. In an embodiment, the metal is titanium. In an embodiment, the metal is tantalum.

In an embodiment, the thin film formed by atomic layer deposition is converted from an essentially pure metal film to a compound film that includes the metal and at least one second element. In an embodiment, the second element is oxygen. In an embodiment, the compound film is an oxide. In an embodiment, the second element is nitrogen. In an embodiment, the compound film is a nitride. In an embodiment, the second element is boron. In an embodiment, the compound film is a boride. In an embodiment, the second element is carbon. In an embodiment, the compound film is a carbide. In an embodiment, the second element is fluorine. In an embodiment, the compound film is a fluoride.

In an embodiment, a laminate or compound layer having at least two compounds in the layer is formed. The first element layer is deposited by ALD. This layer is then converted to a compound. A second element layer is deposited by ALD. This layer is then converted to a compound. In an embodiment, both the first and second elements are deposited by ALD and then both elements are converted. In an embodiment, one of the first element layer and second element layer is deposited by ALD and not converted. If the one layer includes a compound, then it is deposited by ALD in its compound form. The other of the first element layer and the second element layer is converted.

Additional embodiments of the invention include deposition devices and systems for forming metal oxide films on substrates, and machine readable media having fabrication instructions stored thereon, all according to the teachings of the present invention as described herein.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE EMBODIMENTS

Figure 1:
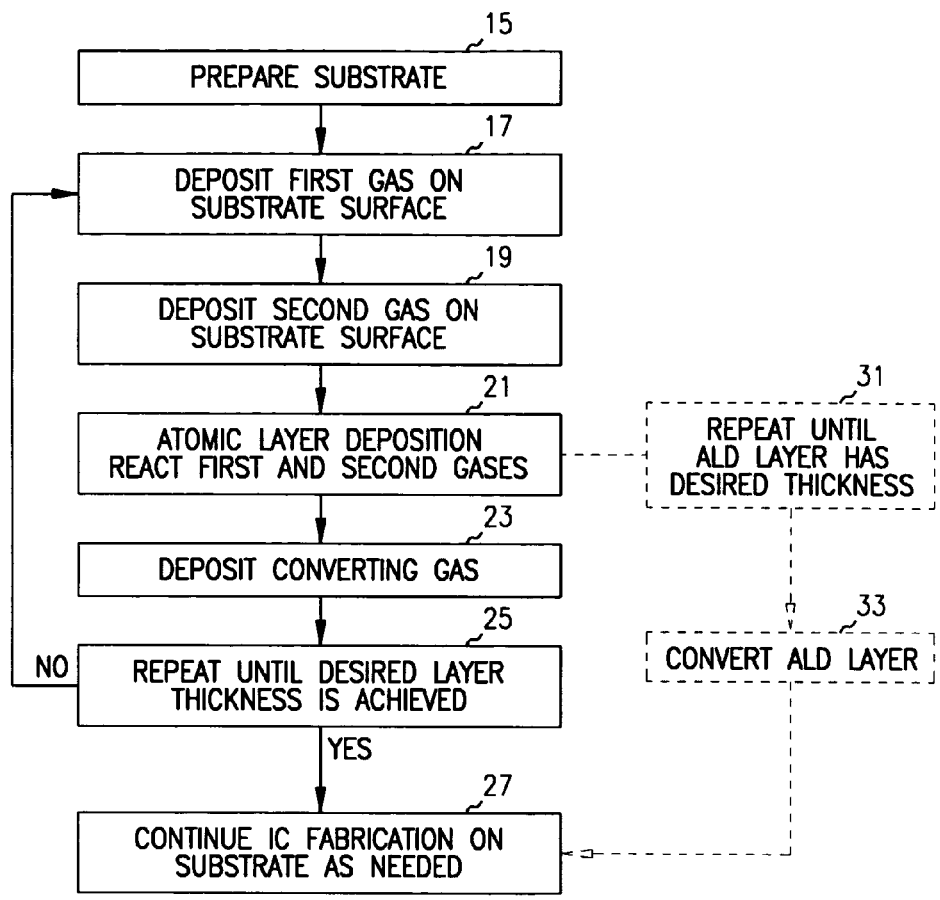
FIG. 1 is a flow chart of the deposition process of an embodiment of the invention.

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface onto which a layer is deposited according to the present invention, for example to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

According to the teachings of the present invention, fabrication of films on substrates, devices and systems for such fabrication, media containing instructions therefor, and integrated circuits produced according to the present invention are described.

The use, construction and fundamental operation of reactors for deposition of films are understood by those of ordinary skill in the art of semiconductor fabrication. The present invention may be practiced on a variety of such reactors without undue experimentation. Furthermore, one of ordinary skill in the art will comprehend the necessary detection, measurement, and control techniques in the art of semiconductor fabrication as well as the more inclusive art of industrial processing for producing films on substrates upon reading the disclosure.

It will be understood that the terms "precursor" and "reactant" are used herein to differentiate between a chemical compound that includes a metal component to be deposited on a substrate and a gas which reacts with the compound to deposit the metal component on a wafer. This nomenclature is used herein as a tool to clearly describe the invention as both the "precursor" and the "reactant" chemically react with each other to form the desired film on the substrate. Accordingly, the term "precursor" is not intended to imply a time relationship with the "reactant" unless explicitly described.

Applicant hereby incorporates by reference copending U.S. patent application Ser. No. 09/782,207, which is assigned to the assignee of the present application.

FIG. 1 depicts an atomic layer deposition (ALD) process according to the teachings of the present invention. A substrate is prepared to receive a compound layer, step 15. This includes forming required layers, trenches, oxides such as field oxides and other structures on the base surface of a wafer. In an embodiment, the compound layer is a metal nitride. In an embodiment, the compound layer is a carbide. In an embodiment, the compound layer is a boride. In an embodiment, the compound layer is a fluoride. When depositing a dielectric layer for a capacitor, a field insulator is formed on the wafer. The field insulator is etched to form a trench. A bottom electrode layer is deposited in the trench. Thereafter, the dielectric layer, e.g., metal oxide or metal nitride, is deposited on the bottom electrode layer according to the teachings of the present invention. After the dielectric is formed a top electrode layer is deposited on the dielectric layer. The remaining structure for the integrated circuit is then formed. When depositing a gate oxide for a transistor, the source and drain are formed in the substrate. A gate insulator, e.g., metal oxide, layer is formed on the substrate intermediate the source and drain according to the teachings of the present invention. Thereafter, the gate is formed on the gate insulator. The remaining structure for the integrated circuit is then formed. Step 17 is the first step in the ALD process. A first gas flows into a reaction chamber containing the substrate. The first gas is deposited at the surface of the substrate.

The first gas includes a first element that forms part of the desired compound. In an embodiment, the first gas includes titanium. In an embodiment, the titanium is a $TiCl_4$ gas. In an embodiment, the first gas includes tantalum. In an embodiment, the tantalum is a $TaCl_5$ gas. In an embodiment, the first gas includes aluminum. In an embodiment, the aluminum is a trimethylaluminum (TMA) gas. A second gas flows into the chamber containing the substrate and first gas, step 19. The second gas is deposited at the surface of the substrate. The second gas includes a reactant element that will react with the first gas to deposit a first-element containing layer on the substrate. In an embodiment, the second gas is activated hydrogen. In an embodiment, the second gas is not $H_2O$. The first and second gases are reacted in an ALD reaction to form a monolayer of metal film, step 21, in an embodiment. In this embodiment of ALD, the monolayer of metal film formed by the first and second gases is only about one molecule in thickness. The monolayer is an essentially pure layer of the first element. Essentially pure is defined as greater than 99% pure. In a more desirable embodiment, essentially pure is greater than 99.9% pure, plus or minus about 0.1%. In an even more desirable embodiment, essentially pure is greater than 99.99% pure, plus or minus 0.01%. In another embodiment of ALD, the first and second gases react to form a layer that is greater than a monolayer. After the ALD layer is formed on the substrate, the ALD layer is exposed to a reacting gas, step 23. The reacting gas converts the ALD layer containing the first element into a compound containing the first element and at least a second element from the reacting gas. In an embodiment, the reacting gas includes oxygen. In an embodiment, the oxidizing gas is dioxide ($O_2$). In an embodiment, the oxidizing gas is ozone ($O_3$). In an embodiment, the oxidizing gas is nitrogen oxide ($N_2O$). In an embodiment, the oxidizing gas is activated oxide (O*). When the metal monolayer is titanium, then the oxidizing gas converts the titanium monolayer to $ATiO_3$, where A denotes Ba or Sr or both. When the metal monolayer is tantalum, then the oxidizing gas converts the tantalum monolayer to $Ta_2O_5$. When the metal monolayer is aluminum, then the oxidizing gas converts the aluminum monolayer to lumina ($Al_2O_3$). The process is repeated, step 25, until the desired thickness of the final layer of the first and second elements is formed. The process returns to step 17 to begin forming another ALD layer or monolayer of a first element, which is then converted, according to the teachings of the present invention. In an embodiment, the first element is a metal and the second element is oxygen. After the final layer has the desired thickness, then additional integrated circuit fabrication processes are performed on the substrate as needed, step 27.

FIG. 1 also shows an embodiment of the present invention in broken line. Steps 15, 17, 19 and 21 are the same as described above. This embodiment repeats the ALD steps 17, 19, 21 until the ALD layer has the final, desired thickness, step 31. Thereafter, the ALD deposited layer is converted, step 33. In an embodiment, converting includes reacting the ALD layer with at least one second element to transform the ALD layer (single element layer) into a compound layer (multiple element layer). In an embodiment, reacting is oxidizing. In an embodiment, the first element is a metal. The process then proceeds, if needed, to step 27.

Figure 2A:
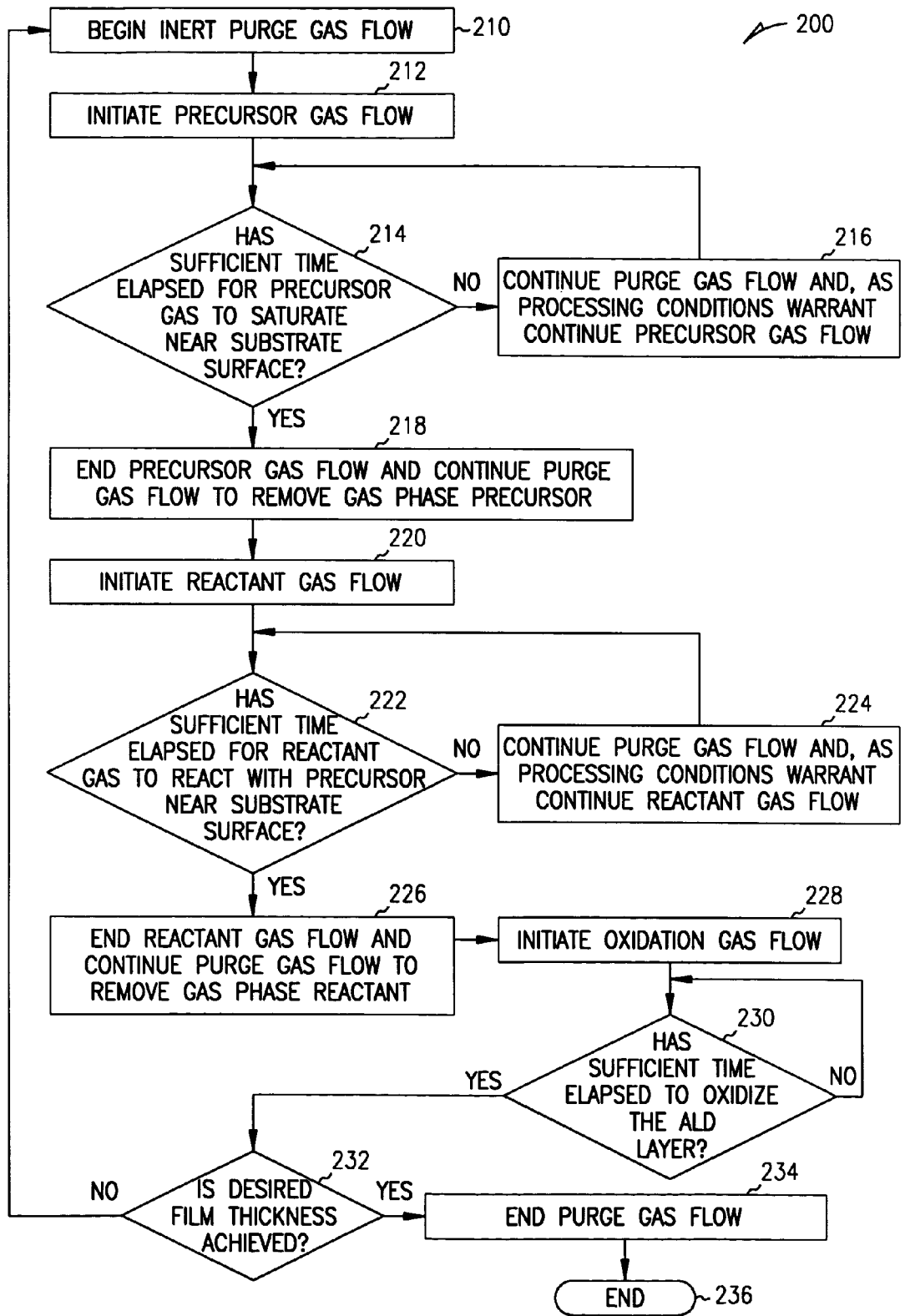
FIG. 2A is a flowchart of the deposition process of an embodiment of the invention.

FIG. 2A shows an ALD process 200 according to the teachings of the present invention. ALD process 200, in the illustrated embodiment, begins by initiating an inert purge gas flow through a reactor (210). The purge gas maintains the chamber at a generally constant pressure. In one embodiment of the present invention the purge gas flow is pulsed, for example only injecting purge gas between other gas pulses. In another embodiment, purge gas is not used at all, i.e. step 210 is not performed.

The precursor gas containing a first element, e.g., metal, to be deposited on the substrate now flows into the reaction chamber (212). The metals include, for example, titanium, tantalum, or aluminum. The metals can also include alloys of these metals or other metal that one of ordinary skill would deposit on a substrate. The precursor gas flow continues until a volume closely adjacent the surface of the substrate on which the metal will be deposited is saturated by the precursor gas (214). According to the teachings of the present invention, the precursor gas saturates the topology of the substrate so that adequate precursor material is adjacent the substrate surface by the precursor gas entering and filling the steps, trenches, and holes. One of ordinary skill will understand the same upon reading the disclosure. The precursor gas flow, as well as purge gas flow if present, continues until the required saturation occurs depending on the processing conditions dictated by the type of substrate and precursor gas, and the topology of the substrate (216). A substrate having numerous or high aspect steps may require a longer precursor gas flow period than a substrate which has few steps or relative low aspect steps Precursor gas flow ends once the precursor gas saturates adjacent the substrate according to the processing conditions of the present deposition (218). After or substantially at the same time precursor gas flow is stopped, reactant gas flow (for example, activated hydrogen) begins in the reaction chamber (220). Reactant gas continues to flow into the reaction chamber until the reactant gas saturates the volume adjacent the surface of the substrate on which the substance in the precursor gas will be deposited (222). The precursor gas and the reactant gas chemically react and deposit the desired material in a ALD layer, e.g., monolayer, on the substrate. In an embodiment, the deposited monolayer is about one atomic layer thick. In an embodiment, the deposited ALD layer is more than one atomic layer thick. The monolayer and the ALD layer are an essentially pure layer of a single element.

The present process may continue the purge gas flow while the reactant gas flows into the reaction chamber (224). Once a sufficient quantity of reaction gas is present to complete the reaction with the precursor to deposit a layer on the substrate, reaction gas flow ends (226). Purge gas flow may continue to partially flush the residual reaction and precursor gases and the by-product gas of the precursor and reactant reaction from the reaction chamber. A converting gas flows into the reaction chamber (228). The converting gas includes an oxidizing gas. The oxidizing gas oxidizes the monolayer, which is a metal, to form a dielectric layer. The oxidation continues until sufficient time has elapsed to oxidize essentially all of the metal monolayer (230). If the monolayer is not sufficiently oxidized the process continues flowing the oxidizing gas to the metal monolayer. Once the monolayer is sufficiently converted, e.g., oxidized, then the process proceeds to step 232. At step 232, it is determined if the converted layer formed by the previous steps has the desired film thickness. If the converted formed by one or a plurality of the ALD and conversion steps of the present invention has the desired thickness, then the ALD and conversion process of the present invention ends. If purge gas is still flowing, then the purge gas flow ends (234) usually after the remnants of the precursor, reactant, and by-product gases are purged from the chamber. The process of the present invention terminates at box 236. The reader should note that process termination may comprise initiation of further processing and does not necessarily require shutdown of the reactor, e.g. the above sequence of steps can be repeated or additional fabrication steps are performed. While one embodiment of the invention includes all of the above steps, the present invention includes other embodiments which do not include all of the above steps.

If the desired thickness of the layer has not been achieved (222), then the process returns to step 210 or step 212 and begins another cycle. The process then reiterates the above sequence/process until step 232 determines that the converted layer has the desired thickness.

Figure 2B:
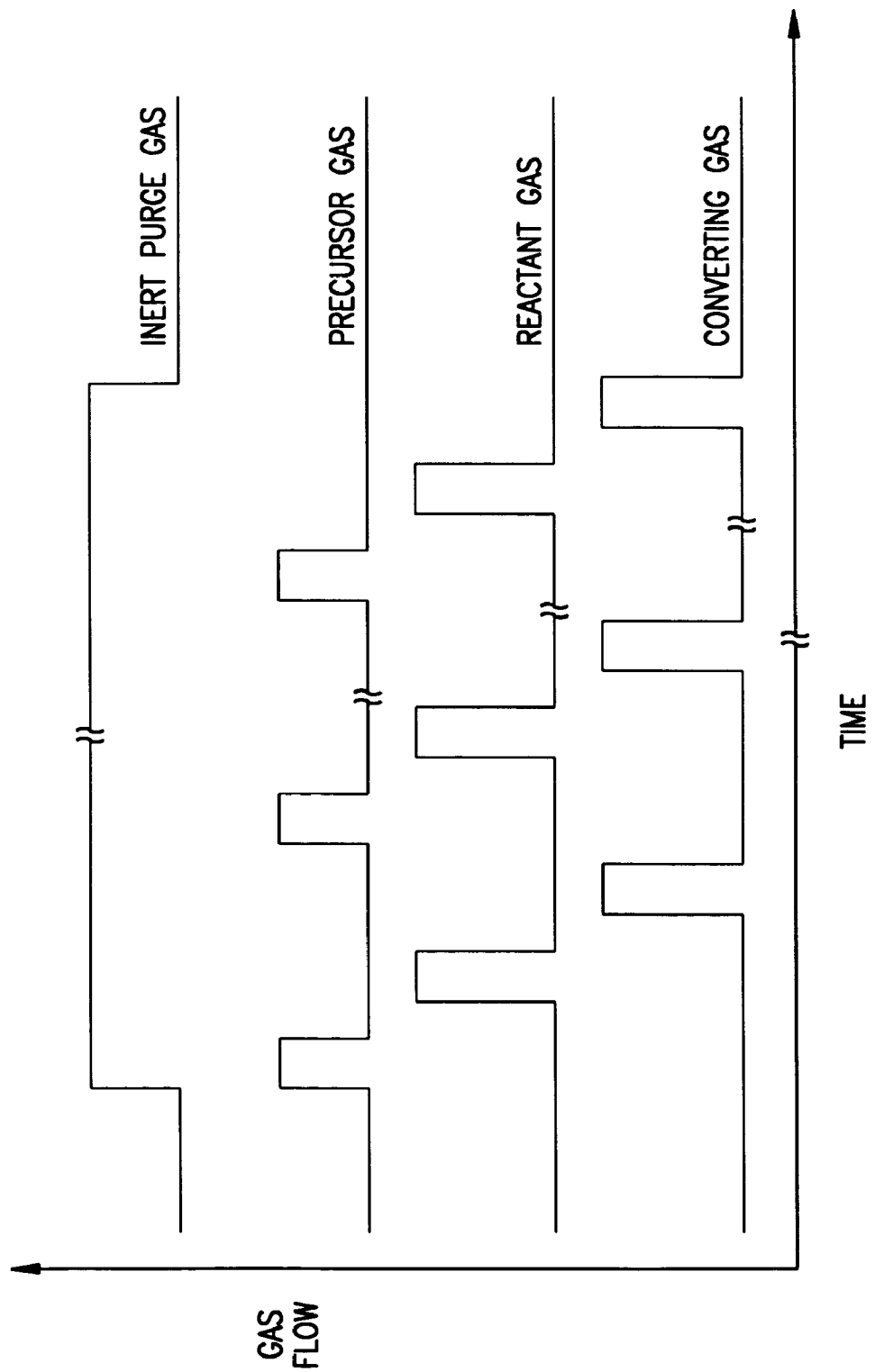
FIG. 2B is a time graph of a deposition process of the present invention.

One embodiment of the present inventive process is shown in FIG. 2B. The process begins with the flow of an inert purge gas and a precursor gas containing the first element into the reaction chamber. The precursor gas flows into the chamber until a sufficient quantity of the element that will form the monolayer is adjacent the substrate as determined by stoichiometry of the particular reaction needed to deposit the desired film on the substrate. The precursor must include a certain minimum amount of the first element to be deposited on a wafer and other reactive components that assist in the depositing the first element on the wafer. The precursor may flow into the reactor in a quantity greater than determined by the stoichiometry of the reaction. In this embodiment, the precursor gas flow ends followed by a short period of only purge gas flow. The reactant gas flows into the chamber until a sufficient quantity of reactant gas is available to react with the precursor at the surface of the substrate to deposit the desired first element film. An embodiment of the reactant gas include activated H. Like the precursor gas flow, the reactant gas and its flow reaches or exceeds the quantity that is determined by the stoichiometry of the particular reaction. Thereafter, the reactant gas flow stops. After the reactant gas flow stops, the converting gas flows into the reaction chamber. In an embodiment, the converting gas is an oxidizing gas and the first element monolayer is a metal. Accordingly, the metal monolayer on the substrate is oxidized. Thereafter, the flow of converting gas stops. This process is repeated until a converted film of a desired thickness is deposited on the substrate.

The converting gas includes an activated element that reacts with the ALD deposited layer. In an embodiment, the converting gas includes an activated oxygen. In an embodiment, the converting gas includes activated $NH_3$. In an embodiment, the converting gas includes activated $N_2O$.

The amounts of the precursor gas, the reactant gas, or the converting gas meets or exceeds the amount of material required by the stoichiometry of the particular reaction. That is, the amount of precursor, reactant, converting gas flow, in certain embodiments, provides excess mass in the reactor. The excess mass is provided to ensure an adequate reaction at the surface of the wafer. In this embodiment, the ratio of precursor, reactant, or converting components in the gas phase usually is different than the stoichiometry of the film.

Figure 3:
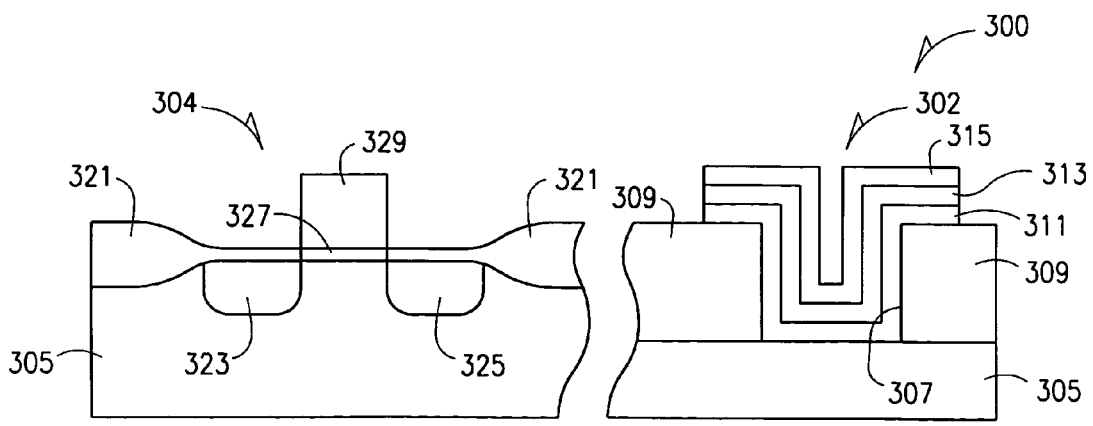
FIG. 3 is a view of a thin film of the present invention as a dielectric layer in a capacitor and as a gate layer in a transistor.

FIG. 3 shows an integrated circuit 300 including a layer formed according to the teachings of the present invention. The layer is a dielectric in a capacitor 302. The layer is a gate insulator in a transistor 304. It is within the scope of the present invention to form the dielectric layer and gate insulator layer for both elements at the same time. It is within the scope of the present invention to form the dielectric layer for the capacitor and the gate insulator layer for the transistor at different times during fabrication. Capacitor 302 is formed on substrate 305. In an embodiment, a trench 307 is formed in insulator layer 309. A bottom electrode layer 311 is formed in the trench 307. A dielectric layer 313 is formed, according to the teachings of the present invention, on the bottom electrode layer 311. A top electrode layer 315 is formed on the dielectric layer 313. The transistor 304 is also formed on substrate 305.

A field oxide 321 is formed on the substrate 305. The source and drain regions 323 and 325 are doped into the substrate 305. A gate insulator, e.g. an oxide or a nitride, layer 327 is formed according to the teachings of the present invention on the substrate 305 intermediate the source and drain regions 323 and 325. A gate 329 is formed on the gate insulator layer 327.

Dielectric layer or gate insulator layer 313 or 327 is a metal oxide material having a composition that includes the form $MOx$. In one embodiment, the metal component M is a refractory metal. In an embodiment, the refractory metal is tantalum (Ta). In an embodiment, the refractory metal is titanium (Ti). In an embodiment, the refractory metal is tungsten (W). The refractory metals of chromium (Cr), cobalt (Co), hafnium (Hf), molybdenum (Mo), niobium (Nb), vanadium (V) and zirconium (Zr) are included in some embodiments. Benefits may be derived by matching the metal oxide layer to the adjacent metal-containing electrode. For example, the $TaOx$ layer 313 or 327 can be grown on a tantalum containing bottom electrode layer.

Figure 4:
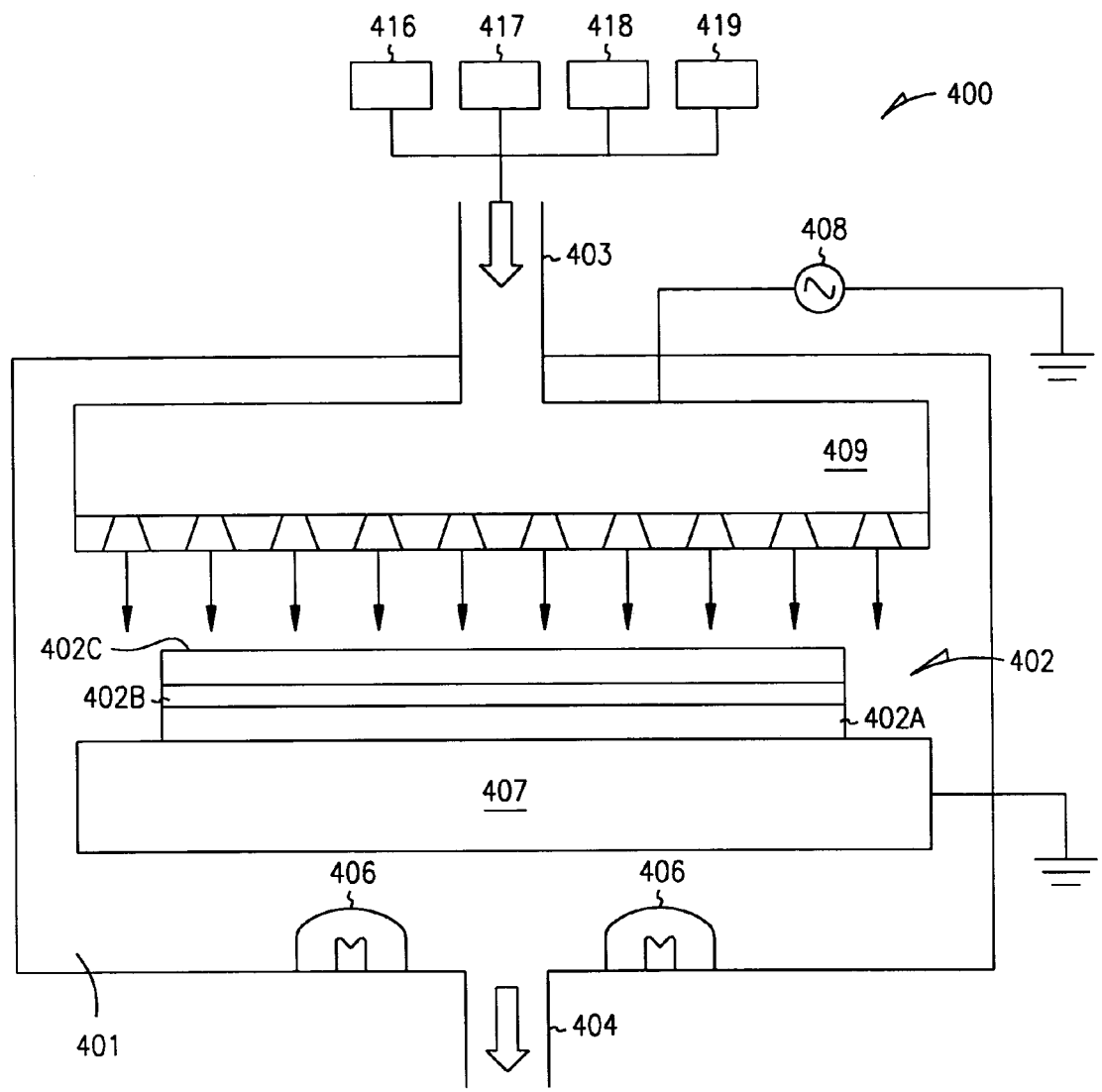
FIG. 4 is a view of a reactor for use with the process of the present invention.

FIG. 4 depicts one embodiment of an atomic layer deposition (ALD) reactor 400 suitable for practicing the present invention. FIG. 4 is provided for illustrative purposes and the invention may be practiced with other reactors. The embodiment shown in FIG. 4 includes a chamber 401 that is a pressure-sealed compartment for mounting a substrate 402 on susceptor 407. Chamber 401 is typically manufactured from aluminum and is designed to contain a low-pressure environment around substrate 402 as well as to contain process gases, exhaust gases, and heat or plasma energy within chamber 401. The illustrated substrate 402 includes a substrate base 402A on which are deposited first and second layers 402B and 402C. Inlet gas manifold 403 supplies process gases, for example precursor gases, reactant gases and converting gases, at a controlled flow rates to substrate 402. A source of precursor gas 416 is connected to manifold 403. A source of purge gas 417 is connected to manifold 403. A source of reactant gas 418 is also connected to manifold 403. A source of converting gas 419 is also connected to manifold 403. Carrier gases, such as helium, argon or nitrogen, may also be supplied in conjunction with the gases supplied by the manifold as is known and understood by one of ordinary skill in the art. Chamber 401 also incorporates a pumping system (not shown) for exhausting spent gases from chamber 401 through exhaust port 404.

ALD reactor 400 includes means for supplying energy to the reactable constituents or compounds in the process gases in chamber 401 on the surface of the substrate 402. The supplied energy causes the reactable constituents to react or decompose and deposit a thin film onto an upper surface of substrate 402. In one embodiment, the supplied energy includes thermal energy supplied by heat lamps 406. In the illustrated example, lamps 406 are positioned in the base of chamber 401. Heat lamps 406 emit a significant amount of near-infra red radiation that passes through susceptor 407 to heat substrate 402. Alternatively, susceptor 407 is heated by heat lamps 406 and substrate 402 is heated by conduction from susceptor 407. The heat lamps 406 may be placed at alternate locations according to the parameters of the specific deposition process being performed according to the present invention.

Another embodiment supplies reaction energy by a radio frequency (RF) generator 408 as shown in FIG. 4. RF generator 408 creates a RF field between substrate 402 and an anode. In the embodiment shown in FIG. 4, susceptor 407 is grounded while the RF signal is applied to a process gas manifold 409. Alternative and equivalent ALD reactor designs will be understood by reading the disclosure. An RF anode may be provided separately (not shown) and process gas manifold 409 may be electrically isolated from the RF supply. For example, the RF signal is applied to susceptor 407 and process gas manifold 409 is grounded.

In general, the energy sources 406 and 408 are intended to provide sufficient reaction energy in a region near the surface of substrate 402 to cause decomposition and/or reaction of the constituents of the present gas to deposit the first element, e.g., the metal species, in the process gases onto a surface of the substrate. One of ordinary skill in the art will understand upon reading the disclosure that any one, combination, or equivalent of the above can be employed to provide the necessary reaction energy.

One embodiment includes plasma reactors because these allow film deposition at lower temperatures and are used in the semiconductor industry. However, some reactant constituents in the process gases may deposit at low temperatures using only thermal energy or other energy sources. Hence, the invention encompasses reactor designs using any energy source including either thermal heating, RF plasma, or the like.

ALD reactor 400 is illustrated as a single wafer reactor, but it should be understood that the invention is applicable to batch reactors.

Furthermore, ALD reactor 400 includes associated control apparatus (not shown) for detecting, measuring and controlling process conditions within ALD reactor 400. Associated control apparatus include, as examples, temperature sensors, pressure transducers, flow meters and control valves. Associated control apparatus further include other devices suitable for the detection, measurement and control of the various process conditions described herein.

One of ordinary skill in the art will comprehend other suitable reactors for practicing the invention described in this application, for example the reactors described in U.S. Pat. Nos. 5,879,459 and 6,305,314, herein incorporated by reference.

Figure 5:
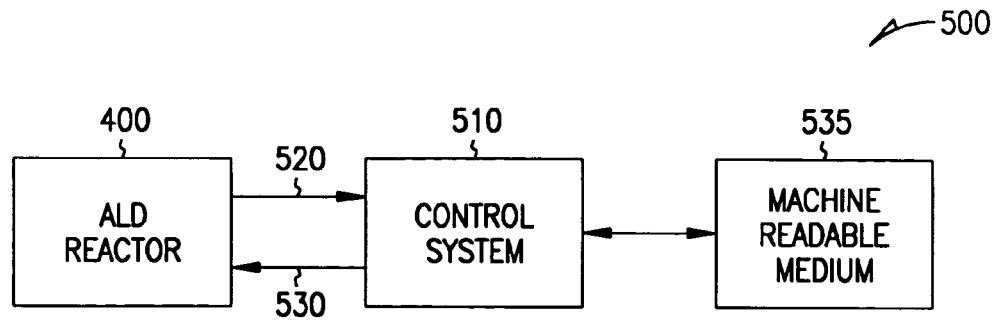
FIG. 5 is a view of a reactor system for use with the process of the present invention.

FIG. 5 represents an ALD system 500 suitable for practicing the invention. ALD system 500 contains the ALD reactor 400 and a control system 510. ALD reactor 400 and control system 510 are in communication such that process information is passed from ALD reactor 400 to control system 510 through communication line 520, and process control information is passed from control system 510 to ALD reactor 400 through communication line 530. It is noted that communication lines 520 and 530 may represent only one physical line, in which communications are bidirectional.

The control system 510 includes, integrally or separable therefrom, a machine readable media 535 which contains instructions for performing the present invention. Media 535 may be an electrical, magnetic, optical, mechanical, etc. storage device that stores instructions that are read by control system 510. Such storage devices include magnetic disks and tape, optical disks, computer memory, etc. Control system 510 may also include a processor (not shown) for issuing instructions to control reactor 400 based upon instructions read from machine readable media 535.

Memory Devices

Figure 6:
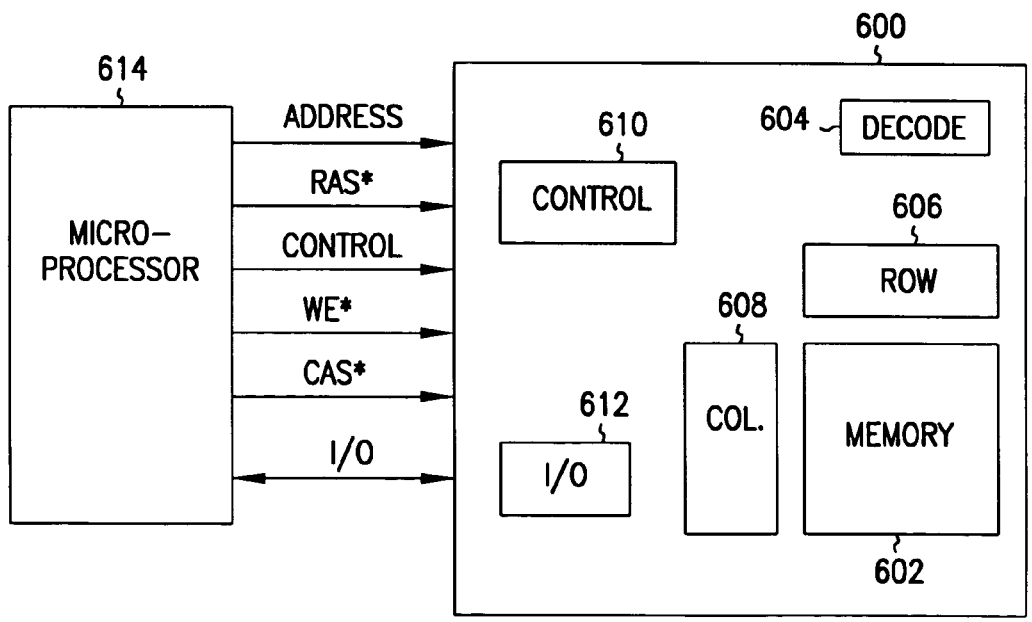
FIG. 6 is a view of a memory system containing a semiconductor device having a thin film according to the present invention.

FIG. 6 is a simplified block diagram of a memory device 600 according to one embodiment of the invention. The memory device 600 includes an array of memory cells 602, address decoder 604, row access circuitry 606, column access circuitry 608, control circuitry 610, and Input/Output circuit 612. The memory is operably coupled to an external microprocessor 614, or memory controller for memory accessing. The memory device 600 receives control signals from the processor 614, such as WE*, RAS* and CAS* signals. The memory device 600 stores data which is accessed via I/O lines. It will be appreciated by those skilled in the art that additional circuitry and control signals can be provided, and that the memory device of FIG. 6 has been simplified to help focus on the invention. At least one of the memory cells or associated circuitry has an integrated circuit structure or element in accordance with the present invention, e.g., a metal oxide layer formed according to the present invention.

It will be understood that the above description of a memory device is intended to provide a general understanding of the memory and is not a complete description of all the elements and features of a specific type of memory, such as DRAM (Dynamic Random Access Memory). Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Semiconductor Dies

Figure 7:
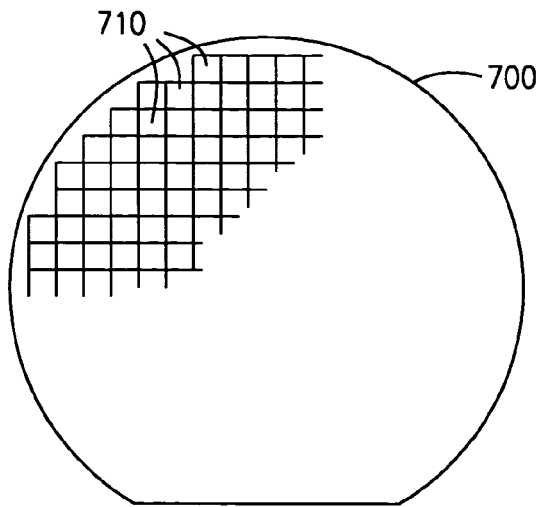
FIG. 7 is a view of a wafer containing semiconductor dies, each having a semiconductor device with a thin film of the present invention.

With reference to FIG. 7, for one embodiment, a semiconductor die 710 is produced from a wafer 700. A die 710 is an individual pattern, typically rectangular, on a substrate or wafer 700 that contains circuitry, or integrated circuit devices, to perform a specific function. A semiconductor wafer 700 will typically contain a repeated pattern of such dies 710 containing the same functionality. Die 710 contains circuitry for the inventive memory device, as discussed above. Die 710 may further contain additional circuitry to extend to such complex devices as a monolithic processor with multiple functionality. Die 710 is typically packaged in a protective casing (not shown) with leads extending therefrom (not shown) providing access to the circuitry of the die for unilateral or bilateral communication and control. Each die 710 includes at least one ALD deposited and converted layer, e.g., a metal oxide, according to the present invention.

Circuit Modules

Figure 8:
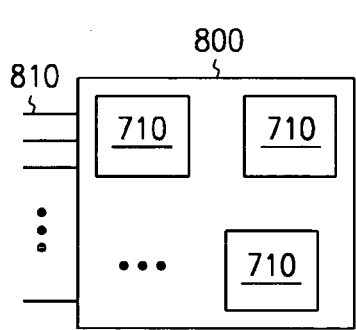
FIG. 8 is a block diagram of a circuit module that has a semiconductor device with a thin film of the present invention.

As shown in FIG. 8, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. One or more dies 710 of circuit module 800 contain at least one ALD deposited and converted layer, e.g., a metal oxide, in accordance with the present invention.

Some examples of a circuit module include memory modules, device drivers, power modules, communication modems, processor modules and application-specific modules, and may include multilayer, multichip modules. Circuit module 800 may be a subcomponent of a variety of electronic systems, such as a clock, a television, a cell phone, a personal computer, an automobile, an industrial control system, an aircraft and others. Circuit module 800 will have a variety of leads 810 extending therefrom and coupled to the dies 710 providing unilateral or bilateral communication and control.

Figure 9:
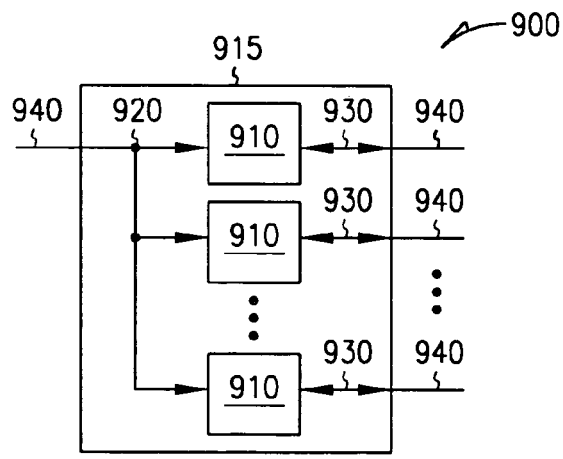
FIG. 9 is a block diagram of a memory module that has a semiconductor device with a thin film of the present invention.

FIG. 9 shows one embodiment of a circuit module as memory module 900. Memory module 900 contains multiple memory devices 910 contained on support 915, the number generally depending upon the desired bus width and the desire for parity. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 9. At least one of the memory devices 910 contains a ALD deposited and converted layer, e.g., a metal oxide, according to the present invention.

Electronic Systems

Figure 10:
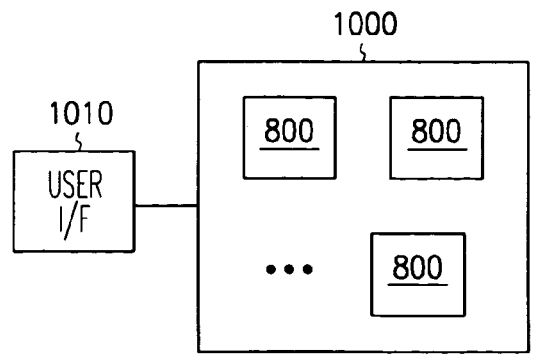
FIG. 10 is a block diagram of an electronic system that has a semiconductor device with a thin film of the present invention.

FIG. 10 shows one embodiment of an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine, or other human-machine interfaces. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often be associated with certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a subcomponent of a larger electronic system. It will also be appreciated that at least one of the memory modules 800 contains a ALD deposited and converted layer, e.g., a metal oxide, according to the present invention.

Figure 11:
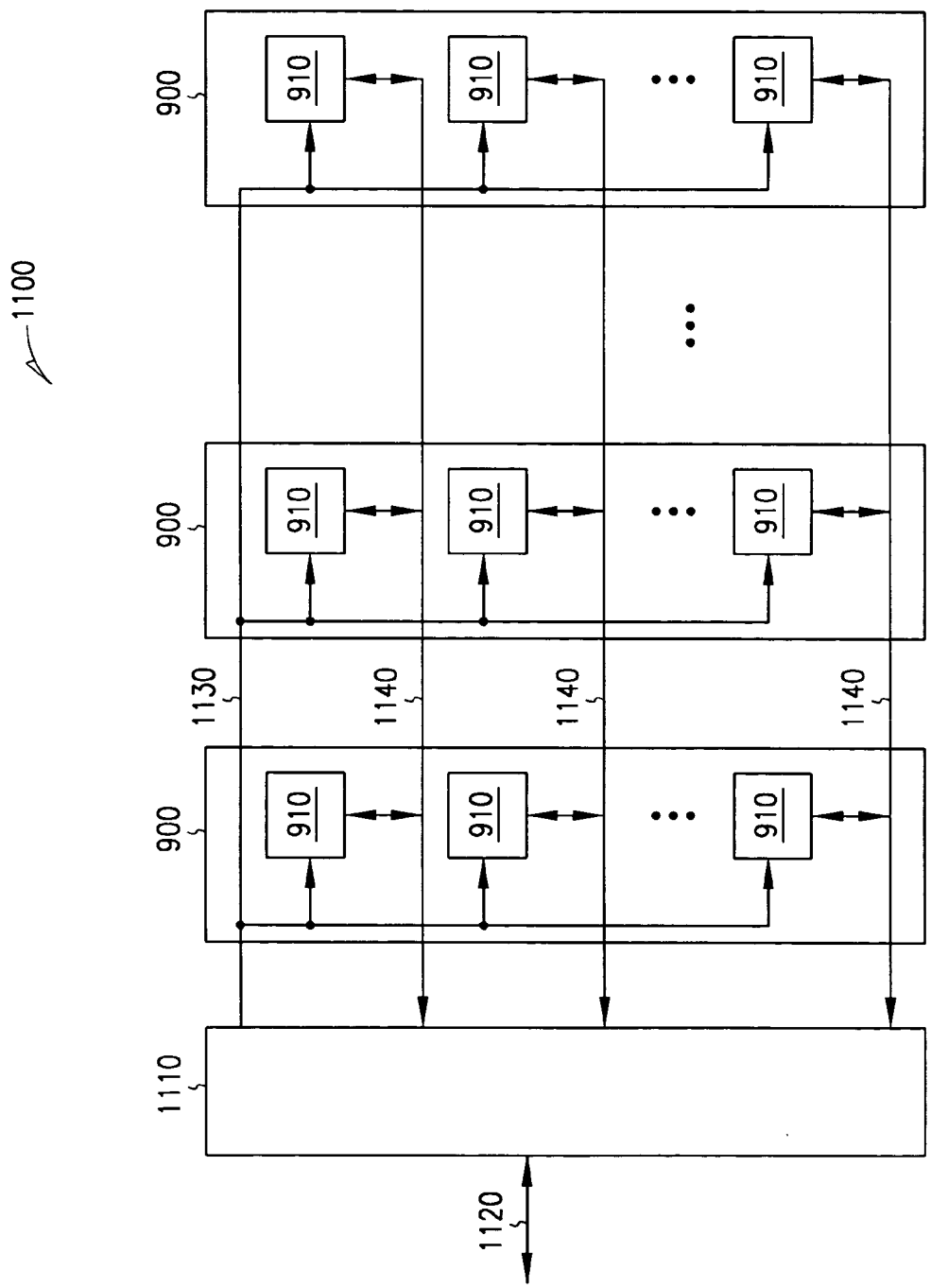
FIG. 11 is a block diagram of a memory system that has a semiconductor device with a thin film of the present invention.

FIG. 11 shows one embodiment of an electronic system as memory system 1100. Memory system 1100 contains one or more memory modules 900 and a memory controller 1110. The memory modules 900 each contain one or more memory devices 910. At least one of memory devices 910 contain ALD deposited and converted layer, e.g., a metal oxide, according to the present invention. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 12:
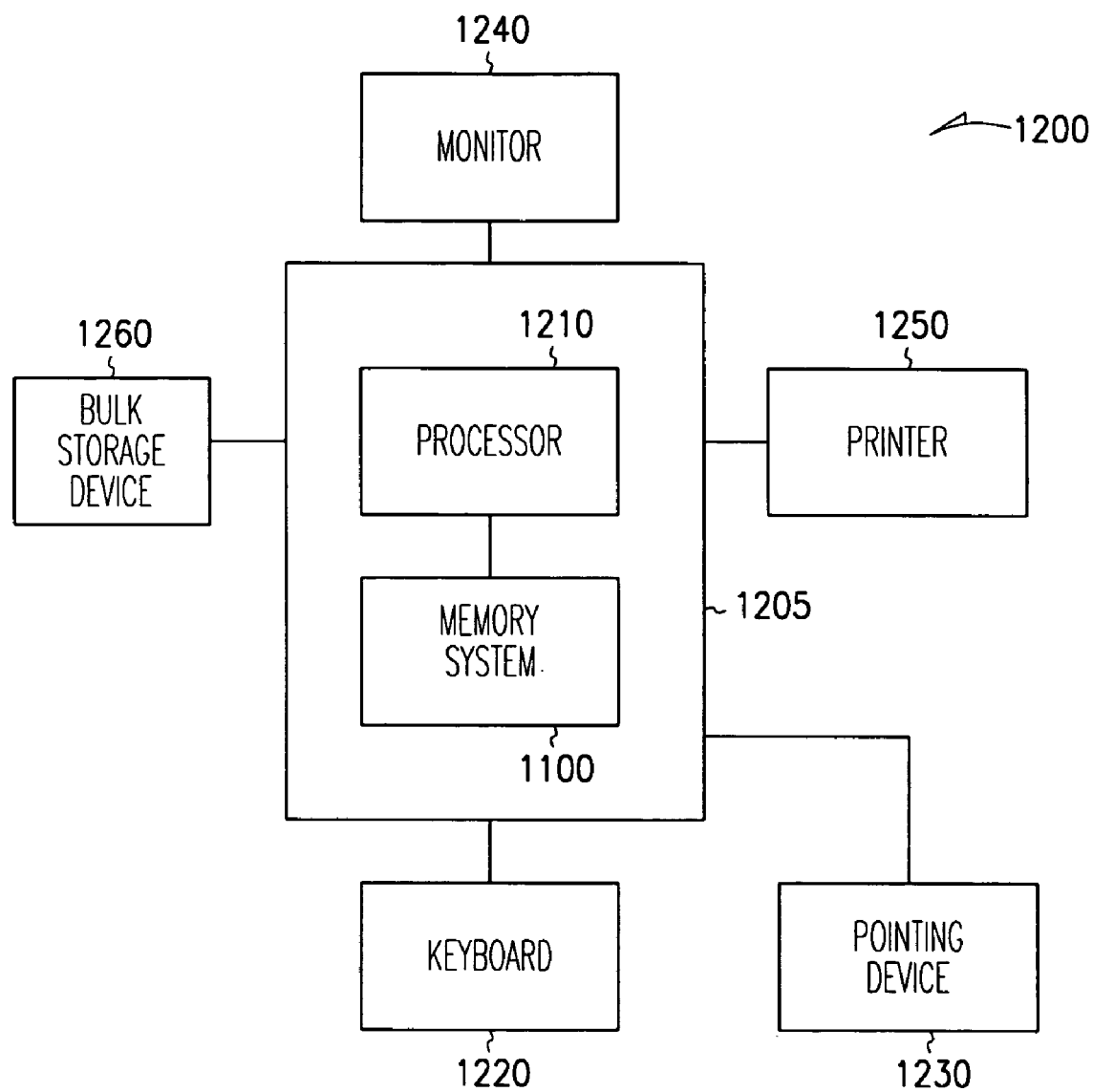
FIG. 12 is a block diagram of a computer system that has a semiconductor device with a thin film of the present invention.

FIG. 12 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e., memory system 900, as a subcomponent. Computer system 1200 optionally contains user interface components. Depicted in FIG. 12 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor and the memory circuit. It will be appreciated that at least one of the processor 1210 and memory system 1100 contains a ALD deposited and converted layer, e.g., a metal oxide, according to the present invention.

While the above described embodiments describe first injecting the precursor gas and then injecting the reactant gas, it will be understood that it is within the scope of the present invention to first inject the reactant gas such that it saturates the volume adjacent the substrate and then inject the precursor. The precursor will enter the volume and react with the already present reactant gas and form a film on the substrate. The thus formed film is then converted according to the teachings of the present invention.

The above description described forming compounds, such as metal oxides, by ALD depositing a first monolayer, e.g., metal layer, on a substrate and/or a prior layer and then converting, e.g., oxidizing the metal layer to form a metal oxide. The present invention is also applicable to forming other elemental layers in an integrated circuit. For example, a layer is deposited using ALD and then the layer is nitrided. Thus, the layer is now a nitride layer. The process is repeated until the nitride layer has the desired thickness.

In another embodiment of the present invention, the layer is subjected to boron and thus becomes a boride layer. The above described steps are performed with the boron replacing the oxygen.

In another embodiment of the present invention, the layer is subjected to carbon and thus becomes a carbide layer. The above described steps are performed with the carbon replacing the oxygen.

In another embodiment of the present invention, the layer is subjected to fluorine and thus becomes a fluoride layer. The above described steps are performed with the fluorine replacing the oxygen.

In another embodiment of the present invention, the layer is subjected to phosphorus and thus becomes a phosphide layer. The above described steps are performed with the phosphorus replacing the oxygen.

The above description sets forth embodiments of the present invention that atomic layer deposit a single element, then subject it to a further element to convert the single element layer to an oxide, carbide, nitride, boride, fluoride, or phosphide two element layer. Embodiments of the present invention further provide for multiple element layer to be oxided or subjected to other elements for conversion as described herein. Accordingly, the present invention produces mixed phase films. In an embodiment, the mixed phase films include more than one base element. The first element is deposited using ALD in an ALD layer, monolayer or atomic layer. It is then converted according to the teachings of the present invention. A second element is deposited using ALD in a monolayer or atomic layer. The second element layer is then converted according to the teachings of the present invention. In an embodiment, the first or second element is an alloy of a metal. Consequently, mixed element film is formed by sequentially depositing and converting the first element and the subsequent element(s). It will be appreciated that the present method is adaptable to higher orders of elements in the film, wherein a third element is deposited and converted, . . . and an nth element is deposited and converted.

An example of such an ALD layer that is converted according to the teachings of the present invention include, but are not limited to, titanium and silicon in the base film. One embodiment would be formed by depositing both titanium and silicon by ALD then converting one or both according to the teachings of the present invention to form $TiO_2SiN_x$. Titanium is deposited in an ALD layer, such as a monolayer, using ALD and then converted according to the teachings herein. Silicon is deposited and then converted either before or after the titanium. Accordingly, the film that is formed alternates depositing and converting the titanium and the silicon.

An embodiment according to the teachings of the present invention includes depositing titanium and silicon by ALD and then converting both elements with oxygen to form $TiO_x$-$SiO_x$. The titanium is first deposited, then oxidized. The silicon is then deposited, then converted using oxygen. In a further embodiment, the titanium and silicon are both deposited by ALD, then both converted by oxidizing the titanium and silicon. In a further embodiment, either the $TiO_x$ or $SiO_x$ is deposited according to ALD and the other of the $TiO_x$ or $SiO_x$ is deposited by ALD and then converted according to the teachings of the present invention.

An embodiment according to the teachings of the present invention includes depositing titanium by ALD and then converting the titanium using both oxygen and nitrogen to form a $TiO_x TiN$ layer. In a further embodiment, either the $TiO_x$ or TiN is deposited according to ALD and the other of the $TiO_x$ or TiN is deposited by ALD and then converted according to the teachings of the present invention.

An embodiment according to the teachings of the present invention includes depositing silicon by ALD and then converting the silicon using both oxygen and nitrogen to form a $SiO_x SiN$ layer. In a further embodiment, either the SiN or $SiO_x$ is deposited according to ALD and the other of the SiN or $SiO_x$ is deposited by ALD and then converted according to the teachings of the present invention.

An embodiment according to the teachings of the present invention includes depositing tantalum and silicon by ALD and converting tantalum with nitrogen to form TaNSi. The tantalum is deposited, then converted with nitrogen. The silicon is deposited by ALD. In a further embodiment, the present invention forms TaNTaSi.

An embodiment according to the teachings of the present invention includes depositing aluminum and titanium by ALD and then converting both elements with oxygen to form $AlO_3 TiO_2$. The titanium is first deposited, then oxidized. The aluminum is then deposited, then converted using oxygen. In a further embodiment, the titanium and aluminum are both deposited by ALD, then both converted by oxidizing the titanium and aluminum. In a further embodiment, either the $TiO_2$ or $AlO_3$ is deposited according to ALD and the other of the $TiO_2$ or $AlO_3$ is deposited by ALD and then converted according to the teachings of the present invention.

The present invention includes methods of forming alloys or mixed element films and converting the alloy or mixed element films according to the teachings of the present invention. Some of the above embodiment describe specific elements that are deposited and converted or deposited in combination with elements that are converted according to the teachings of the present invention. It will be recognized that the order and methods described in conjunction with these specific elements are adaptable to other elements that are used to form layers in integrated circuits.

CONCLUSION

Thus, the present invention provides novel structures and methods for fabrication of thin films on substrates. The novel fabrication method of the present invention forms a first layer of a single element by ALD and then converts the first layer to a second layer having two constituent elements. The first layer is formed by atomic layer deposition and then converted. In an embodiment, each first layer produced during an atomic layer deposition is converted before a subsequent first layer is deposited on the prior converted sub-layer. In an embodiment, conversion is oxidation and the first layer is a metal. In an embodiment, each metal sub-layer produced during an atomic layer deposition is oxidized before a subsequent metal sub-layer is deposited on the prior oxidized metal sub-layer. Accordingly, each sub-layer is formed at a molecular level by atomic layer deposition and thus has a high quality. Quality includes low impurity and low defects. Each sub-layer is then oxidized. Accordingly, the oxidation is throughout the sub-layer and prevents non-oxidized areas in the sub-layer. The process is then repeated to until the oxidized sub-layers produce a film or layer that has the desired thickness.

The present invention includes any other applications in which the above structures and fabrication methods are used. The scope of the invention should be determined with reference to the appended claims, along with the full scope of equivalents to which such claims are entitled.

What is claimed is:

1. A semiconductor device, comprising:
   a substrate; and
   an atomic layer deposition first layer deposited on the substrate, wherein the first layer is deposited by sequentially pulsing a precursor gas and a reactant into a reaction chamber, and wherein the precursor gas and reactant react to deposit the first layer on the substrate, the first layer including a material A, and wherein the first layer is converted to a second layer by a converting gas, the second layer including material B, and wherein the second layer forms a material $A_x B_y$, where x is the number of atomic bonds associated with the material A and y is the number of atomic bonds associated with the material B, and wherein the material B comprises at least one of carbon, boron and fluorine.

2. The semiconductor device according to claim 1, wherein the material A is an atomic layer deposition metal.

3. The semiconductor device according to claim 2, wherein the second layer is a dielectric.

4. The semiconductor device according to claim 3, wherein at least one of the first and the second metal layers include at least one of titanium, tantalum and aluminum.

5. The semiconductor device of claim 1, wherein the second layer comprises at least one of a carbide, a boride and a fluoride.

6. The semiconductor device of claim 4, wherein the second layer comprises at least one of carbide, a boride and a fluoride.

7. The semiconductor device of claim 1, wherein the second layer comprises carbon and boron, or carbon and fluoride, or boron and fluoride.

8. The semiconductor device of claim 3, wherein the second layer comprises a phosphide.

9. The semiconductor device of claim 4, wherein the second layer comprises a two element layer including a carbide, a nitride, a boride, a fluoride, or a phosphide.

* * * * *

UNITED STATES PATENT AND TRADEMARK OFFICE
CERTIFICATE OF CORRECTION

PATENT NO. : 7,560,793 B2
APPLICATION NO. : 10/929272
DATED : July 14, 2009
INVENTOR(S) : Garo J. Derderian et al.

It is certified that error appears in the above-identified patent and that said Letters Patent is hereby corrected as shown below:

In column 14, line 34, in Claim 1, delete "$A_x\ B_y$," and insert -- $A_xB_y$, --, therefor.

Signed and Sealed this

First Day of September, 2009

David J. Kappos
*Director of the United States Patent and Trademark Office*